US012804825B2

(12) United States Patent
Merenda

(10) Patent No.: US 12,804,825 B2
(45) **Date of Patent: *Nov. 17, 2026**

(54) HOUSING WITH MULTI-FUNCTIONAL MODULES

(71) Applicant: ADVANCED ACCESS TECHNOLOGIES LLC, Brooklyn, NY (US)

(72) Inventor: John T. Merenda, Brooklyn, NY (US)

(73) Assignee: ADVANCED ACCESS TECHNOLOGIES LLC, Brooklyn, NY (US)

( * ) Notice: Subject to any disclaimer, the term of this patent is extended or adjusted under 35 U.S.C. 154(b) by 173 days.

This patent is subject to a terminal disclaimer.

(21) Appl. No.: 19/014,209

(22) Filed: Jan. 8, 2025

(65) Prior Publication Data

US 2025/0151210 A1 May 8, 2025

Related U.S. Application Data

(63) Continuation-in-part of application No. 17/882,565, filed on Aug. 6, 2022, now Pat. No. 12,349,292, (Continued)

(51) Int. Cl.
*H01M 10/46* (2006.01)
*A45C 11/00* (2006.01)
(Continued)

(52) U.S. Cl.
CPC ............ *H05K 5/0086* (2013.01); *A45C 11/00* (2013.01); *B65D 25/38* (2013.01); *B65H 75/364* (2013.01);
(Continued)

(58) Field of Classification Search
CPC .. H02J 50/10; H02J 50/12; H02J 7/865; H02J 7/731; H02J 7/342; B65H 75/44;
(Continued)

(56) References Cited

U.S. PATENT DOCUMENTS 1,446,410 A 2/1923 Bennett et al.
1,904,000 A 4/1933 Hoyt
(Continued)

FOREIGN PATENT DOCUMENTS

CN 2414555 Y 1/2001
CN 2445522 Y 8/2001
(Continued)

OTHER PUBLICATIONS

IPOD® Player Case with Retrable Stero, <URL:http://www.amazon.com/ipd%ae-player-retractable-stereo-hadphones/dp/b000bt27mo>, retrieved from Internet on May 17, 2012.
(Continued)

*Primary Examiner* — Edward Tso
(74) *Attorney, Agent, or Firm* — H&I PARTNERS; Chai Im; C. Andrew Im

(57) ABSTRACT

A multi-functional module system for a mobile device includes a docketing station and housing attachable to the mobile device. The housing includes an integrated wireless charging coil, and a plug head integrally formed with or attached to the housing. The plug head establishes a direct electrical/data connection between the housing and a port of the mobile device. The charging coil aligns with and charges a wireless-enabled accessory placed adjacent to the housing. The docking station includes an electrical connection interface to transmit power and/or data between the housing, the mobile device and a removable electronic module (REM) connected to the docking station. At least one port of the housing transfers power/data between an external device plugged into the port and the housing and/or the mobile device and/or the connected REM. The docking station provides a docking interface between the REM and housing via a magnetic coupling.

13 Claims, 15 Drawing Sheets

Related U.S. Application Data which is a continuation of application No. 16/691,284, filed on Nov. 21, 2019, now Pat. No. 11,412,627, which is a continuation-in-part of application No. 15/472,252, filed on Mar. 28, 2017, now Pat. No. 11,432,641, which is a continuation-in-part of application No. 14/926,013, filed on Oct. 29, 2015, now Pat. No. 10,237,990, which is a continuation-in-part of application No. 14/740,179, filed on Jun. 15, 2015, now Pat. No. 9,392,349, which is a continuation-in-part of application No. 14/711,735, filed on May 13, 2015, now Pat. No. 9,313,905, which is a continuation of application No. 14/503,467, filed on Oct. 1, 2014, now Pat. No. 9,065,921, which is a continuation of application No. 14/182,645, filed on Feb. 18, 2014, now Pat. No. 8,879,773, which is a continuation of application No. PCT/US2013/038599, filed on Apr. 29, 2013, and a continuation of application No. 13/872,157, filed on Apr. 29, 2013, now Pat. No. 8,774,446, which is a continuation-in-part of application No. 29/430,245, filed on Aug. 23, 2012, now Pat. No. Des. 698,772, said application No. PCT/US2013/038599 is a continuation-in-part of application No. 29/430,245, filed on Aug. 23, 2012, now Pat. No. Des. 698,772, which is a continuation-in-part of application No. 29/417,184, filed on Mar. 30, 2012, now Pat. No. Des. 667,823.

(60) Provisional application No. 63/618,597, filed on Jan. 8, 2024, provisional application No. 62/770,704, filed on Nov. 21, 2018, provisional application No. 62/072,374, filed on Oct. 29, 2014, provisional application No. 62/012,334, filed on Jun. 14, 2014, provisional application No. 61/639,968, filed on Apr. 29, 2012.

(51) Int. Cl.

| | |
|---|---|
| ***B65D 25/38*** | (2006.01) |
| ***B65H 75/36*** | (2006.01) |
| ***B65H 75/48*** | (2006.01) |
| ***G06F 1/10*** | (2006.01) |
| ***G06F 1/16*** | (2006.01) |
| ***H02J 7/00*** | (2006.01) |
| ***H02J 7/70*** | (2026.01) |
| ***H02J 50/10*** | (2016.01) |
| ***H04M 1/02*** | (2006.01) |
| ***H04M 1/60*** | (2006.01) |
| ***H04R 1/02*** | (2006.01) |
| ***H04R 1/10*** | (2006.01) |
| ***H04R 1/1025*** | (2026.01) |
| ***H05K 5/00*** | (2006.01) |
| ***H05K 5/02*** | (2006.01) |
| *B65H 75/44* | (2006.01) |
| *H02J 7/34* | (2006.01) |
| *H04M 1/15* | (2006.01) |
| *H04M 1/18* | (2006.01) |

(52) U.S. Cl.

CPC ............ *B65H 75/48* (2013.01); *G06F 1/105* (2013.01); *G06F 1/1656* (2013.01); *H02J 7/731* (2026.01); *H02J 7/865* (2026.01); *H02J 50/10* (2016.02); *H04M 1/0258* (2013.01); *H04M 1/6058* (2013.01); *H04R 1/02* (2013.01); *H04R 1/028* (2013.01); *H04R 1/1025* (2013.01); *H04R 1/1033* (2013.01); *H04R 1/1041* (2013.01); *H05K 5/0217* (2013.01); *A45C 11/003* (2025.01); *B65H 75/44* (2013.01); *B65H 75/4431* (2013.01); *B65H 2701/34* (2013.01); *B65H 2701/3919* (2013.01); *B65H 2701/533* (2013.01); *H02J 7/342* (2020.01); *H04M 1/15* (2013.01); *H04M 1/185* (2013.01); *H04R 2499/11* (2013.01)

(58) Field of Classification Search

CPC B65H 2701/3919; H04R 1/1033; H04R 1/02; H04R 1/1041; A45C 11/002; A45C 13/02; A45C 11/00; H05K 5/0086; H05K 5/0217

USPC ......................... 320/107, 108, 111, 114, 115

See application file for complete search history.

(56) References Cited

U.S. PATENT DOCUMENTS

| | | | |
|---|---|---|---|
| 1,958,626 | A | 5/1934 | Krantz |
| 2,013,733 | A | 9/1935 | Murphy |
| 2,211,561 | A | 8/1940 | Flannelly |
| 2,438,515 | A | 3/1948 | Mohler |
| 2,518,071 | A | 8/1950 | Rushworth |
| 2,521,226 | A | 9/1950 | Keller |
| 3,061,234 | A | 10/1962 | Morey |
| 3,144,218 | A | 8/1964 | Tepe |
| 3,374,319 | A | 3/1968 | Stahmer |
| 3,657,491 | A | 4/1972 | Ryder et al. |
| 3,773,987 | A | 11/1973 | Davis et al. |
| 3,782,654 | A | 1/1974 | Kasa |
| 3,984,645 | A | 10/1976 | Kresch |
| 4,384,688 | A | 5/1983 | Smith |
| 4,584,718 | A | 4/1986 | Fuller |
| 4,646,987 | A | 3/1987 | Peterson |
| 4,754,484 | A | 6/1988 | Larkin et al. |
| D301,034 | S | 5/1989 | Fujita et al. |
| 4,942,617 | A | 7/1990 | Boylan |
| 4,989,805 | A | 2/1991 | Burke |
| 5,118,309 | A | 6/1992 | Ford |
| 5,151,643 | A | 9/1992 | Emmert et al. |
| 5,332,171 | A | 7/1994 | Steff |
| 5,388,155 | A | 2/1995 | Smith |
| 5,422,957 | A | 6/1995 | Cummins |
| 5,684,883 | A | 11/1997 | Chen |
| 5,706,353 | A | 1/1998 | Arai et al. |
| 5,724,667 | A | 3/1998 | Furuno |
| 5,758,289 | A | 5/1998 | Lipp et al. |
| D397,246 | S | 8/1998 | Hoofnagle et al. |
| D414,178 | S | 9/1999 | Loubert et al. |
| D427,170 | S | 6/2000 | Edwards et al. |
| D434,739 | S | 12/2000 | Hanna et al. |
| 6,301,487 | B1 | 10/2001 | Nakamura |
| 6,374,126 | B1 | 4/2002 | MacDonald, Jr. et al. |
| 6,438,248 | B1 | 8/2002 | Kamimura et al. |
| 6,439,491 | B1 | 8/2002 | Liao |
| 6,542,757 | B2 | 4/2003 | Bae |
| RE38,211 | E | 8/2003 | Peterson et al. |
| 6,633,770 | B1 | 10/2003 | Gitzinger et al. |
| 6,644,582 | B1 | 11/2003 | Liao |
| 6,712,304 | B1 | 3/2004 | Taylor |
| 6,731,956 | B2 | 5/2004 | Hanna et al. |
| 6,733,328 | B2 | 5/2004 | Lin et al. |
| 6,736,346 | B1 | 5/2004 | Park |
| 6,808,138 | B2 | 10/2004 | Liao |
| 6,834,820 | B2 | 12/2004 | Wei |
| 6,851,530 | B2 | 2/2005 | Wei |
| 6,866,219 | B2 | 3/2005 | Wei |
| 6,871,812 | B1 | 3/2005 | Chang |
| D510,722 | S | 10/2005 | Kosiba et al. |
| 7,001,210 | B1 | 2/2006 | Chiang |
| 7,032,728 | B2 | 4/2006 | Harcourt |
| 7,086,512 | B2 | 8/2006 | Shack et al. |
| 7,151,912 | B1 | 12/2006 | Morrison |
| 7,180,735 | B2 | 2/2007 | Thomas et al. |
| D543,197 | S | 5/2007 | Loughnane |
| 7,216,665 | B1 | 5/2007 | Sims, Jr. |

(56) References Cited

U.S. PATENT DOCUMENTS

| | | | | |
|---|---|---|---|---|
| D551,846 | S | 10/2007 | Ko et al. | |
| D559,826 | S | 1/2008 | Lee | |
| D560,911 | S | 2/2008 | Hackbart et al. | |
| 7,399,198 | B2 | 7/2008 | Thalheimer et al. | |
| 7,400,917 | B2 | 7/2008 | Wood et al. | |
| D574,819 | S | 8/2008 | Andre et al. | |
| 7,523,883 | B2 | 4/2009 | Cheng | |
| D603,603 | S | 11/2009 | Laine et al. | |
| 7,648,027 | B2 | 1/2010 | Lin et al. | |
| D609,900 | S | 2/2010 | Behar et al. | |
| D611,251 | S | 3/2010 | Charlwood | |
| 7,681,822 | B2 | 3/2010 | Tai | |
| D619,130 | S | 7/2010 | Fellig | |
| D622,692 | S | 8/2010 | McWilliam et al. | |
| D622,716 | S | 8/2010 | Andre et al. | |
| 7,784,727 | B1 | 8/2010 | Liao | |
| D623,180 | S | 9/2010 | Diebel | |
| D624,114 | S | 9/2010 | Ausems et al. | |
| 7,802,746 | B2 | 9/2010 | Ito et al. | |
| 7,822,448 | B2 | 10/2010 | Lin et al. | |
| 7,868,585 | B2 | 1/2011 | Sarnowsky et al. | |
| 7,889,494 | B2 | 2/2011 | Stampfli | |
| D635,131 | S | 3/2011 | Roman | |
| 7,909,281 | B2 | 3/2011 | Liao | |
| D639,052 | S | 6/2011 | Fathollahi | |
| D654,068 | S | 2/2012 | Monaco et al. | |
| D654,483 | S | 2/2012 | Richardson et al. | |
| D654,931 | S | 2/2012 | Lemelman et al. | |
| 8,136,751 | B2 | 3/2012 | Chen | |
| 8,265,325 | B2 | 9/2012 | Park | |
| 8,365,887 | B2 | 2/2013 | Fischer | |
| 9,066,181 | B2 | 6/2015 | Kroupa | |
| 9,246,221 | B2 | 1/2016 | Jin et al. | |
| 9,319,766 | B2 | 4/2016 | Weinstein et al. | |
| 9,698,623 | B2 | 7/2017 | Adams et al. | |
| 10,516,431 | B2 | 12/2019 | Dilella | |
| 12,349,292 | B2 * | 7/2025 | Merenda | A45C 11/00 |
| 2002/0023814 | A1 | 2/2002 | Poutiatine | |
| 2002/0176571 | A1 | 11/2002 | Louh | |
| 2003/0096640 | A1 | 5/2003 | Bae | |
| 2003/0157973 | A1 | 8/2003 | Yang | |
| 2003/0224839 | A1 | 12/2003 | Takahashi et al. | |
| 2004/0094649 | A1 | 5/2004 | Park | |
| 2004/0204165 | A1 | 10/2004 | Huang | |
| 2004/0256188 | A1 | 12/2004 | Harcourt | |
| 2005/0109869 | A1 | 5/2005 | Wei | |
| 2005/0133129 | A1 | 6/2005 | Saeed | |
| 2005/0220316 | A1 | 10/2005 | Hsiang | |
| 2005/0255898 | A1 | 11/2005 | Huang | |
| 2006/0011763 | A1 | 1/2006 | Kuo | |
| 2006/0058081 | A1 | 3/2006 | Reichenbach | |
| 2006/0281502 | A1 | 12/2006 | Chang | |
| 2007/0165371 | A1 | 7/2007 | Bradenburg | |
| 2007/0295850 | A1 | 12/2007 | Lin | |
| 2008/0080732 | A1 | 4/2008 | Sneed | |
| 2008/0090446 | A1 | 4/2008 | Lamont et al. | |
| 2009/0325648 | A1 | 12/2009 | Shi | |
| 2010/0105452 | A1 | 4/2010 | Shin et al. | |
| 2010/0279743 | A1 | 11/2010 | Sim | |
| 2011/0031341 | A1 | 2/2011 | He | |
| 2011/0130174 | A1 | 6/2011 | Kroupa | |
| 2011/0139918 | A1 | 6/2011 | Chen | |
| 2011/0170732 | A1 | 7/2011 | Parker et al. | |
| 2011/0233078 | A1 | 9/2011 | Monaco et al. | |
| 2012/0114162 | A1 | 5/2012 | Zheng | |
| 2012/0224739 | A1 | 9/2012 | Cataldo et al. | |
| 2012/0225701 | A1 | 9/2012 | Cataldo et al. | |
| 2013/0208937 | A1 | 8/2013 | Stern et al. | |
| 2013/0237290 | A1 | 9/2013 | Simmons et al. | |
| 2013/0238829 | A1 | 9/2013 | Laycock et al. | |
| 2016/0261133 | A1 | 9/2016 | Wang | |
| 2017/0371378 | A1 * | 12/2017 | Christmas | H04L 67/06 |
| 2018/0131847 | A1 * | 5/2018 | Kokonaski | H02J 50/10 |
| 2020/0093014 | A1 * | 3/2020 | Merenda | A45C 11/00 |

FOREIGN PATENT DOCUMENTS

| | | | |
|---|---|---|---|
| CN | 2448037 | Y | 9/2001 |
| CN | 2453619 | Y | 10/2001 |
| CN | 2462624 | Y | 11/2001 |
| CN | 2488233 | Y | 4/2002 |
| CN | 2489532 | Y | 5/2002 |
| CN | 2509787 | Y | 9/2002 |
| CN | 2792050 | Y | 6/2006 |
| CN | 2843005 | Y | 11/2006 |
| CN | 101090278 | A | 12/2007 |
| CN | 101090617 | A | 12/2007 |
| CN | 201087963 | Y | 7/2008 |
| CN | 201123116 | Y | 9/2008 |
| CN | 201156758 | Y | 11/2008 |
| CN | 101087316 | B | 11/2011 |
| WO | 2013074154 | A1 | 5/2013 |

OTHER PUBLICATIONS

EarGears Phone Case with Built-in Retractable Headphones, shipping for iPhone 4 platform beginning Apr. 2012, <URL:http://www.ear-gears.com/>.

Sangean DT-220A AM/FM Stereo Pocket Size Radio with Self-Storage Headphones, earliest customer review on Feb. 21, 2004 <URL: http://www.amazon.com/sangean-dt-220a-stereo-self-storage-headphones/dp/b00008aybf>.

Azeca Clip-On Bluetooth Headset with retractable earbud, posted on Mar. 15, 2012, <URL: http://thegeekchurch.com/wp-content/uploads/2012/03/azeca-retractable.png.

www.quirky.com/ideations/165787, Automatic Wire Retractor Phone Case, Mar. 29, 2012, 1 page.

Mophie.com, "juice pack" battery cases for iPhone, Jan. 23, 2012.

* cited by examiner

HOUSING WITH MULTI-FUNCTIONAL MODULES

RELATED APPLICATIONS

The present application claims the benefit of U.S. Provisional Application No. 63/618,597 filed Jan. 8, 2024 and the present application is a continuation-in-part application of Ser. No. 17/882,565 filed Aug. 6, 2022, which is a continuation of U.S. application Ser. No. 16/691,284 filed Nov. 21, 2019, now U.S. Pat. No. 11,412,627, which claims the benefit of U.S. Provisional Application No. 62/770,704 filed Nov. 21, 2018, each of which is incorporated herein by reference in its entirety.

U.S. application Ser. No. 16/691,284 is a continuation-in-part of U.S. application Ser. No. 15/472,252 filed Mar. 28, 2017, now U.S. Pat. No. 11,432,641, which is a continuation-in-part of U.S. application Ser. No. 14/926,013 filed Oct. 29, 2015, now U.S. Pat. No. 10,237,990, each of which is incorporated herein by reference in its entirety.

U.S. application Ser. No. 14/926,013 claims the benefit of U.S. Provisional Application No. 62/072,374 filed Oct. 29, 2014, and U.S. application Ser. No. 14/926,013 is a continuation-in-part of U.S. Application No. 14,740,179 filed Jun. 15, 2015, now U.S. Pat. No. 9,392,349, which claims the benefit of U.S. Provisional Application No. 62/012,334 filed Jun. 14, 2014, each of which is incorporated herein by reference in its entirety.

U.S. Application No. 14,740,179 filed Jun. 15, 2015, now U.S. Pat. No. 9,392,349, is a continuation-in-part of U.S. application Ser. No. 14/711,735 filed May 13, 2015, now U.S. Pat. No. 9,313,905, which is a continuation of U.S. application Ser. No. 14/503,467 filed Oct. 1, 2014, now U.S. Pat. No. 9,065,921, which is a continuation of U.S. application Ser. No. 14/182,645 filed Feb. 18, 2014, now U.S. Pat. No. 8,879,773, which is a continuation of U.S. application Ser. No. 13/872,157 filed Apr. 29, 2013, now U.S. Pat. No. 8,774,446, which claims the benefit of U.S. Provisional Application No. 61/639,968 filed Apr. 29, 2012, each of which is incorporated herein by reference in its entirety.

U.S. application Ser. No. 14/182,645 filed Feb. 18, 2014, now U.S. Pat. No. 8,879,773, is a continuation of PCT Application No. PCT/US2013/038599 filed Apr. 29, 2013, which claims the benefit of U.S. Provisional Application No. 61/639,968 filed Apr. 29, 2012, and U.S. application Ser. No. 29/430,245 filed Aug. 23, 2012, now U.S. Pat. No. D698,772, each of which is incorporated herein by reference in its entirety.

U.S. application Ser. No. 13/872,157 filed Apr. 29, 2013, now U.S. Pat. No. 8,774,446, is a continuation-in-part application of U.S. application Ser. No. 29/430,245 filed Aug. 23, 2012, now U.S. Pat. No. D698,772, which is a continuation-in-part application of U.S. application Ser. No. 29/417,184 filed Mar. 30, 2012, now U.S. Pat. No. D667,823, each of which is incorporated herein by reference in its entirety.

BACKGROUND OF THE INVENTION

Field of the Invention

The present invention relates to a housing for an electronic device, more particularly, the present invention provides a housing with multi-functional modules for an electronic device.

Description of the Related Art

In the current state, electronic devices such as smartphones, tablets, computers, augmented reality (AR) devices, mixed reality (MR) devices, virtual reality (VR) devices, security cameras, camera monitors, drones, UAV's and the like (electronic devices), contain built-in cameras and/or sensors which make it difficult and/or impossible for a user to create multi-dimensional experiences. Furthermore, many (if not all) of these electronic devices with built-in cameras and/or sensors do not provide for a removable/detachable feature of the cameras and/or sensors, thereby making it necessary for a user to purchase and/or manage multiple camera/sensor systems and their supporting software. A camera/sensor system that is removable from and functions with electronic devices and has the capability of remote/distant control and use from an electronic device, can offer an optimized and richer optical, computing, and/or media experience.

OBJECT AND SUMMARY OF THE INVENTION

In accordance with an exemplary embodiment of the claimed invention, a multi-functional module system for a mobile device comprises a housing configured to attach to the mobile device. The housing comprises a plug head integrally formed with or attached to the housing. The plug head is configured to establish a direct electrical or data connection between the housing and a port of the mobile device. The housing additionally comprises an integrated wireless charging coil positioned to align with and charge a wireless-enabled accessory placed adjacent to the housing. The aforesaid system further comprises a module docking station comprising an electrical connection interface configured to transmit at least one of power and data between the housing, the mobile device and a removable electronic module (REM) connected to the module docking station. The aforesaid housing further comprises at least one port configured to transfer power or data between at least one external device plugged into said at least one port and at least one of the following: the housing, the mobile device or the removable electronic module connected to the module docking station. The aforesaid module docking station provides a docking interface between the removable electronic module and housing via a magnetic coupling.

In accordance with an exemplary embodiment of the claimed invention, the aforesaid multi-functional module system further comprises a plurality of removable electronic modules (REMs). Each REM is configured to engage with the docking interface.

In accordance with an exemplary embodiment of the claimed invention, at least one of aforesaid REMs is a power bank module configured to supply additional electrical power to the mobile device or the housing.

In accordance with an exemplary embodiment of the claimed invention, at least one of aforesaid REMs is a wireless charging module configured to wirelessly charge the wireless-enabled accessory.

In accordance with an exemplary embodiment of the claimed invention, at least one of aforesaid REMs comprises a data storage device. The data storage device is configured to enable data storage, reading, and writing operations between the mobile device and the data storage device.

In accordance with an exemplary embodiment of the claimed invention, at least one of aforesaid port is configured to facilitate simultaneous charging of at least one of the mobile device, the removable electronic module, and said at least one external device using a single external power source connected to a USB-C plug.

In accordance with an exemplary embodiment of the claimed invention, the aforesaid docking interface further comprises a mechanical engagement between the removable electronic module and the housing.

In accordance with an exemplary embodiment of the claimed invention, the aforesaid multi-functional module system comprises an expandable memory slot configured to receive at least one memory card for additional data storage.

In accordance with an exemplary embodiment of the claimed invention, the aforesaid memory card is configured to enable data storage, reading, and writing operations between the mobile device and the aforesaid memory card.

In accordance with an exemplary embodiment of the claimed invention, at least one of aforesaid REMs is an AI-powered camera. The AI-powered camera is configured to capture images and videos, and to transmit captured images and videos to either the housing or mobile device for storage.

In accordance with an exemplary embodiment of the claimed invention, the aforesaid AI-powered camera processes the captured images and videos using artificial intelligence.

In accordance with an exemplary embodiment of the claimed invention, the aforesaid housing processes the captured images and videos using artificial intelligence.

In accordance with an exemplary embodiment of the claimed invention, the aforesaid mobile device processes the captured images and videos.

In accordance with an exemplary embodiment of the claimed invention, a multipurpose accessory and storage system for an electronic device comprises a housing member configured to attach to the electronic device and a charging station structured on the housing member configured to charge, arrest and dispense an accessory item. The accessory item comprises a protective membrane housing at least one logic board, at least one power component, at least one image sensor, at least one transmitter configured to transfer a signal or data to the electronic device or the housing member and at least one software program stored in the logic board. The transmitter is configured to establish a pairing or electronic connection between the electronic device or the housing member and the accessory item. The pairing or electronic connection relays an image or content captured by the image sensor to the electronic device to permit a user to view the content on the display of the electronic device. In addition, or alternatively, the pairing or electronic connection controls components and features of the accessory item via the electronic device. At least one of the electronic device, accessory item or housing member is configured to process and overlay digital information over the content captured by the accessory item, thereby allowing the user to view and interact with the digital information and imagery on the display of the electronic device.

In accordance with an exemplary embodiment of the claimed invention, aforesaid power component is configured to receive power from the electronic device via wireless power transfer components.

In accordance with an exemplary embodiment of the claimed invention, aforesaid power component is component is configured to receive power from the electronic device via a hardwired connection through a port of the electronic device.

In accordance with an exemplary embodiment of the claimed invention, aforesaid housing member comprises at least one power component configured to provide power to at least one of the accessory item or the electronic device.

In accordance with an exemplary embodiment of the claimed invention, aforesaid accessory item functions with an augmented reality software of the electronic device.

In accordance with an exemplary embodiment of the claimed invention, aforesaid accessory item comprises a digital display configured to display content captured by the image sensor and to receive input from the user to control the features and components of the accessory item.

In accordance with an exemplary embodiment of the claimed invention, the content captured by the accessory item is remotely accessible through an online/internet connection to allow remote viewing of the content captured by the accessory item. The online/internet connection also allows remote control of the components and features of the accessory item.

In accordance with an exemplary embodiment of the claimed invention, aforesaid accessory item is configured to simultaneously capture the content with the cameras and sensors of the electronic device.

In accordance with an exemplary embodiment of the claimed invention, aforesaid housing member comprises a memory and at least one of aforesaid accessory item, aforesaid electronic device and aforesaid housing member comprises a virtual assistant software capable of autonomous responses and actions based upon a user input. The virtual assistant software is preferably an artificially intelligent program.

In accordance with an exemplary embodiment of the claimed invention, at least one of aforesaid accessory item and aforesaid housing member comprises at least one removable module port, such as, but not limited to ports, openings, channels, slots and the like. The removable module port is configured to receive external modular components including but not limited to: a power supply, cameras, sensors, memory, digital memory, signal transmitters, adapters, light sources, illumination components, a stand, securing/mounting systems, connectors and the like.

In accordance with an exemplary embodiment of the claimed invention, a multipurpose accessory and storage system for an electronic device comprises a housing member configured to attached to the electronic device and a charging station structured on the housing member configured to charge, arrest and dispense an accessory item. The accessory item comprises a protective membrane housing at least one logic board, at least one power component, at least one image sensor, at least one transmitter configured to transfer a signal or data to the electronic device or the housing member and at least one software program stored in the logic board. The transmitter is configured to establish a pairing or electronic connection between the electronic device or the housing member and the accessory item. The pairing or electronic connection relays an image or content captured by the image sensor to the electronic device to permit a user to view the content on the display of the electronic device. In addition, or alternatively, the pairing or electronic connection controls components and features of the accessory item via the electronic device. At least one of the electronic device, accessory item or housing member is configured to process and overlay digital information over the content captured by the accessory item, thereby allowing the user to view and interact with the digital information and imagery on the display of the electronic device. Preferably, the digital information and imagery is augmented reality or mixed reality content which utilizes the software of the accessory item or software of the electronic device to process and overlay augmented reality or mixed reality content over a person or place captured or scanned by the accessory item.

The above and other aspects, features and advantages of the present invention will become apparent from the following description read in conjunction with the accompanying drawings, in which like reference numerals designate the same elements.

DETAILED DESCRIPTION OF THE EMBODIMENTS

Figure 1:
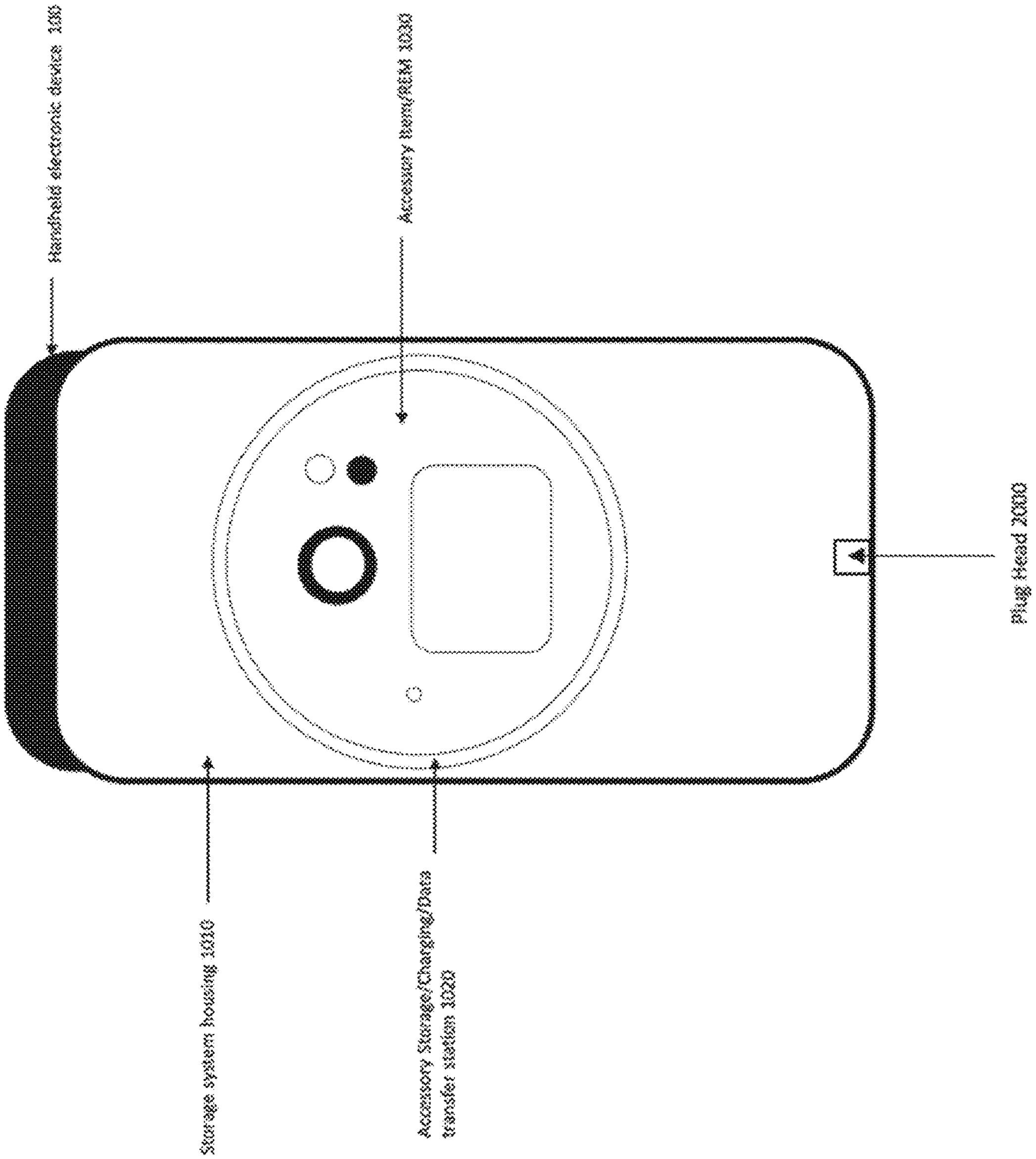
FIG. 1 is a view of the multipurpose accessory and storage system with a removable electronic module (REM) attached to a handheld electronic device in accordance with an exemplary embodiment of the claimed invention.

Reference will now be made in detail to embodiments of the claimed invention. Wherever possible, same or similar reference numerals are used in the drawings and the description to refer to the same or like parts or steps. The drawings are in simplified form and are not to precise scale. For purposes of convenience and clarity only, directional (up/down, etc.) or motional (forward/back, etc.) terms may be used with respect to the drawings. These and similar directional terms should not be construed to limit the scope of the invention in any manner.

For simplicity and clarity of illustration, the drawing figures illustrate the general manner of construction, and description and details of well-known features and techniques may be omitted to avoid unnecessarily obscuring the invention.

The terms "first," "second," "third," "fourth," and the like in the description and the claims, if any, may be used for distinguishing between similar elements and not necessarily for describing a particular sequential or chronological order. It is to be understood that the terms so used are interchangeable. It is also understood, that the phrases embodiment or version may be used interchangeably and without undue limitation. There is no restriction such that an embodiment is more or less restrictive or definitive than a version of the present invention. Furthermore, the terms "comprise," "consisting of", "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

Certain embodiments herein provide a slim profiled camera, sensor apparatus and/or a Removable Electronic Module (REM) that can fit in a pocket and function with electronic devices. The camera, sensor apparatus and REM is detachable and stored in or on custom devices that can be proprietary to the camera and/or sensor apparatus, such as, but not limited to a protective housing (for a computing device), a surface mounted device (such as a tabletop docking station) and/or an airborne device (such as a drone/UAV) (custom devices). The camera/sensor apparatus can be used while on or detached from a custom device and capable of streaming content/data to the custom device and/or to electronic devices, thereby increasing the user's data/content capture ability and opening up the potential for many new camera and/or sensor use applications as well as provide multi-dimensional camera and/or sensor experiences.

For example, as an AR-tuned device with dedicated AR hardware and/or software, the camera/sensor apparatus cam allow a user to exponentially extend the AR reach/capabilities of AR enabled devices, such as, but not limited to smartphones, tablets and AR headsets and the like, thereby opening up a myriad of new use case scenarios. Such use case scenarios can include but not be limited to: 3$^{rd}$ person perspective for AR gaming/experiences by physically incorporating the user into an AR game and/or experience instead of being represented as just an avatar. This allows for a user to see everything in their peripheral vision as well as behind them (not just a front view as seen in the current state of AR gaming/experiences). Multi-room AR gaming/experiences: mounting the camera and/or sensor apparatus in different rooms/areas to offer a new and much more robust AR space experience. A user can switch feeds from a first-person AR view on their AR enabled device such as a smartphone to a room/area in a completely different part of the house that contains the camera/sensor apparatus. For example, while a user is fighting enemies on the front line in their back yard via their smartphone, they can check the turret defense which is setup in the kitchen via the camera/sensor apparatus. Augmented Self Images: mounting the AR-tuned camera/sensor apparatus in front of a user (via on a stand or wall or holding in hand) gives the user the ability to see complete and/or parts of their body and/or surrounding area in many different augmented ways. Practical applications include but are not limited to retail shopping (e.g., augmenting clothing, products, accessories on person), health and fitness (e.g., providing vital sign readings, calorie burn rate and time while exercising, etc.) and/or general entertainment such as augmented imaginative characters, facial expressions, objects, special effects and the like on or around their person. Awkward angles/gymnastics: a common challenge of the smartphone-based AR experience of today is that the cameras and/or sensors are always facing straight either in the direction the screen/display is pointing or in the exact opposite direction. This usually results in the user physically straining themselves while in awkward positions to hold the phone in an optimal manner while simultaneously viewing and engaging the content on the screen/display to experience an AR moment. By separating the cameras and/or sensors from the screen/display of a smartphone and/or AR enabled device, the cameras and/or sensors can be mounted on a user or on another person and/or mount them on a custom device and/or hold them, thereby enabling the user to move the cameras and/or sensors in different angles and positions relative to the screen/display allowing for more a controlled and concentrated experience while viewing and engaging the content on the screen/display of the smartphone and/or AR enabled device.

The camera and/or sensor apparatus can create new experiences in the conventional camera, videography and/or photography space as well. Separating cameras and/or sensors from the screen/display can enable the user to rotate and move the cameras and/or sensors and maintain visibility of screen/display. For example, the user can capture photos/videos from angles including but not limited to overhead, from below or from around obstacles without having to move and/or abandon the main view finder/display of an electronic device. The detachable/removable camera and/or sensor apparatus can further allow for a user to wear/mount it such that they can capture subject matter in such angles and positions including but not limited to behind and on sides enabling new gaming experiences, video/photo experiences and/or 360° video/photo production.

The camera and/or sensor apparatus can be connected to external custom devices which can allow for expanded experiences and use cases. The custom devices can include but not limited to: a protective housing for a computing device and/or handheld electronic device (such as a case or cover), a surface mounted device (such as a docking station) and/or an airborne device (such as a drone/UAV and the like). The custom devices can be proprietary to the camera and/or sensor apparatus and allow for fully integrated functionality with the camera and/or sensor apparatus such that the camera and/or sensor apparatus can access and utilize all components and features of the custom devices and vice versa. For example, the camera and/or sensor apparatus can removably mount and connect to a protective housing of a handheld electronic device allowing the camera and/or sensor apparatus to utilize components and features of the protective housing such as but not limited to: its power supply, transmitters, antennas, software, cameras, sensors, memory, ports and the like.

Removable Electronic Module (REM):

Turning to FIG. 1, the camera and/or sensor apparatus can function as and/or be an accessory item such as a removable electronic module (REM) 1030 which can electrically/electronically connect to and be permanently fixed and/or removably secured to, on or in the accessory station/charging station 1020 of the storage system's protective housing member 1010. Wherein the accessory station/charging station 1020 of the protective housing member 1010 can electrically/electronically connect with components of the REM 1030 and/or the handheld electronic device 100 allowing for full electrically/electronically connectivity between the REM 1030, the multipurpose accessory and storage system 1000 and/or handheld electronic device 100. Alternatively, the REM 1030 can electrically/electronically connect to, and be fixed and/or detachable and/or removably secured on, to or in an accessory/charging station of the handheld electronic device 100 and/or custom devices proprietary to the REM 1030 including but not limited to: a surface based device such as a docking station 1370 (FIG. 4) and/or airborne based device such as a drone, UAV, External Flight Module 1510 (FIG. 7) and/or an external corresponding device.

In accordance with an exemplary embodiment of the claimed invention, the REM 1030 and/or the multipurpose accessory and storage system 1000 can be configured to include components of and/or function as or with any of the following: a camera, a sensor system, a camera and sensor system, a LED or light emitting element, an intelligent digital assistant, flight assistant, augmented reality software and hardware, virtual reality software and hardware, audio device, headphones, hearing aid, power device, power supply, electronic pencil, a user held electronic item configured to interface with the screen of the handheld electronic device, mixed reality software and hardware, spatial computing software and hardware, a drone, drone software and hardware, micro air vehicle, micro drone, UAV software and hardware, software which is proprietary to the REM 1030, artificial intelligence software, machine learning software, real-time machine learning software, deep learning software, artificial neural networks and the like.

Figure 2:
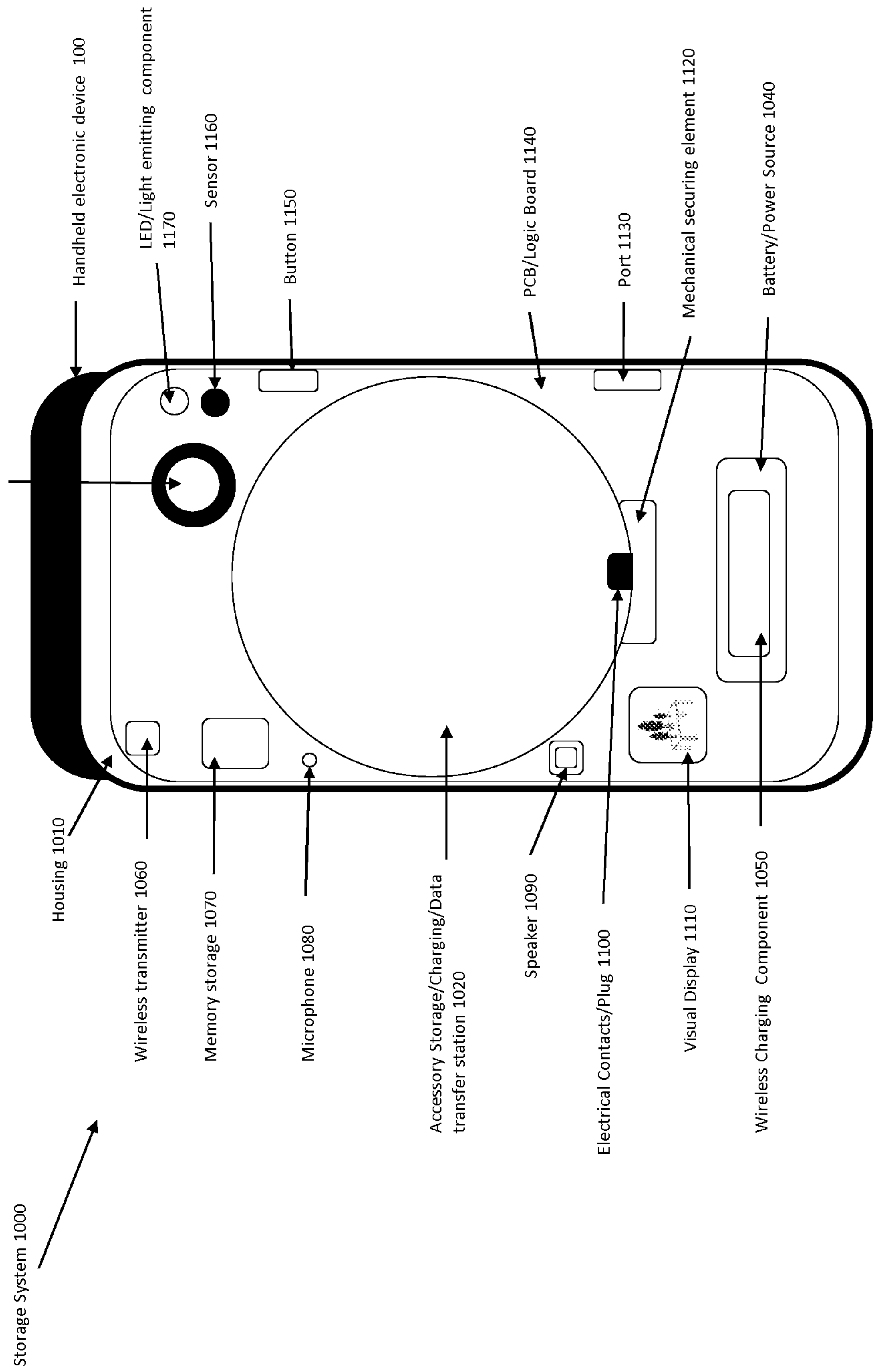
FIG. 2 is a view of the components of the multipurpose accessory and storage system in accordance with an exemplary embodiment of the claimed invention.

In accordance with an exemplary embodiment of the claimed invention, as shown in FIG. 2, the multipurpose accessory and storage system 1000 comprises a housing 1010 and at least one of the following components on a PCB/logic board 1140: a camera 1180, a LED or light emitting component 1170, a sensor 1160, a button 1150, a port 1130, a mechanical securing element 1120, a battery or power source 1040, a wireless element or charger 1050, a visual display 1110, an electrical contact/plug 1100, a speaker 1090, an accessory or charging station 1020 to transfer data, store and charge an accessory item, a microphone 1080, a memory 1070 and a wireless transmitter 1060.

Figure 3:
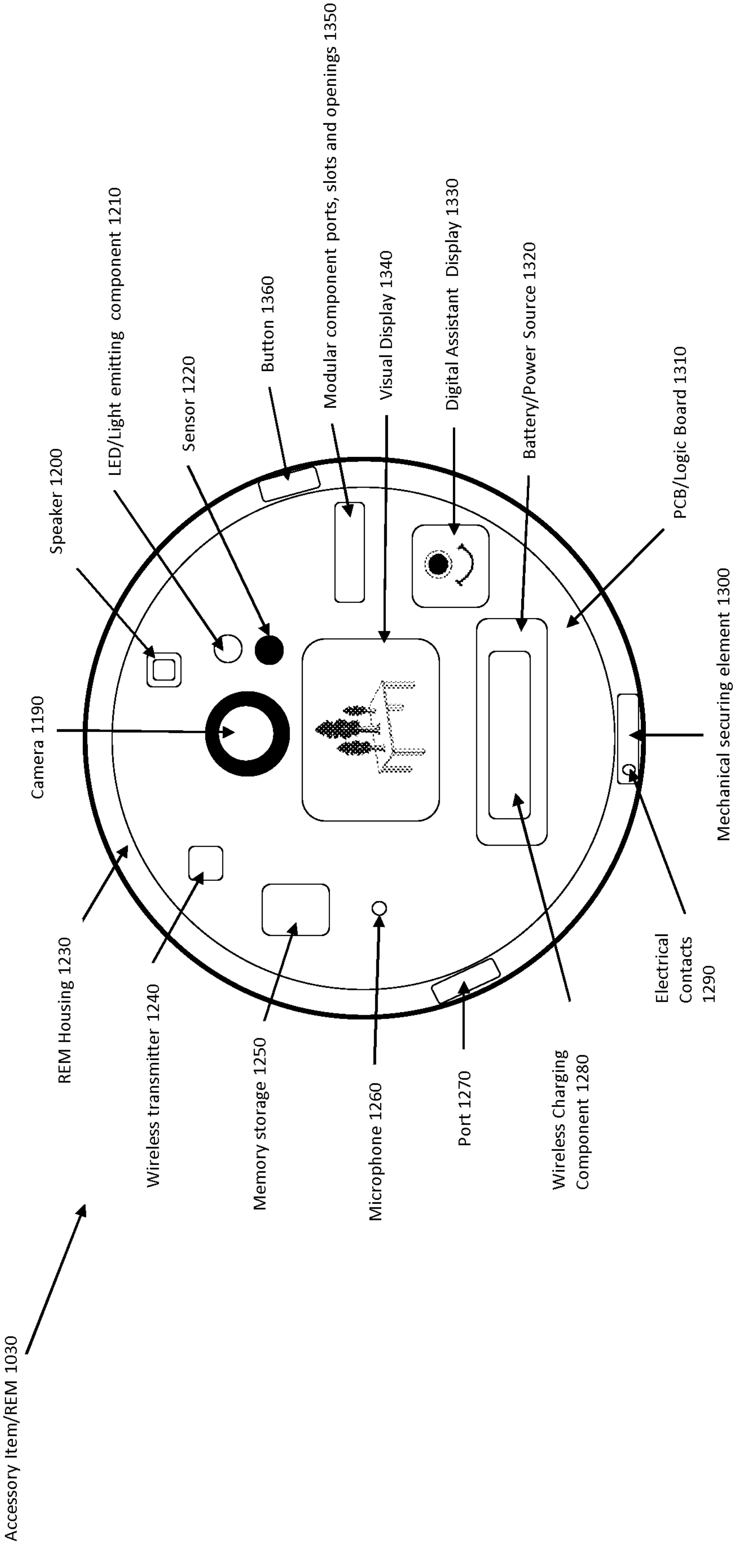
FIG. 3 is a view of the components of the REM in accordance with an exemplary embodiment of the claimed invention.
Figure 7:
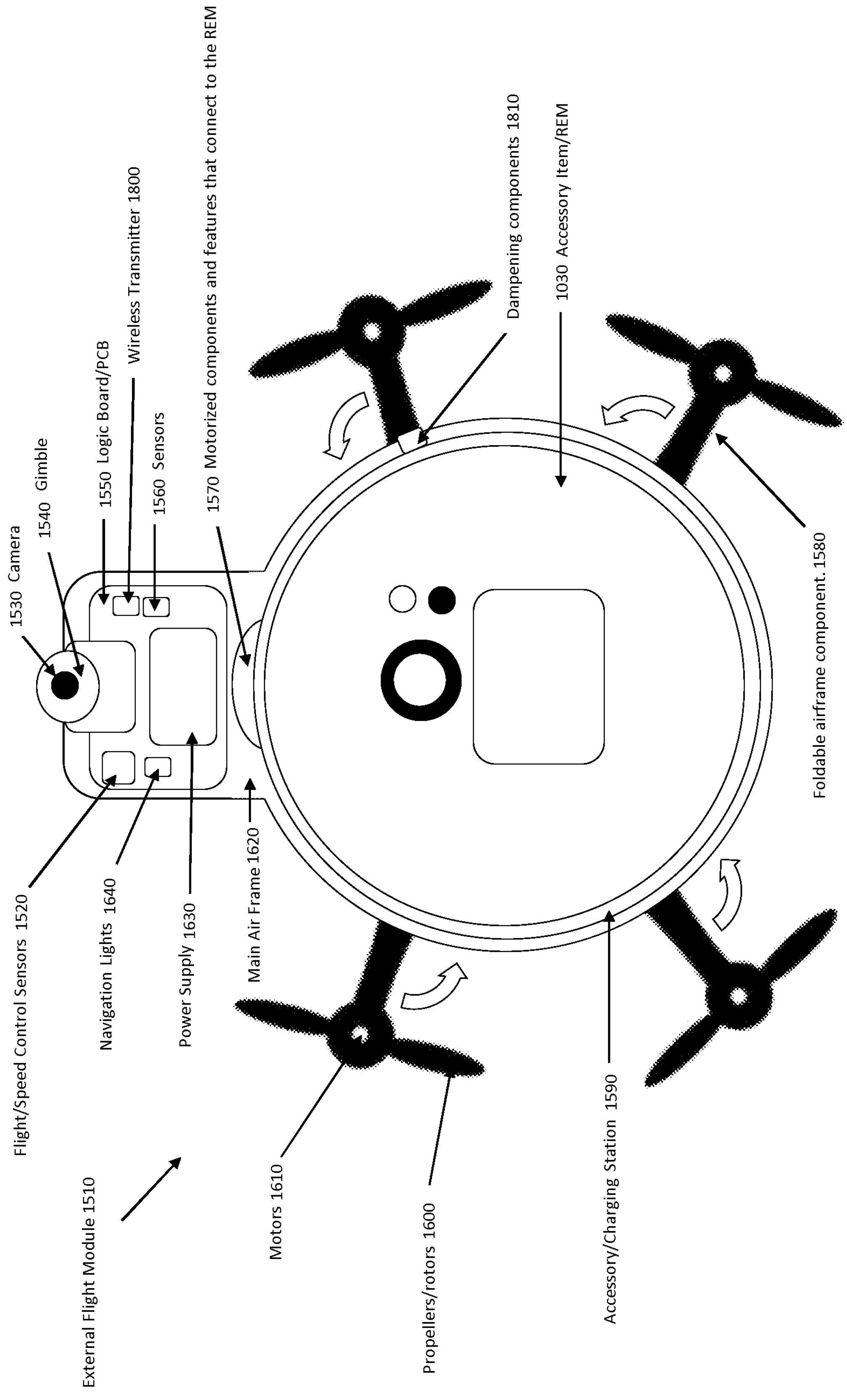
FIG. 7 is a view of the REM with the external flight module in accordance with an exemplary embodiment of the claimed invention.

REM:

In accordance with an exemplary embodiment of the claimed invention, as shown in FIG. 3, the REM 1030 comprises one or more protective housing parts or components that can mechanically combine to form a REM housing 1230. The REM housing 1230 can be configured to protect internal components including but not limited to: a PCB/logic board 1310, data and/or power components and the like. These one or more housing parts or components can include but are not limited to snaps, screws, tongue and groove, peg and hole, girders, hooks and washers, perforated material, perforated strips, perforated girders, perforated supports, magnets, axel rods and shafting, adhesive, material with adhesive qualities, glue and the like. The REM housing 1230 can include one or more panels and/or removable panels that can be mounted, in and/or on one or more areas of the REM housing 1230. The panels and/or removable panels can be configured to store and/or enclose and/or protect components of the REM 1030. The REM housing 1230 can include at least one storage chamber configured to store and/or enclose and/or protect components of the REM 1030. The storage chamber can be formed between the one or more panels and/or removable panels and the protective housing parts. The housing parts or components can be made from a variety of materials including but not limited to metal, aluminum, rubber, carbon fiber, plastic, ceramic, glass, crystal, sapphire crystal or the like. The REM housing 1230 can be configured in a variety of shapes and sizes including but not limited to cylinder, square, square with rounded edges, tubular, round, rectangular, rectangular with rounded edges and other shapes and sizes. The REM housing 1230 can include various ports 1270, electrical contacts 1290 and transmitters/receivers 1240 to allow for electrical and/or electronic connections with corresponding devices. For example, the ports 1270 or the electrical contacts 1290 allows the REM 1030 to electrically mate with a corresponding plug or contact mounted on the multipurpose accessory and storage system housing 1010 to allow for the transition of power and/or data between the REM 1030, the multipurpose accessory and storage system 1000 and/or handheld electronic device 100. Furthermore, the ports 1270 or the electrical contacts 1290 can be used to connect various electronic accessories and/or support devices directly to the REM 1030. For example, the ports 1270 or the electrical contacts 1290 can allow a user to attach and electrically/electronically connect the REM 1030 to the custom devices such as the docking station 1370 (FIG. 4) and/or external flight module 1510 (FIG. 7).

Figure 12:
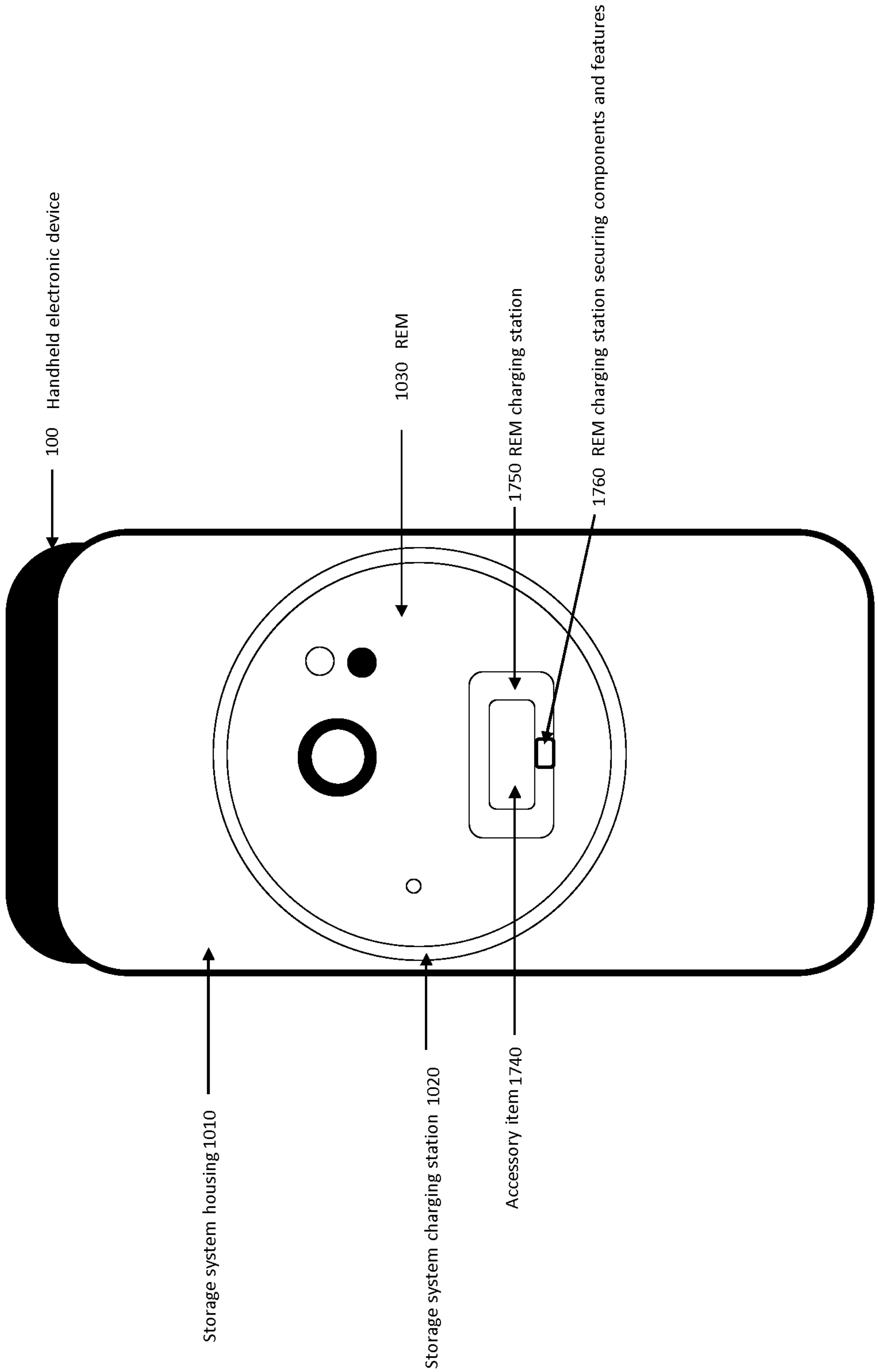
FIG. 12 is a view of the charging station of the REM and of the multipurpose accessory and storage system in accordance with an exemplary embodiment of the claimed invention.

In accordance with an exemplary embodiment of the claimed invention, as shown in FIGS. 3 and 12, the REM 1030 comprises a REM housing 1230 and at least one of the following components on a PCB/logic board 1310: a camera 1190, a LED or light emitting component 1210, a sensor 1220, a button 1360, a port 1270, a mechanical securing element 1300, a battery or power source 1320, a wireless charging element or charger 1280, a visual display 1340, an electrical contact 1290, a speaker 1200, a charging station 1750, a microphone 1260, a memory 1250, a modular component port, slot or opening 1350 and a wireless transmitter 1240.

In accordance with an exemplary embodiment of the claimed invention, the REM 1030 further comprises stabilizer components and features that allow the REM 1030 to function as a stand and/or attach to multiple surfaces, geometries and objects. The stabilizer components and features can be fixed and/or removably secured to the REM housing 1030. The stabilizer components and features can allow for the REM 1030 to be securely placed on any given surface or attach to any given object. These stabilizer components and features can comprise at least one of the following to allow for the fold-out, bendability, slide-out and/or retraction of post members, support legs, support structures, grasping members and the like to allow the REM 1030 to be placed on or attached to surfaces and things; hinges, pins, ball and joints, interlocking gears, groove and edge, springs, elastic material, flexible material, flexible metal, rubber, and the like.

The REM housing 1230 can be configured to accept a power/data cable which can allow for a hard-wired and/or direct electrical connection that facilitates the transition of power and/or data between the REM 1030, the multipurpose accessory and storage system 1000, the docking station 1370, the external flight module 1510, the handheld electronic device 100 and/or any other external corresponding device. For example, the power/data cable can be connected to a port 1270 located on the REM 1030 and connect to a corresponding port 1130 located on the multipurpose accessory and storage system housing 1010 to allow for the REM 1030 to utilize the power source contained within the multipurpose accessory and storage system 1000 thereby extending the REM's power supply 1320. This power/data connection also allows for the transmission of data and or video/audio feeds between the REM 1030, the multipurpose accessory and storage system 1000, the docking station 1370, the external flight module 1510 and the handheld electronic device 100. Furthermore, the power/data cable can be operably connected to a cable retraction system for retracting and storing the cable. The cable retraction system can be mounted within the multipurpose accessory and storage system housing 1010 or be an independent system distinct from the multipurpose accessory and storage system housing 1010.

In accordance with an exemplary embodiment of the claimed invention, as shown in FIG. 12, the REM housing 1230 can act as and/or comprise a REM charging station 1750, distinct from the charging station 1020 of the multipurpose accessory and storage system 1000, for charging and/or data transfer of an accessory item 1740 of the REM 1030, and/or the multipurpose accessory and storage system 1000 and/or the handheld electronic device 100, such as, but not limited to: a chargeable accessory, power component, power conversion components, battery, camera, sensor, audio component, audio device, hearing aid, wireless transmitter, transmitter, antenna and the like. The REM charging station 1740 can electrically connect to a power source 1320 and/or electronic component located in the REM housing 1230. That is, the REM charging station 1280, via the REM 1030, can electrically connect with at least one of the following: the charging station 1020 of the multipurpose accessory and storage system 1000, a charging station 1410 of the docking station 1370 (FIG. 4), a charging station 1590 of the external flight module 1510 (FIG. 7), the handheld electronic device 100 or an external corresponding electronic device. The REM charging station 1740 can comprise securing components and features 1760 including but not limited to snaps, screws, tongue and groove, peg and hole, girders, hooks and washers, perforated material, perforated strips, perforated supports, magnets, axel rods and shafting, adhesive, material with adhesive qualities, glue and the like to mechanically attach the accessory item to the REM charging station 1740.

Figure 13:
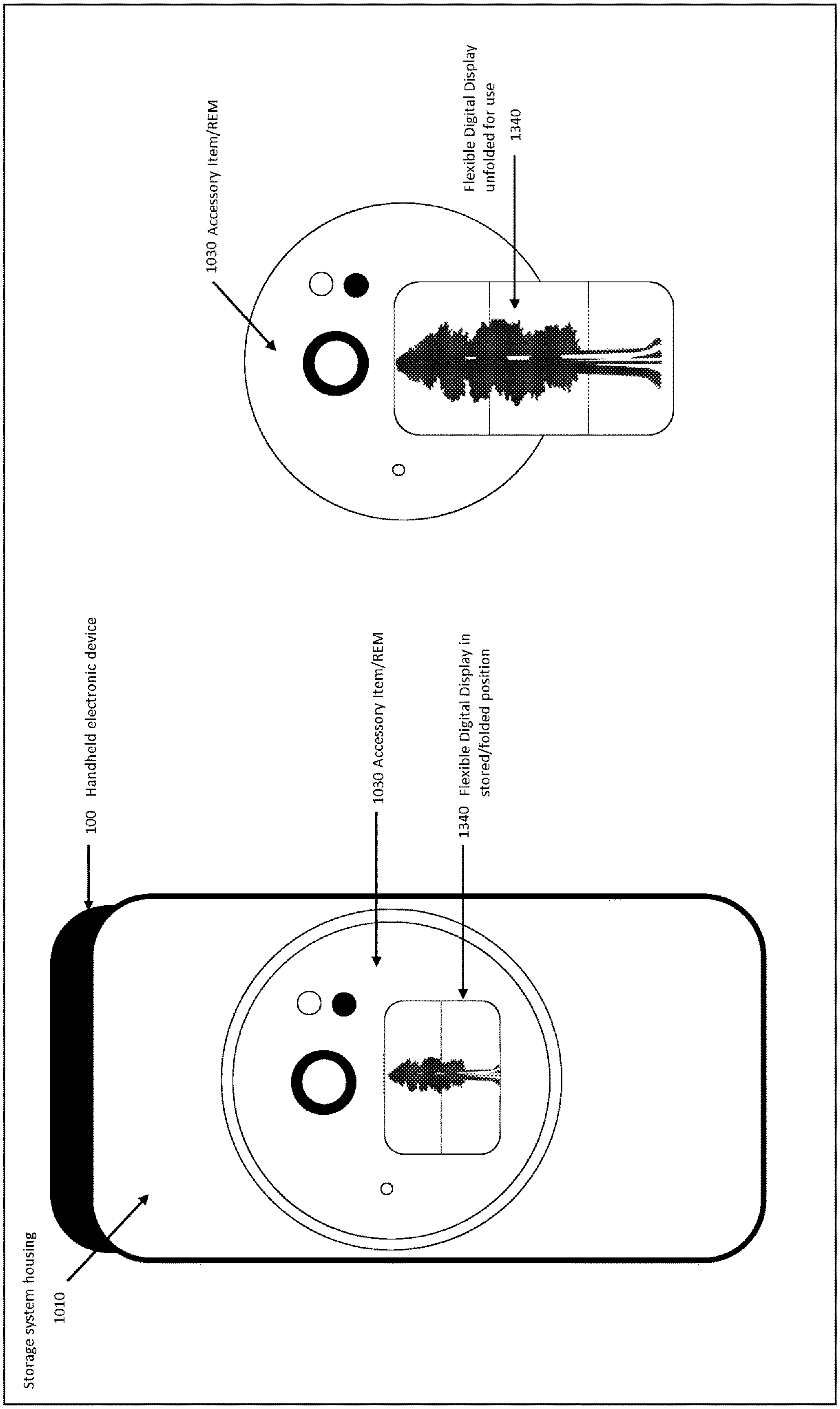
FIG. 13 is a view of the flexible digital display mounted on or in the housing of the REM and of the multipurpose accessory and storage system in accordance with an exemplary embodiment of the claimed invention.

In accordance with an exemplary embodiment of the claimed invention, as shown in FIG. 13, the REM protective housing 1230 and/or the multipurpose accessory and storage system protective housing 1010 can be configured to bend or fold enabling compact and low-profile storage of the housings 1010, 1230 and their corresponding components. This bending or folding ability can function with an electronic device 100 which is capable of folding or bending. For example, if the electronic device 100 is a bendable or foldable smartphone, the bending or folding features of the REM housing 1230 and/or the multipurpose accessory and storage system protective housing 1010 can allow the REM housing 1230 and/or the multipurpose accessory and storage system housing 1010 to function with the mechanical properties of the foldable smartphone 100, thereby allowing for the REM housing 1230 and/or the multipurpose accessory and storage system housing 1010 to bend or fold in locations that correspond to the locations that fold on the smartphone 100. The REM and/or storage system protective housing 1230, 1010 can comprise components and features that allow for bending or folding, such as, but not limited to:

hinges, flexible/bendable material, flexible PCB/logic board, gears, springs, rubber bands, axel rods and shafting, pivot pins, ball and socket, groove and track and the like. The REM and/or storage system protective housing 1230, 1010 can be manufactured from flexible and/or stretchable material, such as, but not limited to: flexible glass, flexible plastic, flexible metal, flexible substrate, and the like. Furthermore, when the REM and/or storage system protective housing 1230, 1010 is folded or bent, the cameras 1190, 1180 and sensors 1210, 1160 of the REM 1030 and/or the multipurpose accessory and storage system 1000 can point/face and capture the subject matter and/or data in different angles/directions relative to each other thereby allowing the REM 1030 and/or the multipurpose accessory and storage system 1000 to capture and process data from multiple areas/angles. Furthermore, the REM 1030 and/or the multipurpose accessory and storage system 1000 and/or the handheld electronic device 100 can utilize image/video/data stitching software to process and refine the content/data being captured from multiple angles/directions.

In accordance with an exemplary embodiment of the claimed invention, the REM 1030 can be configured to be wirelessly and/or hardwired/electrically/electronically connected to the handheld electronic device 100 either directly, via the multipurpose accessory and storage system 1000, or via a $3^{rd}$ party/external component or system, to utilize the power and electronic components of the handheld electronic device 100. For example, the REM 1030 can utilize the processing power/speed of electronic components proprietary to the handheld electronic device 100. such as its GPU's, CPU's, power supply, cameras, sensors, transmitters, antennas and the like thereby reducing or eliminating the need to mount such components within the REM housing 1230.

In accordance with an exemplary embodiment of the claimed invention, the REM 1030 can be configured to automatically or manually transfer data that is saved/stored on a memory 1250 of the REM 1030, which is distinct the memory of the multipurpose accessory and storage system 1000, the docking station, the external flight module and/or the handheld electronic device and vice versa. For example, a user removes the REM 1030 from the charging station 1020 of the multipurpose accessory and storage system 1000 and captures video/data/content which upon recording is stored locally on the memory 1250 of REM 1030. When the user finishes the video and places the REM 1030 back into the multipurpose accessory and storage system 1000, the video/data/content can be automatically and/or manually transfer to the memory 1070 of the multipurpose accessory storage system 1000 and/or to the handheld electronic device 100. Furthermore, the REM 1030 can be configured to automatically format/erase the video/data/content from its local memory 1250 after the transfer of the video/data/content enabling the REM's local memory 1250 to be free of the data and back to its full memory capacity/potential. Alternately, this data transfer can occur during live capturing of content/data by the user. For example, a user utilizes the REM 1030 and begins to record a live feed of content/data. While this content/data is being captured live by the user, the content/data can be automatically relayed to a display and memory of at least one of the following: the multipurpose accessory and storage system 1000, the docking station 1370, the external flight module 1510, the handheld electronic device 100 and/or an external device via the wireless transmitter 1240 located in the REM 1030, thereby eliminating the need to store the content/data on a local memory 1250 of the REM 1030.

Figure 4:
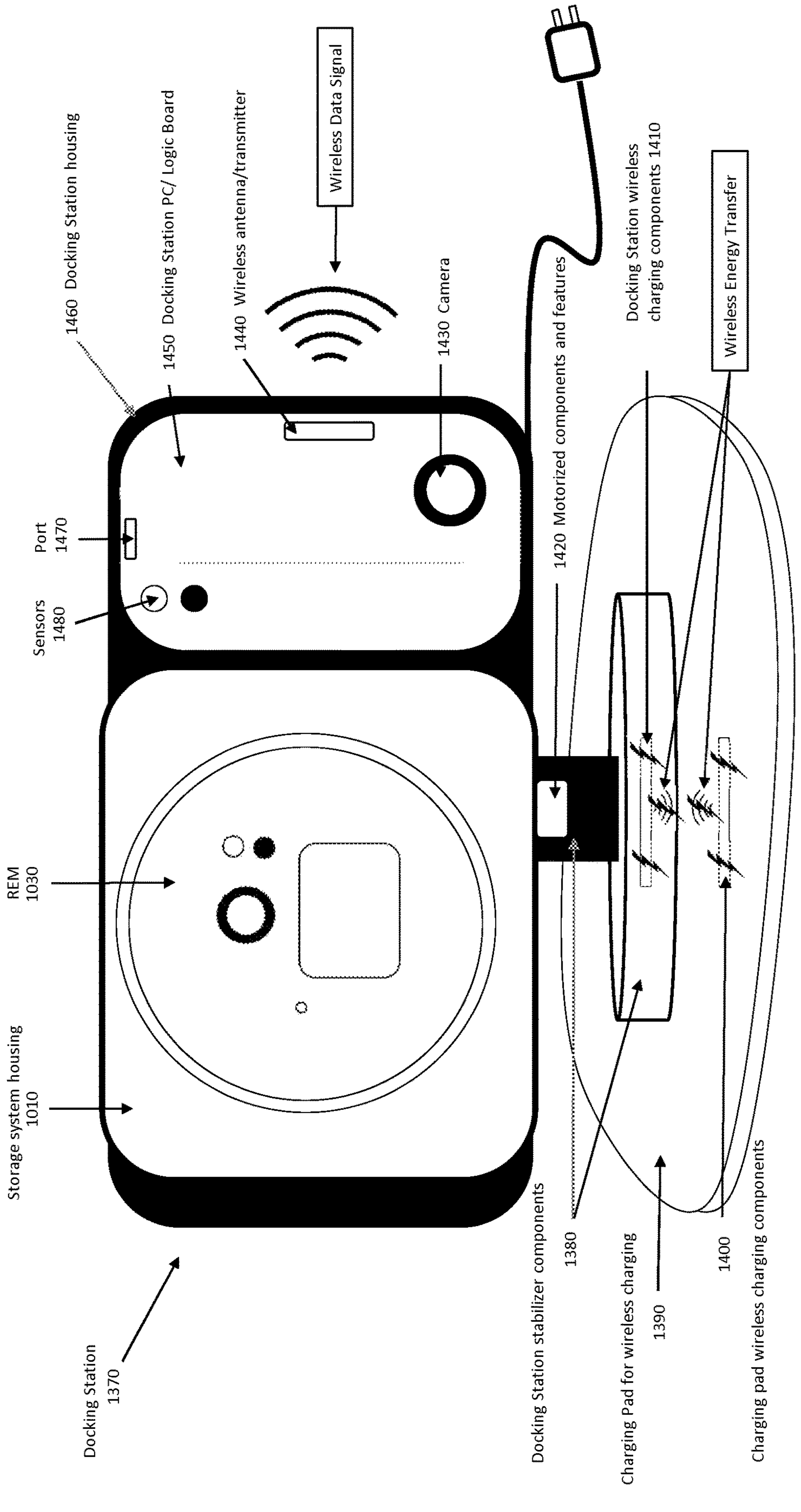
FIG. 4 is a view of the components of the docking station and the multipurpose accessory and storage system with the wireless capable REM attached to a handheld electronic device in accordance with an exemplary embodiment of the claimed invention.
Figure 5:
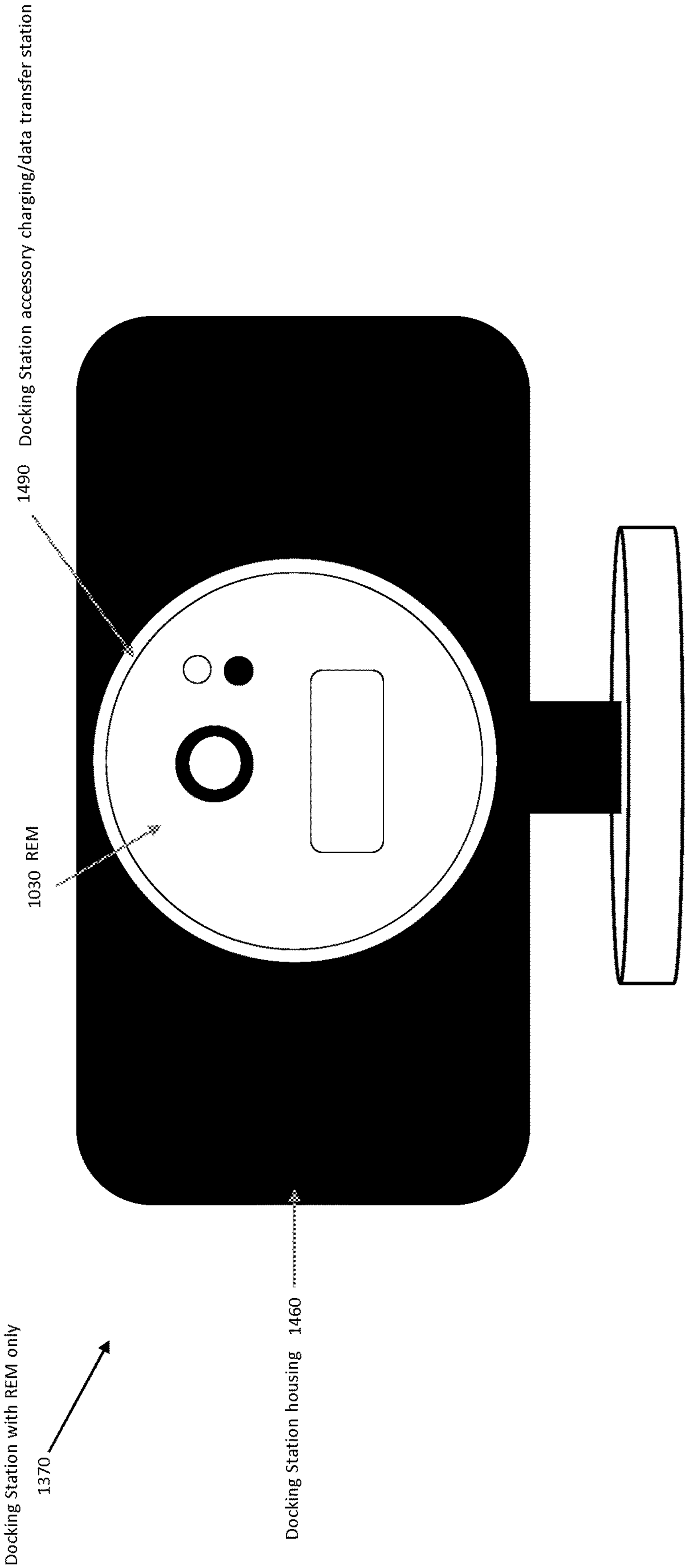
FIG. 5 is a view of the docking station with the REM stored within the charging station of the multipurpose accessory and storage system in accordance with an exemplary embodiment of the claimed invention.
Figure 6:
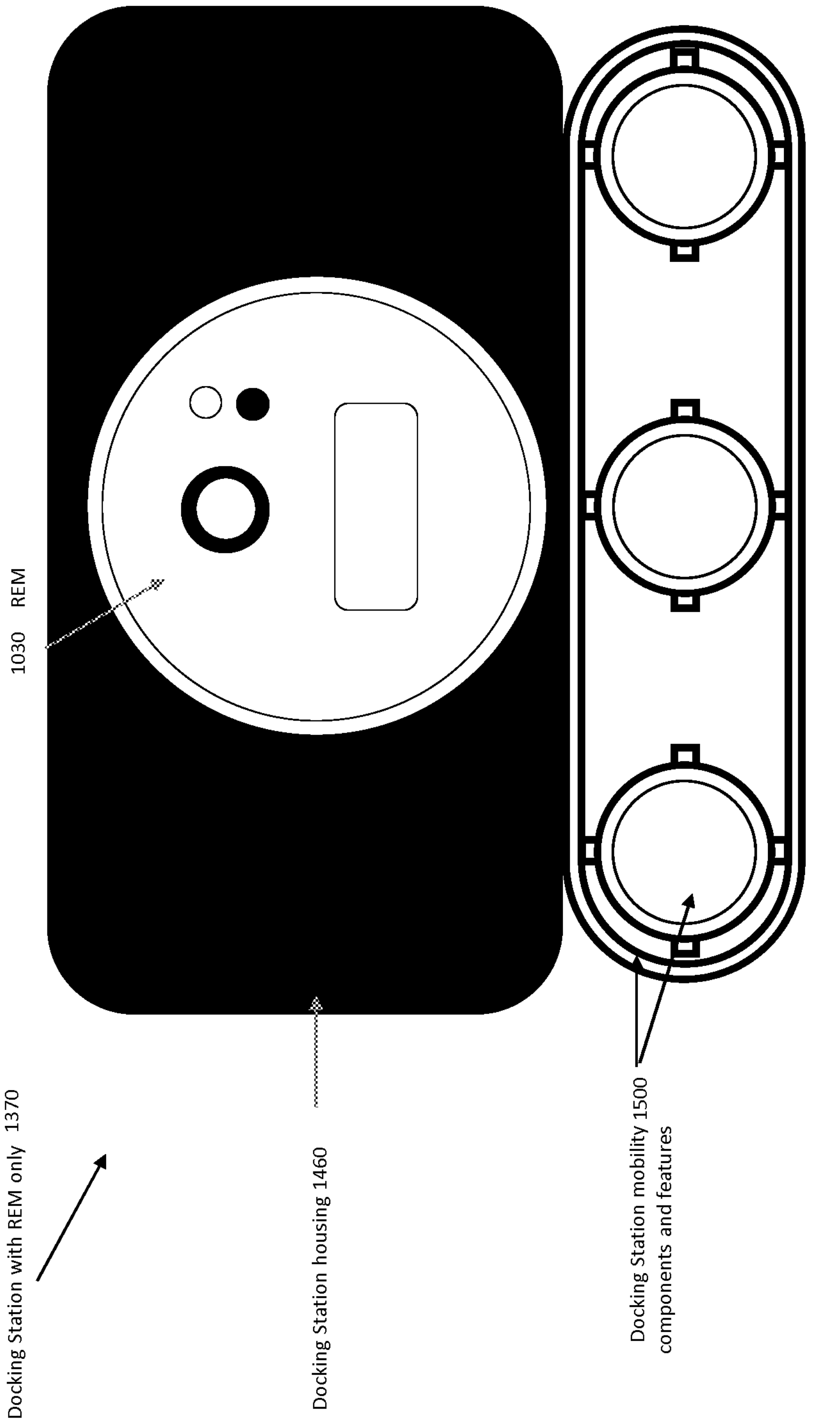
FIG. 6 is a view of the mobility components of the docking station with the REM in accordance with an exemplary embodiment of the claimed invention.

Docking Station:

In accordance with an exemplary embodiment of the claimed invention, as shown in FIGS. 4-6, alternative to being mounted on the handheld electronic device 100, the REM 1030 can be configured to electrically/electronically attach/mount to a surface mounted device, such as a docking station 1370. The docking station 1370 comprises components and features including but not limited to: a housing 1460, a PCB/logic board 1450, ports 1470, wireless antennas/transmitters/receivers 1440, induction/wireless power transfer components 1410, data and power components and the like, storage chambers configured to store electrical and electronic components and the like. The docking station 1370 can be configured to attach/mount to the external flight module 1510. The docking station 1370 can be configured to support and transfer data and/or power to or from the multipurpose accessory and storage system 1000, the REM 1030, external flight nodule 1510 and/or external corresponding electronic devices 100. For example, the REM 1030 can be secured to the docking station 1370 and receive power and/or data from the docking station 1370. As shown in FIG. 5, the docking station 1370 can comprise an accessory/charging station 1490 configured to store, attach and electrically connect the REM 1030 directly to the docking station 1490 allowing the REM 1030 to utilize the components and features of docking station 1490, such as docketing station's cameras 1430, sensors 1480, power supply/power component/power conversion components 1410, audio component, transmitter, receiver, antenna, battery and the like. The docking station 1490 can also utilize the components and features of the REM 1030. Alternatively, the docking station 1490 can function as and/or be the handheld electronic device which attaches to the multipurpose accessory storage system housing 1010 and the REM 1030. Furthermore, the docking station 1490 can further comprise software, artificial intelligence software, machine learning software, real-time machine learning software, deep learning software, neural networks and the like to support its components, functions and features as well as communicating and operating with a user, the REM 1030, the multipurpose accessory and storage system 1000, the handheld electronic device 100 and/or other external devices.

In accordance an exemplary embodiment of the claimed invention, as shown in FIG. 4, the docking station 1370 comprises stabilizer components and features 1380 that allow the docking station 1370 to function as a stand and/or attach to multiple surfaces, geometries and objects. The stabilizer components and features 1380 can be fixed and/or removably secured to the REM housing 1030. The stabilizer components and features 1380 can allow for the docking station 1370 to be securely placed on any given surface or attach to any given object. These stabilizer components and features 1380 can comprise at least one of the following to allow for the fold-out, bendability, slide-out and/or retraction of post members, support legs, support structures, grasping members and the like to allow the docking station 1370 to be placed on or attached to surfaces and things; hinges, pins, ball and joints, interlocking gears, groove and edge, springs, clastic material, flexible material, flexible metal, rubber, and the like. The docking station 1370 can be configured to function with external corresponding devices and components via hard-wired or wireless connection to provide power and/or data to the docking station 1370. For example, the docking station 1370 can include a port 1470 and/or a wire to allow for plugging into a wall socket and the like and/or power source. The docking station 1370 can be configured to receive and/or transfer power from a wireless charging pad 1390 comprising wireless charging components 1400 and thereby converting and transferring power to the multipurpose accessory and storage system 1000 and/or the REM 1030 and/or the external flight module 1510. Furthermore, the docking station can include motorized components and features 1420 including but not limited to a logic board, motors, electric motors, gears, servos and the like to allow for control of the position and angle of the docking station 1370 relative to the stabilizer components and features 1380. For example, the user can place the REM 1030 in the docking station's accessory station 1490 and wirelessly and remotely control the position and angle of the docking station 1370 via the motorized components 1420, thereby allowing the REM's camera 1190 and sensors 1220 to capture a larger field of view and more subject matter. The motorized components and features 1420 can be controlled autonomously by software. The docking station 1370 can include adapters allowing for interchangeability of various types of stabilizer components and features 1380.

In accordance with an exemplary embodiment of the claimed invention, as shown in FIG. 6, the docking station 1370 can further comprise mobility components and features 1500 such as motors, electric motors, pulleys, wheels, tracks, wheel-tracks, spheres, rotatable balls, ball bearing, ball and socket and the like which can allow for the docking station 1370 to travel, navigate, rotate in fixed and/or omnidirectional manner. The docking station 1370 can allow for a user to manually control the mobility components and features 1500 from a remote location via the REM 1030, the multipurpose accessory and storage system 1000, the handheld electronic device 100 and/or external corresponding devices. Alternatively, the docking station 1370 can utilize software to allow for autonomous control of the mobility components and features 1500. Furthermore, the REM's and/or docking station's software, cameras and sensors can support functions and features of the mobility components 1500 to allow for the docking station 1370 to move, travel, rotate in a controlled and safe manner. For example, the REM's and/or docking station's cameras and sensors can utilize simultaneous localization and mapping (SLAM) features and sensors (and the like) to allow for the REM 1030 and/or the docking station 1370 to construct and map an environment and allow for movement across an environment (such as a tabletop) and enable the docking station 1370 to be situationally aware of its environment, a user's location, surroundings, obstacles, speed, telemetry etc. and the like. For example, SLAM (or the like) can identify the tabletop's edge and prevent the docking station from falling off the edge. Furthermore, SLAM (or the like) can allow for safe, autonomous and/or manual navigation of the docking station 1370. Furthermore, the docking station 1370 can utilize planning/prediction software which allows for prediction of future travel path, obstacles, environmental/atmospheric conditions, user position and the like for optimal video/data capturing and/or safe and controlled movement. Furthermore, the planning/prediction software can function with the docking station's mobility components and features 1500 to control components including but not limited to as the motors, wheels, tracks, REM/camera/sensor angle and the like.

Furthermore, in accordance with an exemplary embodiment of the claimed invention, the docking station 1370 can be configured to wirelessly communicate with external corresponding devices such as a smartphone 100 to allow for the transfer of data and information being recorded/captured by the REM 1030 and/or the multipurpose accessory and storage system 1000 and/or docking station 1370. For example, the REM 1030 can be attached to the docking station 1370, placed in a room-1 and setup to record/scan subject matter within the room-1. The subject matter being recorded/scanned by the REM 1030 can be wirelessly transmitted to a smartphone 100 located in a separate and distant room-2 allowing the user of the smartphone 100 to view and interact with the subject matter being recorded/scanned by the REM 1030 remotely in room-1 via the docking station 1370 and/or the REM 1030. Furthermore, video/audio/data feeds being captured/scanned by the REM 1030 and/or the docking station 1370 can be accessible remotely through an online/internet connection via remote external corresponding devices.

In accordance with an exemplary embodiment of the claimed invention, the docking station 1370 can comprise inductive and/or other wireless charging components and features 1410 such as an inductive coupling feature, a battery, a capacitor, a super capacitor, induction chargers, induction coil, power transmitting coil, power inverter, power converter an electronic transmitter or electronic receiver and the like to allow for the transmission of wireless energy to and from the docking station 1370. The inductive/wireless charging components and features 1410 can allow for the transfer of wireless energy between the docking station 1370 and external devices, such as the REM 1030, the multipurpose accessory and storage system 1000, the external flight module 1510 as well as any external electronic device which is capable of transmitting and/or receiving wireless energy such as a wireless charging station and/or pad 1390.

External Flight Module:

In accordance with an exemplary embodiment of the claimed invention, as shown in FIGS. 7-10, the REM 1030 can be configured to electrically/electronically attach/mount to a drone, UAV and/or a drone like device, such as, an external flight module (EFM) 1510 via the REM's ports 1270, the electrical contacts 1290 and the like. The EFM 1510 can comprise components and features of and/or function as a drone, UAV and the like. These components and features can include but not limited to: a protective housing/main air frame 1620, a logic board/PCB 1550, flight/drone software and navigation software stored in the logic board/PCB 1550, a navigation system, foldable air frame components 1580, a power supply 1630, landing struts/bars, propellers/rotors 1600, wireless antenna/transmitter/receiver, ports, cameras 1530, gimbles 1540, motors 1610, flight and speed controllers 1520, sensors and electronics 1560, storage chambers configured to store electrical and electronic components and the like. When attached to the EFM 1510, the REM 1030 can go airborne/take flight and be controlled by a user via the handheld electronic device 100, the multipurpose accessory and storage system 1000, mixed/augmented reality display, or any other external device capable of being hard wired or wirelessly connected to the REM 1030 and/or the EFM 1510.

In accordance with an exemplary embodiment of the claimed invention, the EFM's propellers/rotors 1600 and/or motors 1610 and other components can be configured to be removable/interchangeable enabling a user to replace used and/or damaged propellers/rotors 1600 and/or motors 1610 and the like. The removable/interchangeable propellers/rotors 1600 and/or motors 1610 can include mechanical securing features and components such as snaps, screws, tongue and groove, peg and hole, magnets and the like allowing for ease of interchangeability.

In accordance with an exemplary embodiment of the claimed invention, the EFM 1510 can further comprise an accessory/charging station 1590 configured to store, attach, electrically/electronically connect the REM 1030 to the EFM 1510 allowing the EFM 1510 to utilize the components of REM 1030 such as the REM's cameras, sensors, power supply, drone components, power component, power conversion components, component battery, audio component, wireless transmitter, transmitter, antenna and the like, as well as, allowing the REM 1030 to utilize the components and features of the EFM 1510. The EFM accessory/charging station 1590 can be configured to move and rotate relative to the main airframe 1620 via rotating mechanical elements and features. Furthermore, the EFM housing 1620 and or the accessory/charging station 1590 can comprise motorized components and features 1570 including but not limited to a logic board, motors, electric motors, gears, sensors, servos and the like which can attach to the REM 1030 to allow for manual and/or autonomous control of the REM's position and angle relative to the EFM housing 1620. For example, 1) a user attaches the REM 1030 to the EFM 1510 and begins flight; and 2) utilizing the motorized components and features 1570, the user can rotate and angle the REM 1030 relative to the EFM housing 16320 allowing the REM 1030 to capture and record content from multiple angles and positions without having to change the EFM's flight path, position or angle. Furthermore, the motorized components and features 1570 can act as and/or be the accessory/charging station of the EFM 1510 and include electrical contacts, connectors and the like configured to electrically/electronically connect the REM 1030 to the EFM 1510 via the motorized components and features 1570. The EFM 1510 can also include navigation lights 1640 of various colors and configurations allowing for increased visibility of the EFM 1510 while in flight.

In accordance with an exemplary embodiment of the claimed invention, the EFM 1510 and/or the REM 1030 can comprise software, flight control software and the like to allow for manual/user-controlled flight and/or semi-autonomous flight and/or fully autonomous flight. The flight control software can be artificial intelligence software, machine learning software, real-time machine learning software, deep learning software, neural networks and the like. Furthermore, the EFM 1510 can be accessible remotely through an online/internet connection via remote external corresponding devices allowing for remote control of the EFM 1510 and access to the REM's and/or EFM's cameras and sensors via an online connection. The EFM's and/or REM's flight control software can allow for multiple navigation/flight path settings while simultaneously tracking a user. Such navigation/flight path settings can include but not be limited to: following or recording a user from a behind view, front view, side view, top view, bottom view orbit around a user and the like all relative to a user's position. These multiple navigation/flight path settings can function while in manual/user-controlled flight and/or semi-autonomous flight and/or fully autonomous flight while simultaneously avoiding obstacles, predicting a future flight path and/or tracking a user. The EFM 1510 and/or REM 1030 can be controlled and navigated by at least one user via the user's physical movement and items such as but not limited to: gestures, hand gestures, facial recognition, movement of user extremities, objects which a user can wear or hold and the like. The EFM's and/or REM's flight control software and/or cameras sensors can be configured to recognize, track and react to the physical movement and items held by of a user and thereby make the appropriate navigation and/or flight path adjustments. Furthermore, a user can custom program and/or create default navigation protocols to the EFM's and/or REM's flight control software and/or cameras sensors to recognize, track and react to specific predetermined physical movements chosen by the user. For example, a user can program the EFM's and/or REM's flight control software and/or cameras and sensors to recognize a waving hand as the signal to begin recording video and/or create a flight path which follows the user from behind.

Furthermore, during flight the REM 1030 and/or the EFM 1510 can utilize tracking transmitters and/or sensors 1560 which can be configured to identify the location of and/or connect/pair with transmitters and/or sensors of at least one user via the multipurpose accessory and storage system 1000 and/or handheld electronic device 100 and/or an electronic watch 100 and/or tracking device 100 and the like enabling the REM 1030 and/or the EFM 1510 to track the position/location of a user holding/wearing the multipurpose accessory and storage system 1000 and/or the handheld electronic device 100 and/or an electronic watch 100 and/or tracking device 100 and the like. The EFM 1510 can include landing and/or take-off assist components such as retractable and/or fixed landing gear/struts/legs and the like which can be configured to allow the EFM 1510 to take-off and/or land in a controlled and specific orientation. The landing and/or take-off assist components can further comprise retraction components such as motors, springs, pistons, telescopic components, telescopic shafts, hydraulics, gears, pins/rods, hinges and the like to allow for compact storage and retraction of the landing and/or take-off assist components. Furthermore, the storage and/or retraction of the landing and/or take-off assist components can be configured to be controlled by software of the EFM 1510 and/or the REM 1030 for automatic storage and/or retraction upon take-off and during landing. Alternatively, the storage and/or retraction of the landing and/or take-off assist components can be manually controlled by a user via a user interface of the handheld electronic device, storage system housing and/or external device. The software, components, cameras, tracking transmitters and/or sensors of the EFM 1510 and/or the REM 1030 can control and/or communicate with multiple EFMs. For example, the EFM 1510 and/or the REM 1030 directs and/or communicates with additional/other EFMs and/or REMs to enable coordinated and organized flight, control and/or navigation of multiple the EFMs and/or REMs.

In accordance with an exemplary embodiment of the claimed invention, the EFM 1510 comprises dampening components and features to allow for the control and mitigation of vibration and physical disturbances caused by the EFM's rotors, motors and other flight components and/or atmospheric/flight conditions. These vibrations and physical disturbances may affect the quality and functions of the cameras and sensors of the EFM 1510 and/or the REM 1030. The dampening components and features can help reduce and/or remove the effects of these vibrations and physical disturbances by providing a protective barrier between the disturbances and the cameras and sensors of the EFM 1510 and/or the REM 1030 to absorb the vibrations and physical disturbances before they can affect the functions of the cameras and sensors. The dampening components and features can include rubber materials and components, clastic materials and component, flexible materials and components, rubber like materials and components, thermoplastic elastomers (TPE), thermoplastic polyurethane (TPU), rubber bands, springs, compressible foam, piston, vibration absorbing material and the like.

The EFM 1510 can be configured to accept a power/data cable and/or tether which can allow for a hard-wired electrical connection that facilitates the transition of power and/or data between the EFM 1510 and the REM 1030, the multipurpose accessory and storage system 1000, the docking station 1370, the handheld electronic device 100 or any other external power/data emitting corresponding device. For example, the power/data cable can be connected to a port located on the EFM 1510 and/or the REM 1030 and connect to a corresponding port 1130 located on the multipurpose accessory and storage system housing 1010, thereby allowing the EFM 1510 and/or the REM 1030 to utilize the power source 1040 of the multipurpose accessory and storage system 1000, thereby extending the EFM's and/or REM's power supply 1630, 1320 and ability to capture images and/or data. Alternatively, the power/data cable can connect the EFM 1510 and/or the REM 1030 to an outside perpetual power source (such as a wall socket and/or intermediary device such as the docking station 1370). This outside perpetual power source can allow for continuous power and/or data transfer to the components and features of the EFM 1510 and/or the REM 1030, thereby enabling perpetual flight and image/data capture of the EFM 1510 and/or the REM 1030.

The EFM 1510 can be configured to function with the docking station 1370 to utilize the components and features of the docking station 1370 such as power, data, signal transfer components. For example, while stored in or docked to the docking station 1370, the EFM 1510 can charge its power supply and connect to a user and/or access an online connection. The EFM 1510 and the docking station 1370 can include docketing features and components including but not limited to: locks, magnets, snaps, hooks and the like to allow for automated and predetermined positioning/placing/docketing of the EFM 1510 on the docketing station 1370 during take-off and/or landing. The docketing features and components can allow the EFM 1510 to automatically take-off into flight and/or detach from the docking station 1370 without the need for a user to manually detach the EFM 1510 from the docking station 1370. Furthermore, the EFM 1510 can be configured to automatically land on and/or re-attached itself to the docking station 1370 after a flight without the need for a user to manually re-attach the EFM 1510 to the docking station 1370.

The EFM 1510 can comprise inductive and/or other wireless charging components and features such as an inductive coupling feature, a battery, a capacitor, a super capacitor, induction chargers, induction coil, power transmitting coil, power inverter, power converter an electronic transmitter or electronic receiver and the like to allow for the transmission of wireless energy between the EFM 1510 and external devices, such as the REM 1030, the docking station 1370, the multipurpose accessory and storage system 1000, as well as any external electronic device which is capable of receiving wireless energy.

The EFM 1510 and/or the REM 1030 can utilize flight software and hardware such as visual simultaneous localization and mapping (Visual SLAM and/or SLAM) to allow for the EFM 1510 and/or the REM 1030 to construct and map an environment thereby allowing for controlled and safe flight while simultaneously avoiding obstacles and/or tracking a user. For example, EFM's and/or REM's cameras and sensors can utilize SLAM features and sensors (and the like) to semi-autonomously, autonomously and/or manually be situationally aware of its environment, surroundings, obstacles, flight path, projected flight path, speed, telemetry etc. and the like while autonomously tracking a user wearing the tracking transmitters and/or sensors and/or via cameras, sensors and software. The EFM 1510 and/or the REM 1030 can utilize flight path planning/prediction software which allows for prediction of future flight path, obstacles, environmental/atmospheric conditions, user position and the like for optimal video/data capturing and/or safe and controlled flight. Furthermore, the flight path planning/prediction software can function with the EFM's and/or REM's hardware to control components and features such as the rotor speeds, gimble angle, REM angle and the like.

Figure 9:
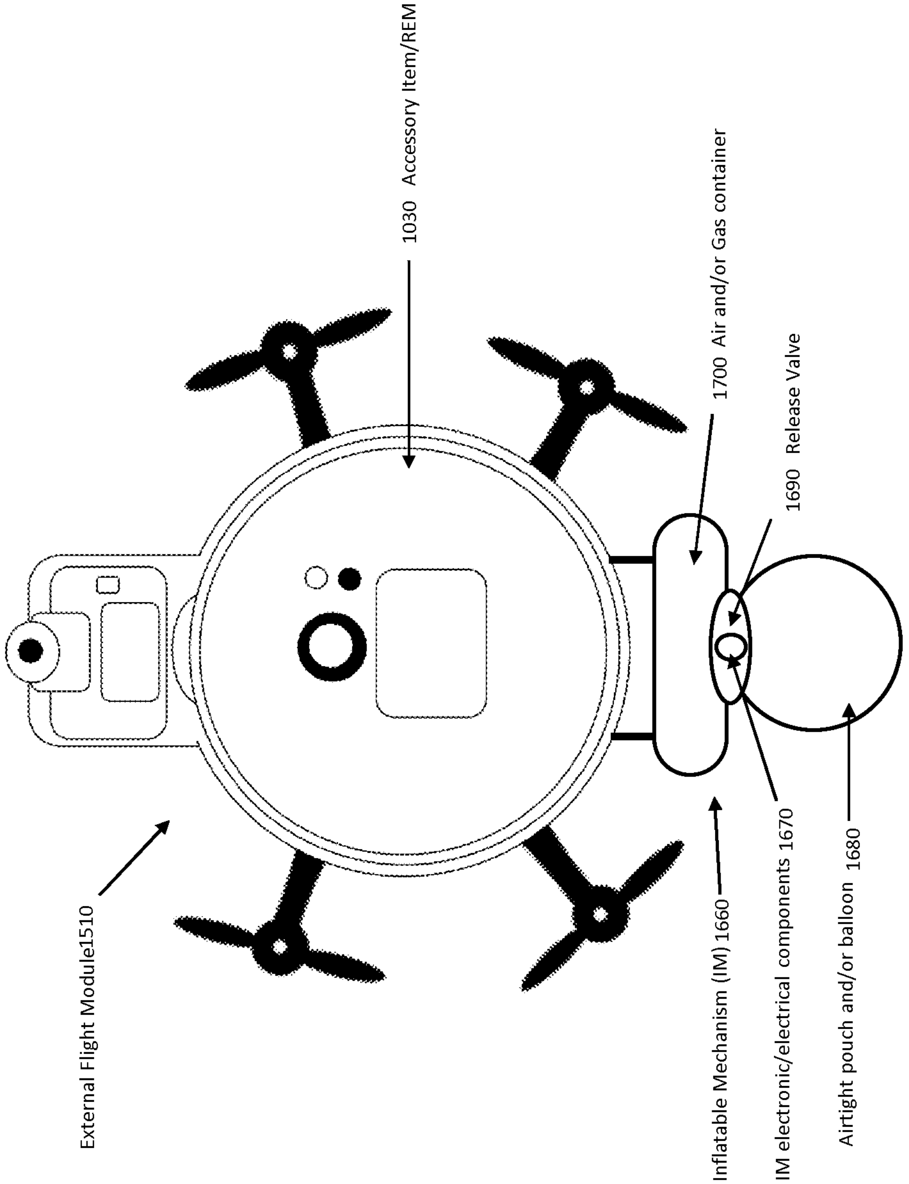
FIG. 9 is a view of the REM with the inflatable mechanism of the external flight module in accordance with an exemplary embodiment of the claimed invention.

In accordance with an exemplary embodiment of the claimed invention, as shown in FIG. 9, the EFM 1510 can further comprise at least one inflatable mechanism 1660 configured to deploy and/or inflate an air tight pouch or balloon 1680 with air and/or a gas if the EFM 1510 makes contact with water and/or liquid or if the EFM 1510 is about to make contact with water and/or liquid thereby providing buoyancy to the EFM 1510 and/or the REM 1030. The inflatable mechanism 1660 can comprise at least one air and/or gas container 1700 that can be configured to store and deploy compressed air and/or gas via a release valve 1690 located between the air and/or gas container 1700 and the inflatable pouch and/or balloon 1680. The inflatable mechanism 1660 can comprise sensors configured to detect if collision with water is inevitable or if a collision with water has occurred. The inflatable mechanism 1660 can be configured with a waterproof/airtight housing and further comprise electronic and electrical components 1670 including but not limited to; a power supply, logic board, sensors, cameras transmitters, antennas, lights and the like. The inflatable mechanism's electronic and electrical components 1670 can be configured to activate, send and/or receive signals and/or data from and to the REM 1030, the multipurpose accessory and storage system 1000, the handheld electronic device 100 and/or corresponding device allowing for a user to track the location as well as provide a system status of the EFM 1510 upon making contact with water or if the EFM 1510 is about to make contact with water.

Figure 8:
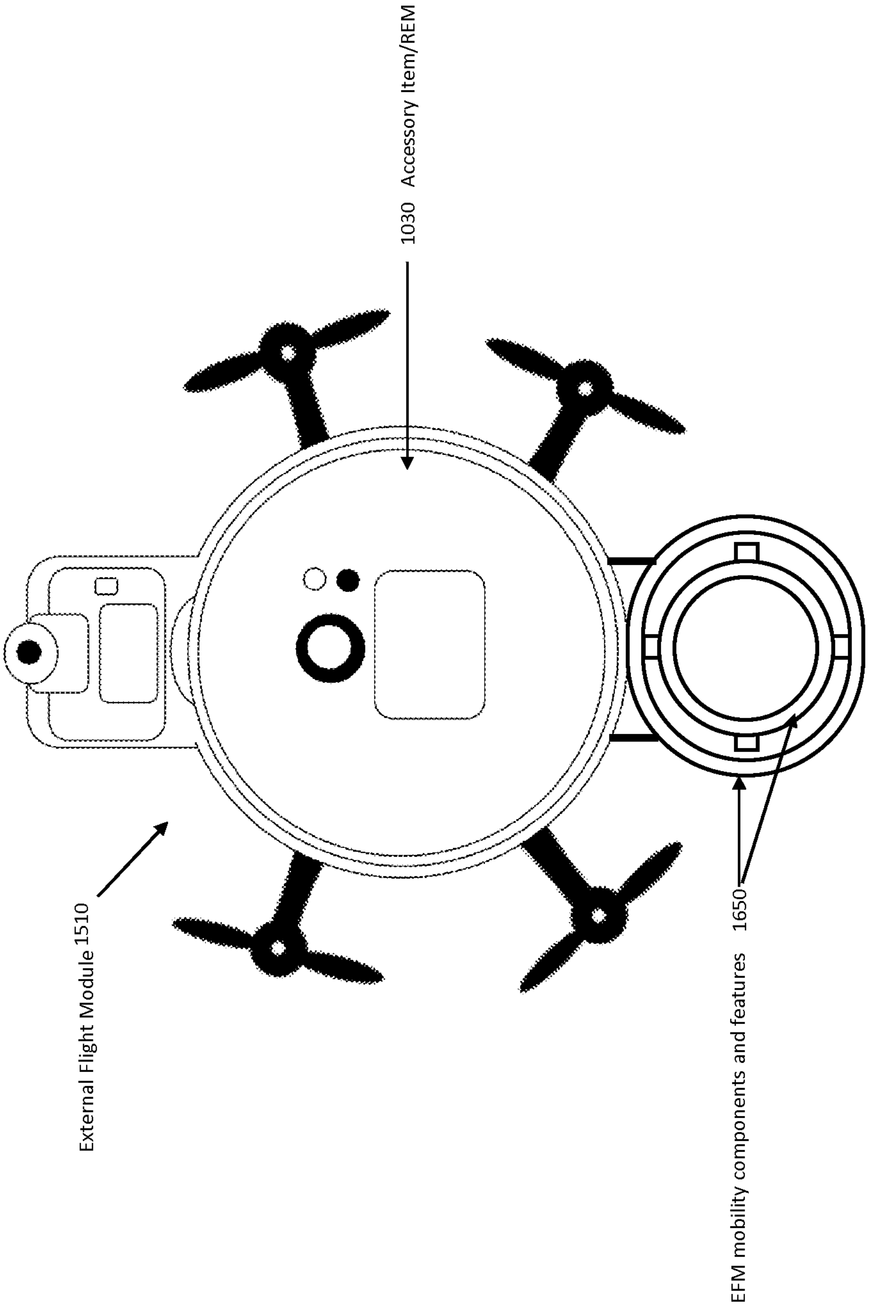
FIG. 8 is a view of the REM with the mobility components of the external flight module in accordance with an exemplary embodiment of the claimed invention.

In accordance with an exemplary embodiment of the claimed invention, as shown in FIG. 8, the EFM 1510 can further comprise mobility components and features 1650 such as motors, electric motors, pulleys, wheels, tracks, wheel-tracks, spheres, rotatable balls, ball bearing, ball and socket and the like which can allow the EFM 1510 to travel, navigate, rotate in fixed and/or omnidirectional manner while grounded/not in flight. The EFM 1510 can allow for a user to manually control the mobility components and features 1650 from a remote location via the REM 1030, the multipurpose accessory and storage system 1000, the handheld electronic device 100 and/or external corresponding devices. Alternatively, the EFM 1510 can utilize software to allow for semi-autonomous and/or autonomous control of the mobility components and features 1650. Furthermore, the REM's and/or EFM's software, cameras and sensors can support functions and features of the mobility components 1650 to allow the EFM 1510 to navigate, travel, rotate in a controlled and safe manner. For example, the EFM's and/or REM's cameras and sensors can utilize SLAM features and sensors (and the like) to allow the EFM 1510 and/or the REM 1030 to construct and map an environment and allow for movement/navigation across an environment (such as a tabletop) and enable the EFM 1510 to be situationally aware of its environment, a user's location, surroundings, obstacles, speed, telemetry etc. and the like. For example, SLAM (or the like) can identify the tabletop's edge and prevent the EFM 1510 from falling off the edge. Furthermore, SLAM (or the like) can allow for safe, autonomous and/or manual navigation of the EFM 1510. Furthermore, the EFM 1510 can utilize planning/prediction software which allows for prediction of future travel path, obstacles, environmental/atmospheric conditions, user position and the like for optimal video/data capturing and/or safe and controlled movement. Furthermore, the planning/prediction software can function with the EFM's mobility components and features 1650 to control components including but not limited to as the motors, wheels, tracks, REM/camera/sensor angle and the like.

Figure 10:
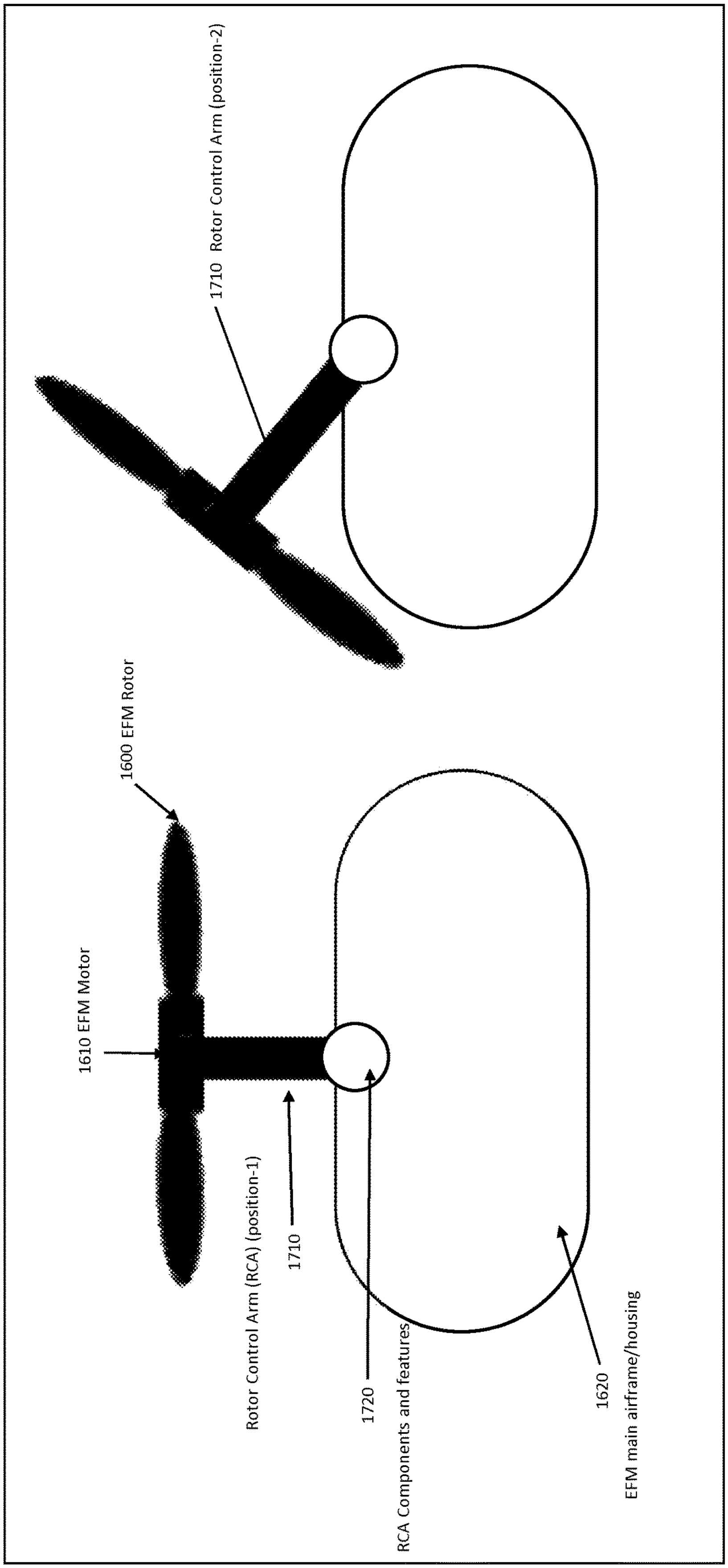
FIG. 10 is a view of the rotor control arm of the external flight module in accordance with an exemplary embodiment of the claimed invention.

In accordance with an exemplary embodiment of the claimed invention, as shown in FIG. 10, the EFM 1510 can further comprise at least one rotor control arm (RCA) 1710 configured to move and rotate at least one rotor 1600, motor 1610, and their corresponding support arm/structure and components relative to the EFM's main airframe/housing 1620 and/or the REM 1030, thereby allowing for a variety of flight patterns, optimized agility, optimized reaction time during obstacle collision avoidance and/or user tracking protocols and/or optimized flight control and navigation. The RCA 1710 can connect to the EFM's main airframe 1620 via mechanical components and features 1720 to enable the RCA 1710 to move and rotate relative to the main airframe 1620 and/or the REM 1030. These RCA components and features 1720 can comprise but not be limited to: a logic board, software, motors, electric motors, gears, sensors, cameras, servos, springs, rubber bands, axel rods and shafting, pivot pins, ball and socket, groove and track and the like. The RCA 1710 can move and rotate relative to the REM's position and angle to allow for immediate flight path modifications while simultaneously allowing the REM 1030 to maintain its position and angle during the flight path modifications. The RCA 1710 and its mechanical components and features 1720 can be configured to connect to and function with the software, navigation/flight control software of the EFM and/or REM allowing for the RCA 1710 to react to and assist in scenarios including but not limited to: prediction of future flight path, obstacle avoidance, flight adjustments based on environmental/atmospheric conditions, user position/tracking and the like, semi-autonomous, fully autonomous and/or manually flight control, for optimal video/data capturing and/or safe and controlled flight.

Housing Detail:

The REM housing 1230, the multipurpose accessory and storage system housing 1010, the docking station housing 1460 and/or the EFM housing 1620 (the devices 1000, 1030, 1370, 1510) can be configured to protect against various atmospheric and environmental conditions/situations, be fire proof, heat resistant, waterproof, water resistant, shock resistant, dustproof or airproof and allow for various levels of drop/impact protection. The REM housing 1230 can comprise a removable or permanent sealing element, such as a gasket, rubber edge, tubing, TPE, flush compressed surfaces, adhesive, molding, clastic material, compressible foam, a combination of compressible foam and rubber material and the like to create a hermetic, airtight, waterproof, weatherproof seal or bond between the one more housing parts or component which comprise the devices. The removable or permanent sealing element can protect the devices internal electronic and electrical components from damage, such as water, any liquid, moisture, air, dirt, snow, mud, rain, dust, debris and the like.

The REM housing 1230, the multipurpose accessory and storage system housing 1010, the docking station housing 1460 and/or the EFM housing 1620 (the devices 1000, 1030, 1370, 1510) can be comprised of one or more protective housing parts or components that can mechanically combine to form the housing. The housing can be configured to protect internal components including but not limited to: PCB/logic board, data and/or power components and the like. These one or more housing parts or components can include but are not limited to: snaps, screws, tongue and groove, peg and hole, girders, hooks and washers, perforated material, perforated strips, perforated girders, perforated supports, magnets, axel rods and shafting, adhesive, material with adhesive qualities, glue and the like. The protective housing of the REM 1030, the multipurpose accessory and storage system 1000, the docking station 1370 and/or the EFM 1510 can include one or more panels and/or removable panels that can be secured, in and/or on one or more areas of the housing. The one or more panels and/or removable panels can be secured to the housing by methods such as but not limited to: screws, glue, magnets, adhesive, ultrasonic welding, mechanical snaps/locking geometries and the like. The panels and/or removable panels can be configured to store and/or enclose and/or protect components of the devices as well as connect their housing parts. The device's housings can include at least one storage chamber configured to store and/or enclose and/or protect components of the devices. The storage chamber can be formed between the one or more panels and/or removable panels and the protective housing parts. The housing parts or components can be made from a variety of materials including but not limited to: metal, aluminum, carbon fiber, rubber, plastic, ceramic, glass, crystal, sapphire crystal or the like. The housings can be configured in a variety of shapes and sizes including but not limited to cylinder, square, square with rounded edges, tubular, round, rectangular, rectangular with rounded edges and other shapes and sizes. The housings can include various ports, contacts, transmitters, and/or receivers to allow for electrical and/or electronic connections with corresponding devices. For example, the ports or contacts can allow an electrical connection mate with a corresponding plug or contact to allow for the transition of power and data between the REM 1030, the multipurpose accessory and storage system 1000, the docking station 1370, the external flight module 1510 and/or the handheld electronic device 100. Furthermore, the ports or contacts can be used to connect various electronic accessories and/or support devices to the REM 1030, the multipurpose accessory and storage system 1000, the docking station 1370 and/or the EFM 1510.

The REM housing 1230, the multipurpose accessory and storage system housing 1010, the docking station housing 1460 and/or the EFM housing 1620 (the devices 1000, 1030, 1370, 1510) can include at least one removable module port such as but not limited to: ports, openings, channels, slots and the like configured to receive external modular components such as but not limited to: a power supply, cameras, sensors, memory, signal transmitters, adapters, illumination components, a stand, securing/mounting systems, adapters, connectors and the like. The removable module port can allow for the addition and/or interchangeability of components and features that enhance and optimize the capabilities of the devices. The removable module port can include electrical contacts, wireless power transfer components and the like allowing for electrical and/or electronic connections between the external modular components and other electronic components and features of the devices. For example, the removable module port can allow a user to connect specialized components and/or sensors to the devices that can enhance the device's functional capabilities such as a plug-in IR sensor to allow for night/thermal vision capabilities that would otherwise not be included as an inherent feature of the device. The removable module port can include securing features and components configured to secure the external modular components to the devices such as but not limited to: mechanical snaps/locking geometries and the like, snaps, screws, tongue and groove, peg and hole, hooks, washers, magnets, adhesive, material with adhesive qualities and the like.

Figure 11:
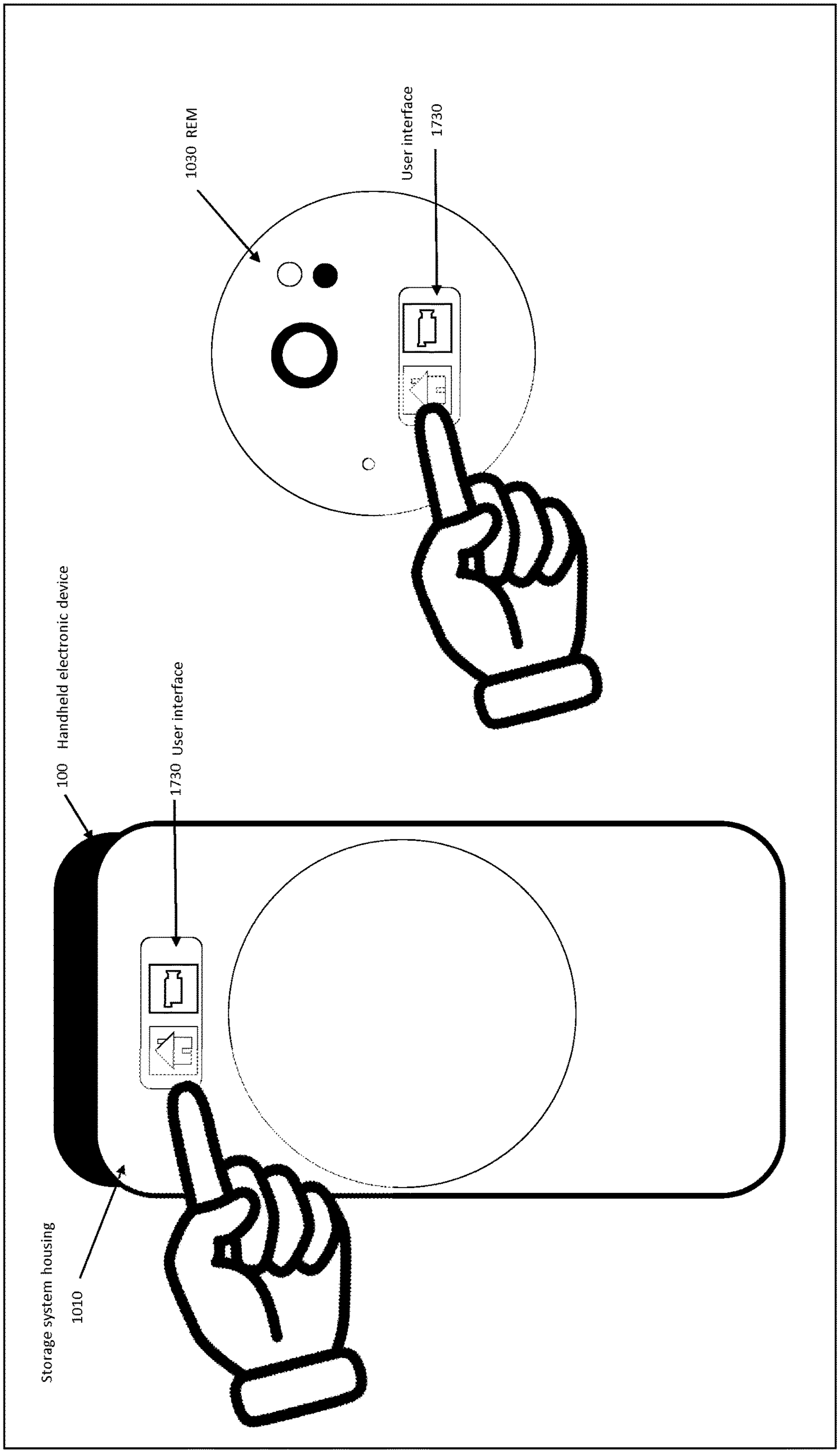
FIG. 11 is a view of the user interface on the housing of the REM and on the housing the multipurpose accessory and storage system in accordance with an exemplary embodiment of the claimed invention.

Electronic User Interface:

In accordance with an exemplary embodiment of the claimed invention, as shown in FIG. 11, the REM housing 1230, the multipurpose accessory and storage system housing 1010, the docking station 1370 and/or EFM 1510 (the devices) can comprise at least one electronic user interface 1730, such as, but not limited to: a touch display, button, dial, switch, gesture recognition sensor, facial recognition sensor, biometric recognition sensor and/or software or the like. The electronic user interface 1730 can be configured to control, activate, deactivate, program features of the devices including but not limited to powering on or off, activating/deactivating sensors, activating/deactivating antennas, activating/deactivating receivers, activating/deactivating cameras, capturing video or photos, focusing, zooming, aperture settings, exposure settings, lens control, ISO settings, flight control, movement/direction control, WIFI®/Bluetooth®/wireless signal pairing, activating/deactivating internet/online connections and the like.

Display Options:

In accordance with an exemplary embodiment of the claimed invention, as shown in FIG. 13, the REM 1030, the multiple accessory and storage system 1000, the docking station 1370 and/or the EFM 1510 (the devices) can be configured to function as or with a display/optical display 1340. The display 1340 can be external/distinct from the devices and/or embedded on the device's housing and can be configured to display the subject matter/data being captured by one or more of the components and features of the devices. The display can be configured to control, activate or deactivate the components and features of the devices. The display 1340 can be the display of the handheld electronic device 100, the storage system housing, the REM 1030, the docking station 1370, the EFM 1510, liquid crystal (LCD) display, light-emitting diode (LED) display, organic LED (OLED) display, touchscreen display, flexible digital display, graphical user interface, flexible display, bendable digital display, augmented reality display, mixed reality display, optical sensor, eyeglass lens, optical lens, lens, glasses, wearable optical lens, wearable electronic lens, digital contact lens.

As exemplary shown in FIG. 3, the REM 1030, the multiple accessory and storage system 1000, the docking station 1370 and/or the EFM 1510 can comprise a digital assistant display 1330 which can be dedicated to an intelligent digital assistant (IDA) allowing a user to interface and interact with a physical representation of the IDA. For example, the assistant display 1330 can allow for the IDA to visually communicate, showcase and/or present instructions, feedback, information, data/feeds from sensors/cameras, emotion and/or its "state of mind/being" and the like to a user via imagery and/or content shown on the assistant display 1330. Furthermore, the IDA can access the speakers and microphones of the REM 1030, the multipurpose accessory and storage system 1000, the docking station 1370 and/or the EFM 1510 to audibly communicate, showcase and/or present instructions, feedback, information, data/feeds from sensors/cameras emotion and/or its 'state of mind/being' and the like to a user via the speakers and microphones.

As exemplary shown in FIG. 13, a flexible digital display 1340 can be configured to mount on or in the REM housing 1230, the multipurpose accessory and storage system housing 1010, the docking station housing 1460 and/or the EFM housing 1620. The flexible digital display 1340 can be manufactured from flexible or stretchable digital display material such as but not limited to, flexible glass, flexible plastic, flexible metal, flexible substrate, flexible OLED, LED/LCD material and the like. The flexible digital display can enable folding, bending and/or stretching of the flexible digital display which can allow for compact storing of a display. For example, the REM 1030 can comprise a flexible digital display 1340 and be secured in the accessory station 1020 of the multipurpose accessory and storage system 1000. The flexible digital display 1340 can be compactly and tightly folded or wrapped around or in the REM housing 1230 to allow compact/low profile storage of the REM 1030 while stored within the multipurpose accessory and storage system 1000. When the REM 1030 is removed from the accessory station 1020 of the multipurpose accessory and storage system 1000 for use, the flexible digital display 1340 can unfold/open into a larger display. The display 1340 can be configured in a variety of shapes and sizes including but not limited to cylinder, square, round or rectangular shapes.

Software, Components and Features:

In accordance with an exemplary embodiment of the claimed invention, the REM 1030, the multipurpose accessory and storage system 1000, the docking station 1370 and/or the EFM 1510 can be configured to include components of and/or function as or with any of the following; a camera, a sensor system, a camera and sensor System, IDA, flight assistant, navigation system, augmented reality software and hardware, nixed reality software and hardware, audio device, headphones, hearing aid, power device, power supply, virtual reality software and hardware, spatial computing software and hardware, drone software and hardware, micro air vehicle, micro drone, UAV software and hardware, software which is proprietary to the REM, artificial intelligence software, machine learning software, real-time machine learning software, deep learning software, neural networks, artificial neural networks, deep neural networks, convolutional neural networks and the like.

The software (e.g., artificial intelligence (AI) software, machine learning software, deep learning software, etc.) can be software, which is proprietary to the REM 1030, the multipurpose accessory and storage system 1000, the docking station 1370, the EFM 1510 and/or the handheld electronic device 100 and/or third-party software. The software may organize, analyze, interpret and/or provide digital feedback to a user and/or camera and/or sensor mounted on the REM 1030, the multipurpose accessory and storage system 1000, the docking station 1370, the EFM 1510, the handheld electronic device 100, external storage medium and/or device. For example, the digital feedback/data provided by the software can include but not be limited to: digital reconstructions and analysis of objects, people, physical areas, surface areas, physical items and the like; spatial area and object recognition and/or identification, facial recognition and/or identification, biometric recognition and/or identification, iris/retinal recognition and/or identification liquid matter recognition and/or identification, flight control, navigation data, autonomous flight control, semi-autonomous flight control, organic matter recognition and/or identification; speed, distance and temperature recognition and information; human or animal vital sign recognition and/or identification; sound recognition and/or identification and the like.

The REM 1030, the multipurpose accessory and storage system 1000, the docking station 1370 and/or the EFM 1510 (the devices 1000, 1030, 1370, 1510) may contain IDA software and hardware such as but not limited to; intelligent personal assistant and/or interactive virtual assistant and/or intelligent automated assistant and/or intelligent virtual assistant and/or intelligent agent and/or artificial intelligence (AI) personal assistant and/or AI or virtual assistant, and/or flight assistant and the like. The IDA can provide the REM 1030, the multipurpose accessory and storage system 1000, the docking station 1370 and/or the EFM 1510 (the devices) a capacity for learning, reasoning and understanding of conditions and/or situations such as but not limited to; interactions/communication with users, interactions with its environment, data of its environment, real-time navigation, future navigation and the like. The IDA can be cloud based and/or stored locally on a chip/memory of the devices. The IDA can be configured to provide information and/or execute tasks and/or services autonomously and/or on behalf of a user/individual on a combination of user input, location awareness, situational awareness and the ability to access information from a variety of online sources as well as access information from various cameras and sensors. The IDA can be configured for natural language processing and/or visual and/or speech recognition platforms for optimal communication with at least one user/individual. The IDA can be configured to execute tasks such as but not limited to: taking dictation, reading texts or emails aloud, playing back messages, looking up contact information, placing phone calls, reminding user about appointments/calendar events, capture images/videos, scan environments, place online orders for items including but not limited to: food, products, services and the like, relaying weather information, stock information, news information and the like. The IDA can be an artificially intelligent program capable of autonomous action based upon user feedback/needs. Alternatively, the IDA's autonomous actions can be based upon situational awareness scenarios. For example, a situational awareness scenario can be following:

1. the REM 1030 and the docking station 1370 comprising the IDA can be alone in a room (no humans present);
2. a foreign entity such as a bird enters the room via an open window and into the view of the REM 1030 and IDA;
3. motion and/or sound detectors located on the REM 1030 and/or the docking station 1370 can alert the IDA to the presence of the bird;
4. the IDA can then autonomously access and control the features of the REM 1030 and the docking station 1370 such as the cameras and sensors, mobility components and features and begin to capture audio, video and data of the bird as well as navigate and rotate the docking station 1370 for optimal viewing of the bird; and
5. The IDA can then alert a user via message and/or live video/audio feed of the content it is capturing.

Alternatively, other foreign entities which the IDA can autonomously engage, control and/or monitor and alert a user to, can include but not be limited to: people, pets, plants, lighting, thermostats, heaters, appliances, faucets, hazardous materials/scenarios such as fires/chemicals/smoke/gas and the like.

The REM 1030, the multipurpose accessory and storage system 1000, the docking station 1370 and/or the EFM 1510 (the devices 1000, 1030, 1370, 1510) can include components and features including but not limited to: wireless camera, wireless camera module, camera module, digital camera, electronic camera, non-electronic camera, distance sensors, motion sensors, motion detectors microchip, integrated circuit (IC) chip, near field communication (NFC) chip, transistor, circuit board, electronic data storage device, ports for memory cards/memory device, wireless signal transmitter or antenna, headphone, hearing aid, video antenna, amplifier, antenna, WIFI module, WIFI antenna, ultraviolet (UV) sensor, UV scanner, cellular antenna, a radio transmitter, a laser, a laser emitting component, laser distance sensor, reflective infrared (IR) sensor, waveguide display, holographic waveguide display, image signal processor, battery, power adapter, power supply, capacitors, super capacitors, Infrared Blaster, night vision sensor and components, audio amplifier, global positioning system (GPS) hardware components and software, thermal imaging software and components, a temperature sensor, radar components and sensors, a thermometer, ambient light sensor, an electronic thermometer, infrared laser scanners, infrared sensor and components, various lens types and sizes, various lens filter types and sizes, lens filters, various mirrors types and sizes, various magnifying lens types and sizes, wide-angle lens, telephoto lens, magnets, magnets for removably storing the REM 1030 within the accessory station, magnets mounted on the REM 1030 to allow for the REM 1030 to be magnetically attached to ferrous material which is distinct from the multipurpose accessory and storage system housing 1010, capacitive touch sensors, light sensor, ambient light sensor, digital or analog image sensor, magnets for attaching various accessory items such as a charging cable or electronic module to the REM 1030 or the multipurpose accessory and storage system 1000, high resolution electronic sensors, electronic sensors, silicon wafer, flash, a digital memory, memory processor, LEDs, light emitting material, light bulb, image stabilizer components, reflectors, a microphone, beamforming microphone array, wireless charging or inductive charging components, drop sensors, stereo depth mapping software and hardware, navigation cameras, navigation software and hardware, biometric sensors, electrical contacts, electrical cable, a speaker, multiple lens types that allow for spherical video or photo capturing, 360° video or photo capturing and image/video stitching software and the like, signal amplifiers, contour and surface mapping sensors, stereoscopic sensors and the like, inertial measurement unit, accelerometers, gyroscopes, magnetometers, pressure sensors, temperature sensors, light sensors, collision avoidance sensors, biosensors, barometric altimeter, digital barometric altimeter, chemical sensors, load/torque sensors, position sensors, gesture recognition sensor and/or software, level sensor, flow sensor, drone or UAV components and features including but not limited to; propellers, rotors, flight and speed control components and sensors, gimble, camera gimble, gyros, motors, electric, motors, brushless motors, landing struts/bars, landing legs, navigation lights, gesture recognition sensor and/or software, airframe, fuselage, foldable fuselage components, foldable air frame components and the like. Additionally, it can include simultaneous localization and mapping (SLAM) features and sensors, light detection and ranging (LiDAR) sensors and components, LiDAR laser scanner, components and sensors that allow for the recording of audio, video, photographs, high definition (HD) video, 4k or 8k video, flood illuminator, proximity sensor, dot Projector, or the like.

Wireless Communication/Record Functionality:

The REM 1030, the multipurpose accessory and storage system 1000, the docking station 1370 and/or the EFM 1510 (the devices) can include wireless antennas/receivers configured to transmit data and create a wireless pair/connection with and between external devices such as: internet connected devices, the handheld electronic device 100, corresponding electronic devices and/or monitors/displays. The wireless pair/connection can allow for remote viewing of video/data being captured by the devices and/or control/operation of components and features including but not limited: recording video, photo capturing, transferring audio, data scanning, recording audio, flight control, navigation control, transferring data, recording data, powering on or off, focusing, zooming, aperture settings, exposure settings, lens control, light and flash, general settings, processors, chips, internal electronic components and the like. Video/audio/data feeds being captured/scanned by the devices can be accessible remotely through an online/internet connection. For example, user-1 can utilize an external device that is distinct from the REM 1030 to access an online/internet connection with the REM 1030, thereby observing video/data feed being captured by a user-2 using the REM 1030 at a location remote and distant from the user-1. Furthermore, the wireless pairing online/internet connection between the REM 1030 and an external device can allow for a user to send a signal (such as an audio signal) from an external device which is remote from the REM 1030 to the speaker 1200 of the REM 1030. The REM 1030 can further comprise a microphone 1260 configured to send audio signals back to the user allowing for remote audio communication using the REM 1030.

The software and/or hardware of the REM 1030, the multipurpose accessory and storage system 1000, the docking station 1370 and/or the EFM 1510 can be configured to simultaneously record streams of data/video/imagery with streams of data/video/imagery/telemetry being captured by the handheld electronic device 100. For example, a user engages a user interface of the handheld electronic device 100 (in this example a smartphone) and begins recording. At least one camera and/or sensor of the REM 1030, the multipurpose accessory and storage system 1000, the docking station 1370 and/or the EFM 1510 can activate and begin recording and/or scanning data/subject matter simultaneously upon the execution of the record action on the smartphone 100. This record function allows the user to simultaneously activate and combine the functionality of all (or some) of the cameras and sensors of the smartphone 100, the REM 1030, the multipurpose accessory and storage system 1000, the docking station 1370 and/or the EFM 1510 via a single user interface/button.

Figure 14:
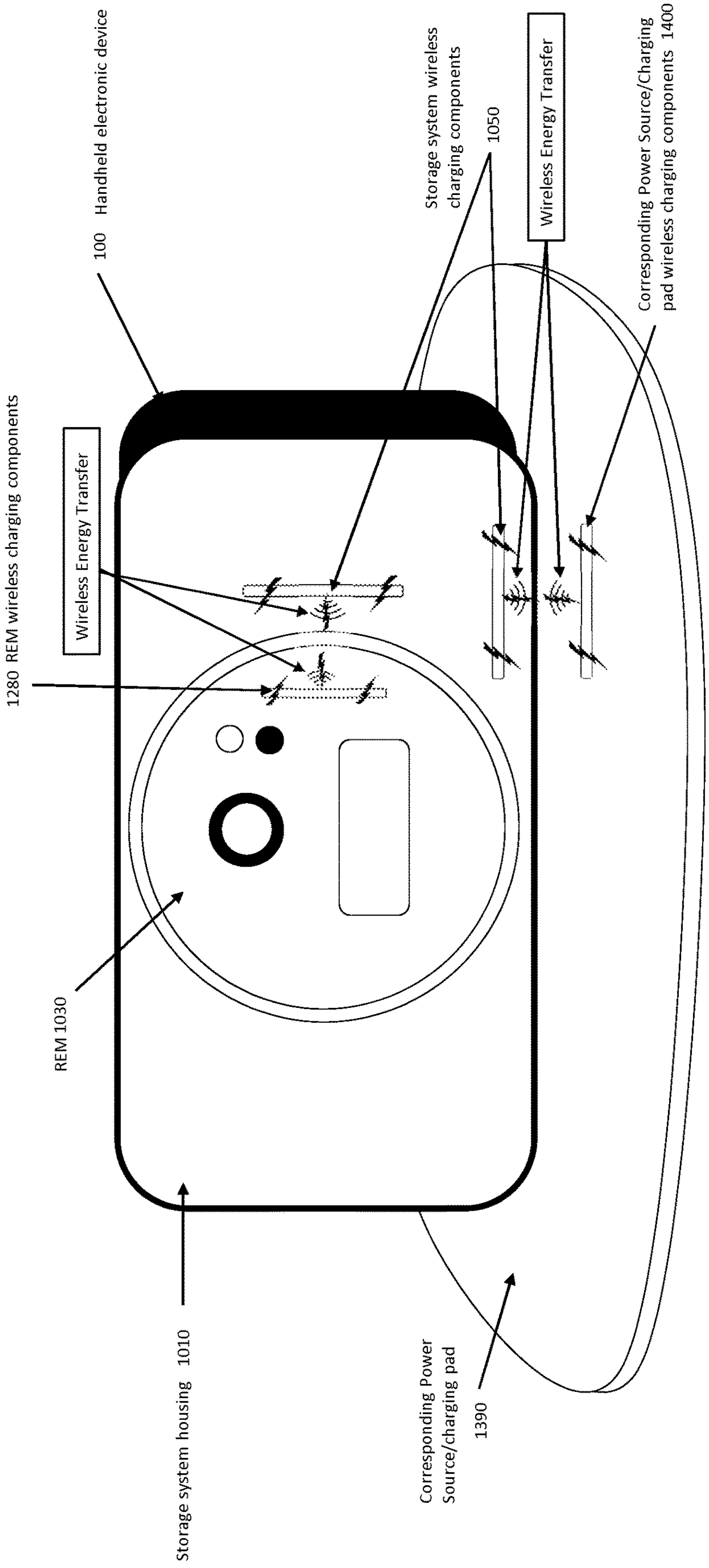
FIG. 14 is a view of the wireless energy transfer system in accordance with an exemplary embodiment of the claimed invention.
Figure 15:
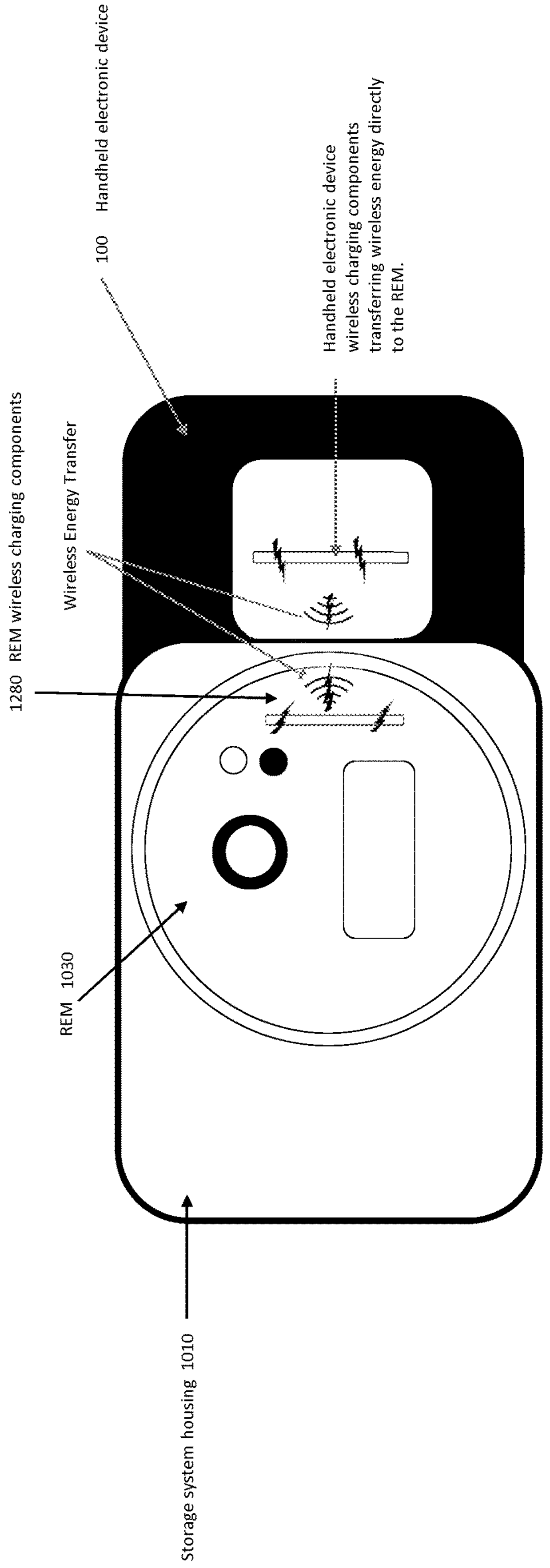
FIG. 15 illustrates the direct wireless energy transfer between the REM and the handheld electronic device in accordance with an exemplary embodiment of the claimed invention.

Induction/Wireless Charging Functionality and Features:

In accordance with an exemplary embodiment of the claimed invention, as shown in FIGS. 14-15, the REM 1030, the multipurpose accessory and storage system 1000, the docking station 1370 and/or the EFM 1510 (the devices) can comprise a wireless/inductive energy transfer system and components 1050, 1280, 1410 configured to inductively or wirelessly transfer power/energy between the REM 1030, the multipurpose accessory and storage system 1000, the docking station 1370, the EFM 1510, the handheld electronic device 100 and/or an independent/external device 1390, such as a wireless charging pad/station 1390. Alternatively, the wireless/inductive energy transfer system and components 1050, 1280, 1410, can allow for the transfer of wireless power/energy between the REM 1030, the multipurpose accessory and storage system 1000, the docking station 1370 and/or the EFM 1510 allowing for the devices to charge and transfer power to each other as well as to external devices such as an accessory item 1740 (FIG. 12).

The wireless/inductive energy transfer system 1050, 1280, 1410 can comprise at least one of the following wireless charging components: a circuit board, electronic chip, electronic processor, an inductive coupling feature, a battery, a capacitor, a super capacitor, induction chargers, induction coil, power transmitting coil, power inverter, power converter an electronic transmitter or electronic receiver, thermal protection sensor, wireless charging chipset configured to control the flow of electricity, LED charging indicator, foreign object detection circuit to prevent conductive materials from receiving power from the wireless/inductive energy transfer system, and the like. The wireless/inductive energy transfer system and components 1050, 1280, 1410 of the REM 1030, the multipurpose accessory and storage system 1000, the docking station 1370 and/or the EFM 1510 can be configured to utilize electromagnetic fields to wirelessly transfer energy from a power source located on the devices to a corresponding power source. For example, if the REM 1030 is stored within the charging station 1020 of the multipurpose accessory and storage system 1000, the wireless energy transfer system 1050, 1280 can be configured to wirelessly transfer power/energy from the multipurpose accessory and storage system 1000 to the REM 1030 stored within the charging station 1020 or to and from the handheld electronic device 100 and/or an independent/external device, such as a wireless charging pad/station 1390.

Furthermore, the wireless energy transfer system and components 1280 of the REM 1030, preferably, mounted within the REM housing 1230, can allow for the direct transfer of wireless energy/power from inductive/wireless charging and power components of the handheld electronic device 100 allowing for the direct wireless transfer of power/energy to the REM 1030 from the handheld electronic device 100 while the REM 1030 is stored within the accessory station 1020 of the multipurpose accessory and storage system 1000 or when placed in the effective range of the handheld electronic device's inductive/wireless charging and power components. For example, if the REM 1030 is an audio device, such as headphones, the headphones can be stored within the accessory station 1020 of the multipurpose accessory and storage system 1000.

Similar to the docketing station 1370, the REM 1030 and/or the multipurpose accessory and storage system 1000 can further comprise similar mobility components and features such as motors, electric motors, pulleys, wheels, tracks, wheel-tracks, spheres, rotatable balls, ball bearing, ball and socket and the like which can allow for the REM 1030 and/or the multipurpose accessory and storage system 1000 to travel, navigate, rotate in fixed and/or omnidirectional manner on any given surface. The REM 1030 and/or the multipurpose accessory and storage system 1000 can allow for a user to manually control the mobility components and features from a remote location via the REM 1030 and/or the multipurpose accessory and storage system 1000, the handheld electronic device 100 and/or external corresponding devices. Alternatively, the REM 1030 and/or the multipurpose accessory and storage system 1000 can utilize software to allow for semi-autonomous and/or autonomous control of the mobility components and features. Furthermore, the software, cameras and sensors of the REM 1030 and/or the multipurpose accessory and storage system 1000 can support functions and features of the mobility components to allow for the REM 1030 and/or the multipurpose accessory and storage system 1000 to navigate, travel, rotate in a controlled and safe manner. For example, the cameras and sensors of the REM 1030 and/or the multipurpose accessory and storage system 1000 can utilize SLAM features and sensors (and the like) to allow for the REM 1030 and/or the multipurpose accessory and storage system 1000 to construct and map an environment and allow for movement/navigation across an environment (such as a tabletop) and enable the REM 1030 and/or the multipurpose accessory and storage system 1000 to be situationally aware of its environment, a user's location, surroundings, obstacles, speed, telemetry etc. and the like. For example, SLAM (or the like) can identify the tabletop's edge and prevent the REM 1030 and/or the multipurpose accessory and storage system 1000 from falling off the edge. Furthermore, SLAM (or the like) can allow for safe, autonomous and/or manual navigation of the REM 1030 and/or the multipurpose accessory and storage system 1000. Furthermore, the REM 1030 and/or the multipurpose accessory and storage system 1000 can utilize planning/prediction software which allows for prediction of future travel path, obstacles, AR Functionality:

The software and hardware of the REM 1030 and/or the multipurpose accessory and storage system 1000, the docketing station 1370 and/or the EFM 1510 can be configured to function with and/or create digital objects, things and sounds utilizing software including but not limited to: augmented reality (AR) software, mixed reality (MR) software and the like. The software can be proprietary to the REM 1030 and/or the multipurpose accessory and storage system 1000, the docketing station 1370 and/or the EFM 1510 and/or the handheld electronic device 100, $3^{rd}$ party software, artificial intelligence software and/or machine/deep learning software and the like. For example, a user can utilize the cameras and sensors of the REM 1030 and/or the multipurpose accessory and storage system 1000, the docketing station 1370 and/or the EFM 1510 (the devices 1000, 1030, 1370, 1510) to capture, scan and analyze items/objects, walls and floors of a room. The AR software can then overlay and integrate digitally created objects, things and sounds over the imagery/content/space being captured/scanned by the devices. The user can then view and interact with the digital objects and sounds on the displays of the devices 1000, 1030, 1370, 1510 and/or the handheld electronic device and/or the display of an AR/MR enabled device such as an AR headset.

Furthermore, the cameras and sensors of the REM 1030 and/or the multipurpose accessory and storage system 1000, the docketing station 1370 and/or the EFM 1510 can support, process and simultaneously integrate with the cameras and sensors of the handheld electronic device 100 and/or an external AR/MR device to allow for optimized AR experiences. For example, a user can utilize the REM 1030 and its cameras 1190 and sensors 1220 while the REM 1030 is stored within charging station 1020 of the multipurpose accessory and storage system 1000 which is attached to a handheld electronic device 100, such as a smartphone. This configuration allows for the cameras 1190 and sensors 1220 of the REM 1030 to capture the same subject matter as the cameras and sensors of the smartphone 100 simultaneously and from the same general angle/position. The REM 1030 (in this example) can comprise cameras 1190 and sensors 1220 which the smartphone 100 do not contain (such as thermal imaging cameras and sensors) and thereby optimize the user experience by merging the thermal imaging capability of the REM 1030 with the cameras and sensors of the smartphone 100 to create a unique user experience such as merging thermal imaging technology with an AR application/game allowing for a user to integrate the temperatures of areas/objects/things in a room with an AR application/game function such as identifying objects through temperature, size, shape.

In the current state, AR/MR systems and/or products with built-in cameras and sensors make it difficult for a user to interact with and engage augmented/digitally created objects. The REM 1030 and/or the multipurpose accessory and storage system 1000, the docketing station 1370 and/or the EFM 1510 (the devices 1000, 1030, 1370, 1510) can be configured to support $3^{rd}$ person AR/MR experiences including but not limited to $3^{rd}$ person views, angles, communication, recordings, navigation, data feeds, video feeds and the like of at least one user (the $3^{rd}$ person AR/MR capabilities). The devices 1000, 1030, 1370, 1510 can be configured to provide $3^{rd}$ person views of one or more users, objects and/or areas, allowing for a user and their surrounding area to be integrated within AR/MR content/experience and interact/engage with augmented/digitally created objects. The devices 1000, 1030, 1370, 1510 can be hardwired (directly connected) or wirelessly connected to an AR/MR enabled device such as a handheld electronic device (like a smartphone) and/or an external AR/MR device (like AR/MR headsets/glasses) allowing for the transfer of content/data/subject matter being captured by the devices to the displays and/or hardware of the handheld electronic device and/or an external AR/MR device. The devices 1000, 1030, 1370, 1510 can be connected to an AR/MR device and/or the handheld electronic device 100 via an internet/online connection allowing for remote communication and/or control between the devices 1000, 1030, 1370, 1510 and the AR/MR device and/or the handheld electronic device 100. For example, a user can mount the REM in a room and place them self within the field of view (FOV) of the cameras and sensors of the REM. The user can then view their surrounding area on a display of a smartphone and/or an external AR/MR device and thereby be integrated into the AR experience while remaining within the FOV of the REM's cameras and sensors. The software of the AR/MR enabled device such as a smartphone and/or an external AR/MR headset and/or software of the REM, can then augment, integrate and/or overlay digital content on and/or around the user thereby immersing the user within the AR/MR content allowing the user to interact with and engage the AR/MR content. In another example, a user-1 can utilize the REM 1030 while attached to the EFM 1510 and configure the EFM 1510 to take flight to capture/scan user-1's body, face, person, and/or surrounding areas/objects and the like via the cameras and sensors of the REM 1030 and/or the EFM 1510 from fixed and/or multiple positions/angles during flight. A user-2 being located in a room/area distinct and remote from the user-1 and operating the AR/MR headset/glasses. Utilizing AR/MR software and via the cameras and sensors of the REM 1030 and/or the EFM 1510 and through an internet/online connection, the user-1 and/or their surrounding areas can be digitally augmented/overlaid within the AR/MR headset display of the user-2, thereby allowing user-1 to be virtually/digitally present within the same room/area as the user-2. This configuration can enable real-time and/or recorded communication, visibility, and/or interaction between at least two users that are remote and distant from each other. Furthermore, this real-time and/or recorded communication via the devices can be configured to relay the actual features of a user's face, body, movement, clothing, surrounding area/objects and the like to a corresponding user utilizing an AR enabled device. Alternatively, the real-time and/or recorded communication can be configured to function with AR/MR software to allow for digital overlays/reproductions/augments of a user's face, body, movement, clothing, surrounding area/objects and the like. For example, a digital overlay/reproduction/augment of a user can include avatar characters and the like, allowing for a user to be displayed/appear as an imaginative character and/or with objects such as but not limited to a cartoon seagull, octopus, unicorn, humanoid character and the like.

Other AR/MR capabilities of the REM 1030, the multipurpose accessory and storage system 1000, the docking station 1370 and/or the EFM 1510 can allow a user to scan/capture/record objects, things, products and the like and transfer/relay files, data and or a live or recorded feed of the objects to the display of an AR/MR enabled device of another user who is remote and distant. AR/MR software can be used to position/place the objects within a location designated by the user receiving the feed/data of the object. For example, the user-1 is a custom kitchen cabinet designer located in New Hampshire and the user-2 is a customer of the user-1 located in New York. The user-1 can utilize the REM 1030, the multipurpose accessory and storage system 1000, the docking station 1370 and/or the EFM 1510 to record and/or scan video and/or dimensional/surface data of the cabinets and send the recording/scan/data/files of the cabinets to the user-2 allowing the user-2 to view the cabinets through the display of AR/MR enabled device and place the cabinets directly in their future location within the home of user-2, thereby providing user-2 the ability to (virtually) view the cabinets in place before the cabinets leave the designers workshop in New Hampshire. Other objects/products capable of such relay between at least two users include but are not limited to products, paintings, artwork, vehicles, appliances, furniture, lighting, architectural plans and the like.

The REM 1030, the multipurpose accessory and storage system 1000, the docking station 1370, the EFM 1510, the handheld electronic device 100 and/or an external AR/MR device can be configured to support/program and electronically integrate with a multi-area, multi camera/sensor AR/MR experience. For example, the multi area/camera/sensor AR/MR experience can include the REM 1030 with cameras 1190 and sensors 1220 capturing/scanning subject matter in Arca-T which is remote and distant from a handheld electronic device 100 (in this example, a smartphone) and/or an external AR/MR device. The smartphone 100 and/or an external AR/MR device can be located in Area-R capturing/scanning subject matter distinct from the area/subject matter captured/scanned by the REM 1030 in Area-T. Using the smartphone's and/or an external AR/MR device's hardware/display and AR software, a user can interact with AR created content that is placed and located within of the field of view (FOV) of the smartphone's camera as well as interact with AR content observed within the FOV of the REM's cameras 1190 and sensors 1220 such that the AR software's available area to place and create AR content exponentially increases and expands with the integration of the additional cameras and sensors of the REM 1030. Furthermore, using the external display and/or features of an AR/MR enabled device such as the smartphone and/or an AR/MR headset, the user can switch video/data feeds between the feed of the smartphone's and/or AR/MR headset's cameras and sensors and the feed of the REM's cameras 1190, thereby enabling the user to view and interact with AR created content that is placed in both Arca-T and Arca-R without having to leave Arca-R. For example, a multi-area/multi-camera/sensor AR experience can comprise a handheld electronic device 100 located in Room-Y (in this example—a smartphone) and the REM 1030 comprising cameras 1190 and sensors 1220 and located within the charging station 1490 of the docking station 1370 (REM full configuration). The "REM full configuration" is located in Room-X and connected to an external power source, such that the external power source is powering the REM 1030 and the docking station 1370, allowing for perpetual power and/or operational use of the "REM Full Configuration." A user utilizing the smartphone's display can view and interact with an AR game (in this example, a "protect the planet from alien invaders" game). The user can move/travel to Room-X to build and place augmented/digitally created objects (in this example—planets to protect) within the FOV of the REM's and/or Docking Station's camera and sensors. The user can then move/travel back to Room-Y to build and place planets within the FOV of the smartphone. Alien invaders enter Room-Y prompting the user to begin a counter attack to protect the planet of Room-Y. Utilizing a wireless and/or wired connection between the REM full configuration and the smartphone, the user can utilize the smartphones display and switch to the video/data feed of the REM full configuration to check if alien invaders are attacking the planet located in Room-X. If the user identifies alien invaders attacking the Room-X planet, the user can engage/interact with/fight off the alien invaders remotely from Room-Y VIA the smartphone's display and REM's cameras/sensors 1190, 1220 then subsequently travel to Room-X to fend off the alien invaders from a first-person manner via the smartphone's display and camera. Alternatively, the user can be automatically alerted by the AR software if the planets of other rooms are being attacked.

In accordance with an exemplary embodiment of the claimed invention, the REM 1030, the multipurpose accessory and storage system 1000, the docking station 1370 and/or the EFM 1510 can comprise a magnetic tracking system configured determine the position, orientation, and/or any other relevant telemetry data associated with a corresponding controller which can support the functionality and features of the REM 1030, the multipurpose accessory and storage system 1000, digital display and/or the EFM 1510. The corresponding controller can allow for a user to engage/interact with augmented/digitally created sounds, objects and things that are generated by AR software and viewed through a digital display. The corresponding controller can be a hand, finger, arm, wearable/handheld controller, remote control, a wearable senor, a ring, necklace, the handheld electronic device, a smartphone, a wearable electronic ring, a watch, an electronic bracelet, an electronic glove, a finger sleeve or the like. The magnetic tracking system and the corresponding controller can comprise software and components such as magnetic and/or electromagnetic sensors and components, magnetic tracking components such as coils, copper coils, magnetic field sensors and sensors that are configured to measure the intensity of magnetic fields. The magnetic tracking system and/or corresponding controller can be configured to function with the REM 1030 and/or the external flight module 1510, allowing the REM 1030 and/or the external flight module 1510 to track the position and/or any other relevant telemetry data of a user who is being scanned/captured by the cameras 1190, 1530 and/or sensors 1220, 1560 of the REM 1030 and/or the external flight module 1510. For example, a user wearing a corresponding controller (such as a necklace) can be tracked by the external flight module 1510 and/or the REM 1030 while the external flight module 1510 is in flight. This can allow the external flight module 1510 and/or the REM 1030 to autonomously track, follow, record the user without relying solely on tracking software.

In this example, a user utilizes REM 1030 with AR software, the magnetic tracking system and the corresponding controller (in this example, an electronic ring). Using the REM 1030, the user capture/scans images/video/data of a room containing items such as a table, walls, floors and wherein the REM 1030 further utilizes contour mapping sensors 1220 and the like to provide accurate position, topography, dimensions and spatial orientation of the room and items/objects located within. The user utilizes an AR enabled device's display to view the subject matter being captured by the REM 1030. Utilizing AR Software, digitally created/augmented content is viewed and can be controlled via the AR enabled device's display which the user is viewing on. This digitally created content (in this example, a forest of *sequoia* trees) is placed/located on top of the table by the AR software. With the user wearing/utilizing the electronic ring, the REM 1030 and/or the digital display can accurately detect and process the position and orientation of the user's hand relative to the *sequoia* trees and the REM 1030, thereby allowing the user to engage and interact with the *sequoia* trees such as shaking acorns free from the trees, picking them up and planting them on the table top and grow more *sequoia* tree's.

Various applications and/or capabilities of the claimed invention are now described in.

Camera Storage System:

Various applications and/or capabilities of the claimed invention in the context of a camera storage system is now described in.

Protective housing member configured to attach to an electronic device, comprising

- at least one storage chamber mounted on the protective housing member;
- an accessory station structured on the protective housing member configured to removably secure an accessory item;
- the accessory item being a camera system (REM);
- the camera system can comprise components and features such as; a housing member, a power supply, cameras, sensors, transmitters, antennas, software, LED's, logic board, electrical contacts, microphones connectors.

The camera system can function with data and power components of the storage system housing and/or the electronic device via hardwired connection.

The camera system can function with data and power components of the storage system housing and/or electronic device via wireless connections.

The camera system and/or protective housing member can comprise and/or function with AR software and hardware of the handheld electronic device and/or an AR enabled device such as an AR headset.

The camera system and/or protective housing member can scan, analyze and digitally recreate people, objects, or a physical area.

The camera system and/or protective housing member can stream video/data to the display of the electronic device and/or to a display of an AR enabled device such as an AR headset.

The camera system and/or protective housing member can be configured to overlay/integrate digitally/augmented objects, things and sounds over the imagery/content being captured/scanned by the camera system and/or protective housing member allowing a user to view and interact with the digital objects and sounds on the display of the electronic device and/or a display of an AR enabled device.

The protective housing member can include components such as; a power supply, cameras, sensors, transmitters, antennas, software, LED's, logic board, electrical contacts, microphones connectors, display.

The camera system and the protective housing member compromises wireless charging components to allow for the transmission of wireless energy between the camera system, storage system housing, the handheld electronic device and/or an independent/external device such as a wireless charging pad/station.

The camera system and protective housing member can be accessible remotely through an online/internet connection to allow for remote viewing of subject matter being captured by the REM and/or protective housing member as well as control of the REM's and/or protective housing member's components and features.

The camera system's and protective housing member's software and/or hardware can be configured to simultaneously record streams of data/video/imagery with streams of data/video/imagery/telemetry being captured by the electronic device allowing the user to simultaneously activate and combine the functionality of all (or some) of the camera's and sensors of the handheld device, the camera system and the protective housing member's via a single user interface.

The camera system's housing member can be configured to be foldable and/or bendable allowing for its cameras and sensors to point in different directions relative to each other.

The camera system and/or protective housing member can comprise virtual assistant software that can be an artificially intelligent program capable of autonomous action based upon user feedback/needs.

The virtual assistant software can be configured to execute tasks such as but not limited to taking dictation, reading texts or emails aloud, playing back messages, looking up contact information, placing phone calls, reminding user about appointments/calendar events, capture images/videos, scan environments, place online orders for items including but not limited to: food, products, services and the like, relaying weather information, stock information, news information and the like.

The camera system can electrically connect and be removably secured to custom external devices including but not limited to; a surface-based device such as a docking station and/or airborne based device such as a drone.

The camera system can comprise drone parts and components such as: flight software, navigation system and software, propellers, rotors, motors, flight and speed control components and the like.

The camera system and/or protective housing member can comprise at least one removable module port such as but not limited to ports, openings, channels, slots and the like configured to receive external modular components such as but not limited to; a power supply, cameras, sensors, memory, signal transmitters, adapters, illumination components, a stand, securing/mounting systems, adapters, connectors and the like.

The removable module port can allow a user to connect specialized components and/or sensors to the camera system and/or protective housing member that enhances the camera system and/or protective housing member functional capabilities.

The camera system and/or protective housing member can comprise a digital display configured to display the content being captured by the cameras and/or sensors of the camera system, protective housing member and/or electronic device.

Flight Module:

Various applications and/or capabilities of the claimed invention in the context of a flight module is now described in.

External flight module (EFM) can comprise flight/drone components and features including but not limited to: housing/main air frame, flight/drone software, power supply and components, logic board/PCB, landing struts/bars, propellers, rotors, wireless antenna/transmitter, ports, cameras, motors, flight and speed control components and software, sensors and electronics.

The EFM can comprise at least one storage chambers configured to store and/or enclose and/or protect the components and features of EFM.

The EFM can comprise an accessory station mounted on the main airframe configured to removably store and electrically connect an accessory item to the EFM (such as the REM). The EFM's accessory station can allow the EFM to utilize the components and features of the accessory item including but not limited to software, cameras, sensors, power supply, data storage, and transmitters, antennas, components, drone/flight components and the like and vice versa.

The EFM can comprise motorized components and features to allow for control of the accessory item's position and angle relative to the EFMs main air frame and/or flight path. A user can rotate and angle the REM relative to the EFM main housing to capture and record content in multiple angles and positions without having to change the EFM's flight path, position or angle.

The EFM can comprise flight control software to allow for user controlled or fully autonomous flight and utilize artificial intelligence software, machine learning software, real-time machine learning software, deep learning software, neural network and the like.

The EFM can comprise wireless antennas/receivers configured to create a wireless pair/connection and transmit data/content between the EFM and/or REM and an external device such as: the storage system housing, handheld electronic device, corresponding electronic devices and/or monitors.

The wireless pair/connection can allow for remote viewing of video/data being captured by REM and/or EFM as well as allow for control/operation of REM's and/or EFM's components and features including but not limited; recording video, photo capturing, transferring audio, recording audio, transferring data, recording data, powering on or off, focusing, zooming, aperture settings, exposure settings, lens control, light and flash, general settings, processors, chips, internal electronic components and the like.

The EFM's and/or REM's transmitters and/or sensors can be configured to identify the location of and/or connect/pair with transmitters and/or sensors of the storage system housing and/or handheld electronic device enabling the REM and/or EFM to track the position/location of a user who is holding the storage system housing and/or handheld electronic device.

The EFM can comprise at least one rotor control arm (RCA) configured to move and rotate at least one rotor, motor, and their corresponding support arm/structure and components relative to the EFM's main airframe housing and/or REM allowing for optimized agility and video/data capturing.

The EFM can be controlled by a user via the display of handheld electronic device, storage system housing, mixed/augmented reality display or any other external device capable of being hard wired or wirelessly connected to the REM.

The REM and/or storage system housing can comprise a virtual assistant software configured to execute tasks such as but not limited to capturing images/videos/data, scan environments and the like.

The virtual assistant software can be an artificially intelligent program capable of autonomous action based upon user feedback/needs.

The EFM and/or REM can utilize visual simultaneous localization and mapping (Visual SLAM and/or SLAM) to allow for the EFM and/or REM to construct and map an environment thereby allowing for controlled and safe flight while simultaneously avoiding obstacles and/or tracking a user.

The EFM and/or REM can be controlled and navigated by at least one user via the user's physical movement and items such as but not limited to; gestures, hand gestures, facial recognition, movement of user extremities, objects which a user can wear or hold and the like.

The EFM can comprise inductive and/or other wireless charging components to allow for the transmission of wireless energy between the EFM and external devices such as the REM, Docking Station, storage system housing, as well as any external electronic device which is capable of receiving wireless energy.

The EFM can comprise navigation lights of various colors and configurations to allow.

The EFM can comprise retractable landing legs and the like which can be configured to allow the EFM to take-off and/or land in a controlled and specific orientation and can be controlled by software of the EFM and/or REM for automatic storage and/or retraction upon take-off and during landing.

The EFM can comprise dampening components and features to allow for the control and mitigation of vibration and physical disturbances caused be the rotors, motors and other flight components and/or atmospheric conditions of the EFM. The dampening components and features can include rubber materials and components, rubber like materials and components, TPE, TPU, rubber bands, springs, compressible foam, piston, vibration absorbing material and the like.

The EFM can comprise mobility components and features such as motors, wheels and the like which can allow for the EFM to travel, navigate, rotate in fixed and/or omnidirectional manner while grounded/not in flight.

The EFM can comprise at least one inflatable mechanism configured to deploy and/or inflate an airtight pouch or balloon with air and/or a gas if the EFM makes contact with water and/or liquid or if the EFM is about to make contact with water and/or liquid thereby providing buoyancy to the EFM and/or REM.

The EFM and/or REM can connect to a power/data tether which is connected to an outside perpetual power source. This outside perpetual power source can allow for continuous power and/or Data transfer to the components and features of the EFM and/or REM thereby enabling perpetual flight and image/data capture of the EFM and/or REM.

The EFM and/or REM can comprise at least one removable module port configured to receive external modular components such as but not limited to: a power supply, cameras, sensors, memory, signal transmitters, adapters, illumination components, a stand, securing/mounting systems, adapters, connectors and the like.

The EFM and/or REM can be configured to function with Augmented Reality software to allow for the content being captured by the EFM and/or REM's cameras and sensors to be digitally overlaid/augmented into the display of an AR enabled device VIA an internet/online connection. Wherein the AR enabled device is either a smartphone or AR headset/glasses.

The EFM and/or REM can stream video/data to the display of the electronic device and/or to a display of an AR enabled device such as an AR headset.

The EFM and/or REM can be configured to overlay/integrate digitally/augmented objects, things and sounds over the imagery/content being captured/scanned by the camera system and/or protective housing member allowing a user to view and interact with the digital objects and sounds on the display of the electronic device and/or a display of an AR enabled device.

Multipurpose Accessory Apparatus:

In accordance with an exemplary embodiment of the claimed invention, the multipurpose accessory apparatus comprises on-device, wireless charging for AirPods® and Apple® Watches and multifunction, Snap-On accessory modules. Utilizing the USB-C (Universal Serial Bus Type-C) port and reverse charging feature of today's smartphones, the multipurpose accessory apparatus wirelessly charges AirPods cases and Apple watches using the battery of the phone as the power source and allows for Snap-On accessories.

In accordance with an exemplary embodiment of the claimed invention, the multipurpose accessory apparatus provides high speed data transfer through its USB-C port to iPhone®. In accordance with an exemplary embodiment of the claimed invention, hardline wire/cable connects to the phone via USB-C and comprises USB-C port for plugging into a wall adapter.

In accordance with an exemplary embodiment of the claimed invention, the multipurpose accessory apparatus comprises two accessory areas: an accessory station and a wireless power station. The wireless power station enables wireless charging of AirPods and other devices and objects. The accessory station allows for attaching multiple accessories/devices from the provider and/or manufacturer of the claimed multipurpose accessory apparatus, phone manufacturers, and phone accessory manufacturers, e.g., original equipment manufacturers (OEMs), contract manufacturers, aftermarket manufacturers, and the like. Hardline connects to phone via USB-C. In accordance with an exemplary embodiment of the claimed invention, the multipurpose accessory apparatus comprises USB-C port that allows for 29 W fast "hardline" charging of iPhone and 10 Gbps data transfer. Utilizing iPhone's reverse charging feature, in accordance with an exemplary embodiment of the claimed invention, the multipurpose accessory apparatus charges AirPods cases using the battery of the phone as the power source.

In accordance with an exemplary embodiment of the claimed invention, the multipurpose accessory apparatus for an electronic device comprises at least one or more of the following elements/features:

- A protective housing 1010 configured to removably attach to the electronic device 100.
- At least one circuit board 1140, mounted within the protective housing 1010, comprising a wireless power coil 1050.
- The wireless power coil 1050 wirelessly provides/accepts power to/from an accessory item of the electronic device 100.
- The circuit board 1140 comprises electrical contacts to electrically connect the protective housing 1010 to interchangeable electronic modules 1030.
- At least one plug head 2000 is mounted to the circuit board to electrically or electronically connect the protective housing 1010 to the electronic device 100.
- At least one port 1130 is mounted to the circuit board 1140 to electrically or electronically connect an external device to the protective housing 1010.
- The port 1130 mounted to the circuit board 1140 can electrically or electronically connect an external device to either the electronic device 100, accessory item or interchangeable electronic modules 1030 via the protective housing 1010.
- Magnetic material mounted on the protective housing 1010 is configured to magnetically attach accessories or interchangeable electronic modules 1030 to the protective housing 1010.
- A software installed on the circuit board 1140 controls power or data transfer between at least two of the following: at least one accessory item, the interchangeable electronic modules 1030, the protective housing, and the electronic device 100, an external device which is plugged into the port of the protective housing 1010.
- The battery of the electronic device 100 can be utilized to power the accessory item or interchangeable electronic modules 1030.
- The handheld electronic device 100 being either a portable computer, a smartphone or a tablet.
- The interchangeable electronic module 1030 is a power bank, also referred to as a battery pack.
- The power bank comprises at least one port.
- The power bank is configured to provide power to either the accessory item or the electronic device or an external device plugged into the port of the power bank.
- The interchangeable electronic module 1030 comprises a wireless charging coil 1280.
- The wireless charging coil is configured to provide power to an accessory item of the electronic device 100, such as an electronic watch and the like.
- The interchangeable electronic module 1030 is a memory storage device.
- The memory storage device is configured to transmit and store data to/from the electronic device 100 via the protective housing 1010.
- The interchangeable electronic module 1030 is a hub.
- The hub comprises at least one port configured to electrically or electronically connect an external device to the electronic device 100 via the protective housing 1010.
- The hub comprises at least one slot configured to accept a memory storage device such as a micro-SD card or the like.
- The micro-SD card or the like device is configured to transmit and store data to/from the electronic device 100 via the protective housing 1010.

In accordance with an exemplary embodiment of the claimed invention, when USBC port is plugged into a wall adapter, the smartphone, e.g., iPhone, charges via USBC plug and accessory charges wirelessly via the coil.

AI Camera:

Various applications and/or capabilities of the claimed invention in the context of an artificial intelligence (AI) camera is now described in.

In accordance with an exemplary embodiment of the claimed invention, an AI-driven camera module or AI camera module or camera module as simply referred to herein, is configured to be integrated with smartphones and multi-functional phone attachments. It is appreciated that AI camera module is another type of a removable electronic module (REM) 1030. The AI camera module provides advanced imaging capabilities and dynamic interaction with smartphone housings or cases to deliver professional-grade functionality. By combining modular adaptability and intelligent processing, the claimed invention supports a wide range of professional, scientific, social, and everyday applications, as detailed below.

In accordance with an exemplary embodiment of the claimed invention, the modular design of the camera module easily attaches to compatible smartphones via a proprietary magnetic and electronic interface, enabling seamless integration and detachment for optimized portability and functionality.

In accordance with an exemplary embodiment of the claimed invention, the integrated AI camera system comprises a dedicated AI chipset and neural processing unit (NPU) that perform real-time image and video processing, object recognition, scene optimization, and dynamic enhancements.

In accordance with an exemplary embodiment of the claimed invention, the versatile functionality of the camera module can function both as an external module or as an embedded system, ensuring compatibility with a wide range of devices.

In accordance with an exemplary embodiment of the claimed invention, the camera module provides both wireless and wired Connectivity. The camera module connects via Bluetooth®, Wi-Fi®, or USB-C for data and power transfer, offering unparalleled flexibility in usage scenarios.

In accordance with an exemplary embodiment of the claimed invention, the expandable ecosystem of the camera module comprises support for additional sensors, lenses, and software upgrades via a proprietary accessory dock, creating an evolving platform for future capabilities.

Integrated Smartphone Applications:

Embedded Functionality: The camera module can be embedded directly within a smartphone, functioning as an integral optical and computational component. In this configuration, the camera module leverages the smartphone's built-in resources, such as the processor, display, and power supply, while contributing advanced features including multi-lens systems, real-time AI-driven image enhancement, and environmental analysis.

Phone Case Integration: The camera module can be attached to smartphones via a proprietary phone case or housing that enables secure connection and seamless operation. Features of this integration includes but is not limited to:

- Docking and Connectivity: The camera module attaches to the phone case through a proprietary magnetic or mechanical docking system, which provides secure power and data transfer interfaces.
- Expanded Features: The phone case supports additional power supply, data ports, and structural enhancements for the camera module. These include high-speed data connections, external accessory compatibility, and robust mounting systems for tripod or gimbal use.
- Collaborative Imaging: Multiple camera modules can be synchronized through the phone case's ecosystem, enabling complex setups such as multi-angle recording, simultaneous imaging from different perspectives, or coordinated live-streaming.

Simultaneous Operation: The camera module interacts with the smartphone's internal cameras and sensors to enable hybrid functionality. For example, the camera module can capture thermal images, depth maps, or high-resolution stills, while the smartphone's native cameras focus on video recording or standard imaging.

AI Capabilities

The camera module leverages state-of-the-art artificial intelligence algorithms to revolutionize how users capture and interact with visual content. The AI capabilities of the camera module enhance every aspect of photography and videography:

1. Real-Time Scene Recognition:
   - Identifies scenes (e.g., landscapes, portraits, low light) and automatically adjusts settings for optimal results.
   - Suggests creative filters and framing options based on scene composition.
2. Object and Facial Recognition:
   - Detects faces, objects, and pets with pinpoint accuracy.
   - Enables features such as dynamic bokeh effects, focus tracking, and automatic adjustments for individual skin tones and textures.
3. Augmented Reality (AR) Integration:
   - Merges AI-driven imaging with AR overlays to create immersive experiences, such as real-time filters, virtual object placement, and interactive games.
   - Supports augmented tutorials and visual guides for content creators.
4. Advanced Computational Photography:
   - Combines multiple exposures to produce high dynamic range (HDR) images with unparalleled detail and dynamic range.
   - Delivers real-time noise reduction and sharpening for low-light conditions.
   - Supports ultra-slow-motion video recording and automatic frame-rate adjustments based on movement and lighting.
5. Autonomous Features:
   - Uses AI to monitor surroundings and automatically capture key moments, such as smiles, group photos, or motion events, without user intervention.

In accordance with an exemplary embodiment of the claimed invention, the camera module is a lightweight, compact housing crafted from aluminum alloy, carbon fiber, or durable plastics, ensuring portability without compromising performance.

In accordance with an exemplary embodiment of the claimed invention, the camera module is a revolutionary device that transforms mobile photography and videography by integrating advanced artificial intelligence with cutting-edge optical technology. Unlike traditional mobile cameras, this module emphasizes adaptability, precision, and intelligence to meet the diverse needs of modern users, from content creators to everyday smartphone users.

In accordance with an exemplary embodiment of the claimed invention, the camera module provides dynamic image processing that combines AI-driven enhancements with real-time analysis to adapt to environmental conditions.

In accordance with an exemplary embodiment of the claimed invention, the camera module comprises an adaptive mounting system that allows the camera module to be used as a standalone device or integrated seamlessly into a smartphone body for flexible applications.

In accordance with an exemplary embodiment of the claimed invention, the camera module comprises a smart energy management providing an autonomous power system to optimize energy usage across connected devices.

In accordance with an exemplary embodiment of the claimed invention, the camera module comprises a multi-lens Array incorporating a suite of interchangeable lenses tailored for specific scenarios, from astrophotography to high-speed sports capture.

In accordance with an exemplary embodiment of the claimed invention, the camera module provides AI-guided framing and composition that guides users in real time to improve photo and video composition.

Professional Use Cases

Cinematic Video Recording: The camera module enables professional-grade videography with features such as 10-bit color depth recording, dynamic HDR processing, and advanced stabilization. Paired with smartphone applications or external editing workflows, the camera module supports high-frame-rate recording and creative tools like automated focus tracking and scene transitions.

Architectural and Industrial Imaging: The camera module's multi-lens configuration allows precision imaging for industrial inspections, architectural modeling, or large-scale mapping. Features such as long exposure control, distortion correction, and high-resolution sensors make the camera module ideal for these professional applications.

Scientific and Technical Applications

Macro and Microscopic Imaging: The camera module supports macro lens attachments, enabling detailed imaging of biological, mechanical, or material structures. Integrated AI enhances clarity, stabilizes focus, and ensures accurate color reproduction for technical analysis.

Astrophotography: Built-in celestial tracking software and precision imaging capabilities allow the camera module to capture long-exposure photographs of stars, planets, and other celestial objects. The phone case provides additional stability and extended power for lengthy capture sessions.

Environmental Monitoring: Sensors are integrated into the camera module to analyze temperature, humidity, and light levels, making it suitable for scientific experiments or environmental assessments.

Social and Educational Applications

Live-Streaming and Collaboration: The camera module integrates seamlessly with smartphone platforms for live-streaming to social media or video conferencing. AI-powered features, such as background removal, real-time image stabilization, and multi-camera switching, enhance the user experience.

Interactive Tutorials: The camera module's AI capabilities provide augmented guidance for educational use, overlaying instructions, framing suggestions, or compositional grids onto the smartphone's display.

Classroom and Remote Learning: The camera module enables real-time sharing of experiments or visual data in educational settings. Remote users can access and interact with the live feed through cloud-based connectivity.

Accessory Dock: In accordance with an exemplary embodiment of the claimed invention, the housing 1010 provides a platform for attaching additional REMs 1030, such as external microphones, lighting kits, or thermal imaging sensors.

Cloud Connectivity: The camera module automatically syncs images and videos to secure cloud storage, enabling remote editing and sharing.

Smart Home Integration: The camera module is compatible with smart devices for automation, such as sing the camera for home security or baby monitoring.

Software Upgrades: Regular updates enhance AI algorithms and add new features, ensuring the camera module evolves over time. Third-party app support allows developers to create custom tools and experiences.

Real-Time Adaptive AI: In accordance with an exemplary embodiment of the claimed invention, the camera module employs adaptive imaging technology, allowing it to react instantly to changes in the scene. This real-time adaptability ensures superior results in any situation:

Dynamic Exposure Balance: Automatically adjusts exposure to maintain detail in both shadows and highlights, even in challenging lighting conditions.

Weather Recognition: Identifies rain, fog, and other atmospheric effects, adjusting settings for clarity and visual impact.

Movement Prediction: Anticipates subject movement, enabling the camera to optimize shutter speed and focus tracking.

Layered Scene Interpretation: The camera module uses AI to analyze and interpret multiple aspects of a scene simultaneously:

Foreground and Background Isolation: Separates elements for enhanced depth of field and bokeh effects.

Color Dynamics: Analyzes and adjusts individual color profiles to produce vibrant and natural results without oversaturation.

Mood Enhancement: Applies subtle tonal shifts to evoke specific emotional responses based on the scene's content.

Intelligent Capture Modes:

1. High-Speed Burst: Captures multiple frames per second with AI-powered selection of the best shot.

2. Long Exposure Assistant: Guides users through long-exposure captures, stabilizing images and enhancing detail.

3. Night Vision Pro: Employs multi-frame noise reduction and AI-guided lighting optimization for stunning low-light results.

Connectivity for All Scenarios:

1. Cloud-Optimized Workflow: Uploads content directly to secure storage with AI-assisted file tagging for easy retrieval.

2. Multi-Device Syncing: Syncs with wearables, drones, or secondary cameras to expand creative possibilities.

3. Future-Ready Ports: Includes USB-C, Thunderbolt, and wireless data transfer compatibility.

The camera module introduces a range of tools designed to unlock creative potential for users of all skill levels.

Interactive Editing Assistance: The camera module includes an onboard AI assistant that offers real-time editing suggestions:

Perspective Correction: Automatically adjusts distortion for architectural photography.

Skin Tone Matching: Fine-tunes portraits to reflect natural and consistent tones.

Customizable Filters: Suggests filters based on the subject and lighting conditions.

Immersive Video Features:

1. Smart Stabilization: Tracks motion in three axes to ensure smooth video, even in high-action environments.

2. Auto Scene Transitions: AI-powered transitions create cinematic effects without post-production.

3. Multi-Angle Capture: Pairs with other modules or devices to shoot from different perspectives simultaneously.

Augmented Composition Guide: An AI-powered guide overlays visual cues on the smartphone display to help users frame shots effectively:

Golden Ratio Grid: Suggests placements based on classic compositional rules.

Dynamic Focus Zones: Highlights areas of interest and adjusts settings for optimal clarity.

Live Lighting Analysis: Provides tips on using natural and artificial light creatively.

Every Day and Travel Use Cases:

1. Spontaneous Content Creation: The camera module detects and captures key moments automatically, using AI to optimize exposure, focus, and composition. This feature is particularly useful for family gatherings, outdoor adventures, or social events.

2. Travel Photography: Compact and lightweight, the module is ideal for travelers. AI-driven geotagging and scene recognition enable automatic adjustments to lighting and framing, ensuring professional-quality results in diverse environments.

3. Personalized Filters and Effects: The camera module generates custom filters based on user preferences, environmental conditions, and subjects, delivering creative enhancements for photos and videos.

Phone Attachment Ecosystem

The phone case or housing 1010 that supports the REMs 1030 serves as more than a structural accessory. It acts as a hub for connectivity, power management, and modular expansion, featuring:

Removable Module Ports: The phone case or housing 1010 comprises interchangeable ports and slots for attaching additional components, such as lighting modules, external microphones, or extended storage.

Battery Integration: The phone case or housing 1010 provides supplementary power for prolonged use of the camera module and other REMs 1030, especially during demanding tasks like video streaming or long-exposure photography.

Wireless Communication: Enables seamless data transfer between the camera module and cloud-based storage or connected devices, such as tablets or drones.

In accordance with an exemplary embodiment of the claimed invention, the AI-driven camera module, whether embedded within a smartphone or integrated through a multifunctional phone case, redefines mobile imaging. Its adaptability, professional-grade features, and intelligent processing capabilities make it a versatile solution for diverse applications, from professional filmmaking to educational tutorials and everyday photography. The modular design ensures compatibility with evolving technology, while the smartphone housing enhances its functionality and user experience.

AI Camera Module: Hardware and PCB Design for Efficient AI Computing

Advanced printed circuit board (PCB) design for compact and efficient AI processing: The AI camera module incorporates a next-generation PCB design, specifically engineered for high-performance, energy-efficient local and cloud-based AI computing. The PCB is structured to maximize component density while maintaining thermal stability and reducing power consumption. Key Features of the PCB Design:

1. Multi-Layer Architecture:

High-Density Interconnect (HDI) Layers: The PCB integrates multiple HDI layers to interconnect components, allowing for compact design without sacrificing performance.

Embedded Heat Spreaders: Copper and graphene-based heat spreaders are embedded within the PCB layers to manage thermal output from high-power chips.

Microvias and Blind/Buried Vias: Utilizes advanced via technology to route high-speed signals efficiently between layers, reducing interference and latency.

2. System-on-Module (SOM) Architecture:

Incorporates a modular SOM approach for AI-specific tasks, enabling seamless upgrades and reconfiguration for evolving AI workloads.

Features a universal interface to connect with external modules, such as additional memory or specialized AI accelerators.

3. Thermal and Power Management:

Integrated Thermal Sensors: Monitors real-time heat distribution to optimize cooling and prevent overheating during intensive AI computations.

Dynamic Power Allocation: Onboard power regulators distribute power intelligently across components to maximize energy efficiency.

AI Processing Units and Chipsets: The camera module leverages a hybrid chipset configuration to support local and cloud-based AI computing. The design combines general-purpose processing with specialized AI accelerators to deliver unparalleled computational performance. Key Chip Components:

1. Neural Processing Unit (NPU):

Purpose-Built AI Core: The NPU is optimized for deep learning inference tasks, enabling real-time object detection, image enhancement, and AR/VR applications.

Multi-Core Architecture: Features multiple AI cores operating in parallel to handle complex computations efficiently.

On-Chip Memory: Includes integrated SRAM for fast data access, reducing latency during high-speed AI processing.

2. Graphics Processing Unit (GPU):

High-performance GPU cores are integrated for tasks requiring parallel data processing, such as video rendering and real-time imaging analytics.

Ray Tracing Support: Enhances visual realism in AR/VR environments by accurately simulating light interactions in 3D scenes.

3. Application Processor:

Multi-Core CPU: A high-efficiency application processor handles general-purpose tasks, including device management, software integration, and data routing.

Low-Power Modes: Includes advanced power-saving features for energy-efficient operation during idle or low-load states.

4. Edge AI Accelerator:

A dedicated edge AI chipset processes localized data streams independently of cloud-based systems, ensuring real-time responsiveness and data security.

Tensor Processing Units (TPUs): Custom-built TPUs accelerate matrix multiplication and other computations essential for AI training and inference.

Memory and Storage Components

Efficient AI computing requires robust memory and storage solutions to handle large datasets and complex models. The AI camera module integrates advanced memory technologies to meet these demands.

Onboard Memory: High-Bandwidth Memory (HBM) provides ultra-fast data transfer speeds, essential for deep learning models and high-resolution imaging tasks. Stacked DRAM Technology offers high-density storage in a compact footprint, reducing PCB space requirements.

Onboard Memory: Double data rate 5 (DDR5) RAM offers increased bandwidth and lower latency compared to previous-generation memory, supporting real-time AI operations and multitasking.

Integrated Storage: Non-Volatile Memory Express (NVMe) solid state drive (SSD) module features integrated solid-state storage with Peripheral Component Interconnect Express (PCIe) Gen 4 interface for ultra-fast data access and storage of AI models, high-resolution video, and metadata. In terms of capacity, the NVMe SSD module is configurable up to 1 TB, with modular expandability for additional storage.

Integrated Storage: Embedded multimedia card (eMMC) and universal flash storage (UFS) Storage provides additional onboard storage for firmware, temporary data, and user preferences.

Integrated Storage: Hybrid Cloud Cache is a dedicated storage partition acts as a cache for cloud-based AI computing, ensuring seamless data synchronization and reduced latency during hybrid operations.

Connectivity and data processing to efficiently manage data flow between local and cloud systems, the AI camera module integrates advanced connectivity and processing solutions.

High-Speed Data Interfaces: PCIe Gen 5 Controller enables ultra-fast communication between the camera module's processing units and storage devices. It supports direct interfacing with external accelerators and co-processors for enhanced performance.

High-Speed Data Interfaces: Universal Serial Bus 4 (USB4) and Thunderbolt Support ensures high-speed data transfer to and from external devices, including monitors, drones, and other AI-enabled peripherals.

High-Speed Data Interfaces: Dual-Band Wi-Fi 6E and Bluetooth 5.2 facilitates seamless wireless communication for real-time data streaming and cloud integration and includes MIMO (Multiple-Input Multiple-Output) technology for improved range and reliability.

AI Co-Processing and Networking: Field-programmable gate array (FPGA) Co-Processor accelerates custom AI algorithms and supports rapid prototyping of new features.

AI Co-Processing and Networking: Edge-to-Cloud Synchronization is provided by the camera module's network processor which manages secure and efficient data synchronization between the local AI systems and cloud-based resources, enabling hybrid AI workflows.

Modular Scalability

The hardware design of the camera module allows for scalability and future upgrades through its modular PCB layout and accessible interface ports. Expandable AI Accelerator Slots allow users to enhance AI performance by adding new accelerators or co-processors without replacing the entire system. Accessory Interface provides direct connectivity to external devices, such as high-capacity storage modules, specialized sensors, or AR/VR headsets. Software-Defined Upgradability wherein hardware components are complemented by software updates, ensuring compatibility with emerging AI frameworks and computing standards.

The hardware and PCB design of the camera module represents a significant advancement in compact and efficient AI computing. By integrating specialized processing units, advanced memory technologies, and robust connectivity solutions, the module supports next-generation local and cloud-based AI applications, ensuring scalability, performance, and energy efficiency. The modular architecture positions the device as a versatile platform for a wide range of professional, scientific, and consumer applications.

Software and Specialized Techniques for Efficient and Compact AI Systems

AI-Optimized Software Architecture: The camera module employs a layered software architecture designed to optimize the performance of both local and cloud-based AI systems. This architecture integrates lightweight frameworks, efficient data pipelines, and advanced optimization techniques to balance computational intensity with resource efficiency.

Core Software Layer 1: Low-level firmware provides direct control over hardware components such as neural processing units (NPUs), graphics processing units (GPUs), and edge AI accelerators. The low-level firmware features microcontroller-based power management firmware to dynamically allocate resources based on workload demand.

Core Software Layer 2: Middleware for AI processing integrates APIs and drivers that facilitate communication between hardware components and high-level AI frameworks. The middleware employs a task scheduler to distribute processing across multiple cores and accelerators, ensuring efficient workload handling.

Core Software Layer 3: High-Level AI frameworks are compatible with leading AI frameworks such as TensorFlow Lite, PyTorch Mobile, and ONNX Runtime for edge computing. High-Level AI frameworks comprise pre-trained models optimized for deployment on embedded devices, enabling rapid integration into custom applications.

Efficient AI Algorithms:

The software incorporates advanced algorithms tailored to optimize AI performance while minimizing computational and power demands. Model Optimization Techniques: 1. Model Quantization converts high-precision models (e.g., FP32) into lower precision formats (e.g., INT8) to reduce computational complexity and memory usage without significant loss of accuracy. 2. Knowledge Distillation trains lightweight models using insights from larger, more complex models to maintain performance while minimizing computational overhead. 3. Pruning and Sparsity remove redundant weights and neurons from neural networks, creating sparse models that require less memory and computing power. 4. Neural Architecture Search (NAS) automates the selection of optimal neural network architectures for specific tasks, balancing accuracy with efficiency.

Specialized AI Techniques:

To further enhance compactness and efficiency, the system employs specialized AI techniques designed for edge and hybrid cloud computing environments.

Edge AI Techniques: 1. On-Device Inference processes data locally using optimized models to minimize latency and reduce dependency on cloud infrastructure. On-Device Inference uses advanced scheduling algorithms to prioritize critical tasks such as real-time object detection and video analysis. 2. Federated Learning allows the module to train AI models locally while sharing only aggregated updates with the cloud, preserving user privacy and reducing bandwidth usage. 3. Dynamic Model Switching selects appropriate AI models based on available resources, prioritizing simpler models for low-power scenarios and complex models for high-performance tasks.

Cloud Integration Techniques: 1. Hybrid AI Processing offloads computationally intensive tasks, such as model training, to the cloud while maintaining inference locally for real-time responsiveness. It synchronizes local and cloud-based systems using a distributed framework to ensure seamless operation. 2. AI Caching and Prefetching stores frequently accessed data and models locally to reduce latency and improve response times. It predicts upcoming data needs using AI-driven analytics, ensuring uninterrupted workflows.

Advanced Data Handling:

Efficient data processing is critical for compact AI systems. The software employs innovative techniques to optimize data collection, preprocessing, and management.

Data Preprocessing Pipelines: 1. Real-Time Data Augmentation performs on-the-fly transformations, such as cropping, resizing, and normalization, to prepare data for inference without introducing latency. 2. Streaming Data Compression uses lossless and lossy compression techniques to minimize data size during storage and transmission, preserving bandwidth and storage capacity. 3. Adaptive Sampling dynamically adjusts the sampling rate of input data based on task requirements, conserving computational resources during low-demand periods.

Data Management: 1. Hierarchical Data Storage organizes data into tiers, prioritizing high-speed storage (e.g., RAM) for active tasks and slower, high-capacity storage (e.g., SSD) for archival data. 2. Secure Data Handling incorporates encryption protocols and differential privacy techniques to protect sensitive data during processing and transmission.

AI-Specific Optimization Frameworks:

The system integrates software frameworks that streamline the development and deployment of AI applications while maximizing hardware efficiency. 1. Runtime Optimizations: Dynamic voltage and frequency scaling (DVFS) adjusts processor performance based on workload intensity, reducing energy consumption during idle periods. Kernel fusion techniques combine multiple operations into a single computational step, minimizing memory access overhead. 2. Custom Edge Inference Engine is tailored for the camera module's hardware, the inference engine executes AI models with minimal latency and optimal resource utilization. It supports heterogeneous computing, allowing tasks to be distributed across CPUs, GPUs, NPUs, and edge accelerators. 3. Parallel Computing Frameworks implement parallel processing algorithms to exploit multi-core architectures, increasing throughput for high-demand AI applications.

Cloud Integration and Hybrid Computing:

The software ensures seamless integration with cloud-based resources while maintaining efficient local processing capabilities.

Cloud-Native Compatibility: 1. Containerized AI Models uses containerization technologies such as Docker and Kubernetes to simplify deployment across cloud platforms. It facilitates model updates and scaling without disrupting local operations. 2. Cross-Device Orchestration synchronizes the AI module with other devices, such as drones, AR glasses, or IoT systems, using cloud-based coordination frameworks.

Hybrid AI Workflow Management: 1. Task Offloading dynamically assigns tasks to local or cloud resources based on factors such as latency sensitivity, power availability, and network conditions. It includes fallback mechanisms to ensure continued operation during network disruptions. 2. Model Version Control maintains versioning for AI models to enable rollback or upgrade based on performance metrics and user requirements.

Augmented Reality and User Interaction:

The software integrates AR-specific optimizations, enhancing user interaction through efficient rendering and data processing techniques. 1. AR Scene Understanding combines depth sensing and semantic segmentation to create accurate 3D representations of the environment. It supports real-time object interaction with minimal latency. 2. Low-Power AR Rendering utilizes tile-based rendering and foveated rendering techniques to reduce processing loads while maintaining visual fidelity. 3. AI-Guided User Feedback offers real-time suggestions for improving framing, lighting, and focus during content creation.

The software architecture and specialized AI techniques for the AI camera module are designed to maximize efficiency, compactness, and performance in local and cloud-based computing environments. By leveraging advanced frameworks, algorithms, and data handling methods, the system delivers next-generation AI capabilities that are adaptable, scalable, and resource-efficient. This approach positions the module as a critical tool for professional, consumer, and hybrid AI applications.

Modular Accessory System (Current go-to-Market Product Line):

Housing and Structural Components: 1. Modular Attachment Housing comprises a modular housing member configured to attach to a smartphone. The housing is designed with proprietary Docking Mechanism. A magnetic or mechanical locking system ensuring secure attachment and detachment of accessory modules. A SnapLock system incorporates a peg-and-hole arrangement with multiple mechanical pegs to enhance stability and alignment of connected modules.

2. Protective and Durable Materials: The housing is manufactured from robust materials such as polycarbonate, aluminum alloy, or thermoplastic elastomers to provide impact resistance, heat dissipation, and environmental protection.

3. Removable Module Ports: The housing incorporates at least one removable module port designed to receive external components, including but not limited to power banks, memory modules, wireless charging accessories, and specialized devices. The ports include electrical contacts integrated for seamless data and power transfer. The ports include universal and proprietary configurations compatible with a range of modular accessories for expanded functionality.

Power Management and Charging System: A detachable power module configured to deliver power to the smartphone and auxiliary devices. Battery capacity provided by a 4,000 mAh rechargeable lithium-polymer battery optimized for high efficiency and extended usage. A dedicated charging interface provided by a USB-C input on the power module facilitating independent charging while still allowing simultaneous charging of other components when attached to the housing.

Integrated Wireless Charging System: The housing 1010 comprises a wireless charging coil configured to charge wireless earbuds or similar devices directly within a designated charging zone. This enables reverse charging, allowing the smartphone battery to recharge attached modules or external devices.

Power Distribution Circuitry: Intelligent circuitry within the housing 1010 manages power flow, including prioritized charging which automatically directs power to the smartphone before recharging attached modules, and overload protection to prevent overcharging and overheating of connected components.

Data and Connectivity Features: 1. USB-C Expansion Ports: The housing 1010 comprises three USB-C ports, each configured for high-speed data transfer to support fast data communication with external storage devices or peripherals and power delivery to provide simultaneous charging of multiple devices connected to the housing. 2. Removable Storage Integration: A MicroSD card slot is integrated into the housing to expand the smartphone's storage capabilities, and enable direct recording and storage of high-resolution content, such as 4K video, without relying on internal smartphone memory. 3. Accessory Dock: The housing 1010 incorporates a docking station that facilitates attachment of additional REMs, such as external microphones, high-capacity SSDs, or augmented reality (AR) components. The docketing station provides direct communication with the smartphone via electrical contacts or wireless connectivity for enhanced data sharing.

In accordance with an exemplary embodiment of the claimed invention, the REMs 1030 can comprise a detachable watch charging module which recharges smartwatches via a magnetic alignment to ensure precise placement for efficient charging, and dual-mode power, which can draw power from either the smartphone's battery or the housing's external power source.

In accordance with an exemplary embodiment of the claimed invention, the REMs 1030 can comprise SSD module. A high-speed solid-state drive module, e.g., with 500 GB, 1 TB capacities, featuring rapid read/write speeds exceeding 1,000 MB/s for seamless video capture and large file transfers. The SSD module comprise an integrated plug to provide USB-C connectivity for direct access to laptops, desktops, or other devices. The SSD module comprises robust mounting system to ensure stable operation during intensive tasks.

In accordance with an exemplary embodiment of the claimed invention, the REMs 1030 can comprise a wireless charger module configured for simultaneous charging of multiple devices. The wireless charger module comprises a secondary wireless coil dedicated to charging wireless earbuds and adaptive charging technology to automatically adjust power delivery based on the device's requirements.

Advanced Features and Software Integration: 1. Charging and Power Management: The system integrates software to monitor and display real-time battery levels for the smartphone and attached modules on the smartphone's display. It offers customizable charging options, enabling the user to set priorities for device and accessory charging. 2. Automatic Module Recognition: Each module is equipped with an identification chip that allows the smartphone to recognize the REM 1030 automatically and configure it for optimal performance. 3. Wireless Control and Updates: REMs 1030 communicate with the smartphone via Bluetooth or proprietary wireless protocols, enabling remote management of settings and functions, and over-the-air firmware updates to maintain compatibility with evolving devices.

Use Cases:

Professional Photography and Videography: The SSD module supports direct storage of high-resolution content, such as 4K/60 fps video, with features including (1) enhanced stabilization and HDR processing for cinematic results, and (2) on-the-go editing and direct data transfer to connected devices.

Mobile Gaming and Productivity: The USB-C ports of the housing 1010 and extended power capacity support connection to gaming peripherals, such as controllers and external GPUs, and extended sessions of mobile computing or gaming without battery concerns.

Travel Applications: Enables simultaneous charging of multiple devices, including the smartphone, smartwatch, and wireless earbuds, using a single device. REMs 1030 provide modular storage options for offline access to essential files and media during travel.

Safety and Durability Features: 1. Overload Protection: Integrated circuits protect the smartphone and attached modules from short circuits, power surges, and overheating. 2. Environmental Resistance: The housing 1010 and REMs 1030 are designed to resist water, dust, and shock, ensuring reliability in diverse conditions. 3. Secure Attachment: The docking mechanism ensures that REMs 1030 remain securely attached during use, and provides precision alignment, minimizes wear on electrical contacts and enhances longevity.

Expanded Ecosystem: 1. AR and VR Compatibility: The REMs 1030 can be augmented and virtual reality modules, which can be attached via the accessory dock as with any other REMs 1030. The augmented and virtual reality modules provide additional features, such as depth mapping and real-time 3D rendering. 2. Multi-Device Integration: The housing 1010 allows for synchronized operation with additional accessories, such as drones or external monitors, to enhance creative and technical workflows. 3. Cloud and IoT Integration: Data captured by the REMs 1030 can be automatically uploaded to cloud storage or shared with Internet-of-Things (IoT) devices for real-time analysis and processing.

The modular smartphone attachment system provides a comprehensive solution for expanding the functionality of smartphones. By combining advanced power management, data connectivity, and modular accessory integration, the system supports a wide range of professional, technical, and personal applications. Its versatile housing, intelligent features, and accessory ecosystem make it a robust and scalable platform for future technological advancements.

World Model Integration in AI Camera Module: Hardware, Software, and Use Cases

World Model Hardware and Software Architecture: The AI camera module integrates "world model" hardware and software components, designed to create a real-time, spatially accurate digital representation of the surrounding environment. This compact system enables advanced contextual understanding and decision-making across industrial, medical, and consumer applications.

Hardware Component 1: 3D Spatial Mapping Unit comprises (a) depth-sensing cameras incorporating stereoscopic or LiDAR-based depth sensors for accurate 3D mapping of environments, (b) an Inertial Measurement Unit (IMU) combining accelerometers, gyroscopes, and magnetometers to capture precise motion and orientation data, enabling seamless mapping during movement, (c) edge-based neural processor, a compact neural processing unit (NPU) optimized for simultaneous localization and mapping (SLAM), allowing real-time world model generation, and (d) Microprocessor for Sensor Fusion integrating data from cameras, IMUs, and environmental sensors to produce a unified and consistent spatial model.

Hardware Component 2: Environmental Sensors comprising thermal imaging sensor to add context to the world model by detecting heat sources, particularly useful in industrial and medical applications, and multi-spectral sensors to capture data beyond visible light, including infrared or ultraviolet spectrums, for specialized use cases such as contamination detection or vegetation analysis.

Hardware Component 3: Onboard Memory and Storage comprising a dynamic world buffer, a dedicated high-speed memory region to store real-time world model data for active tasks, non-volatile storage to retain processed spatial maps for future analysis, enabling long-term learning and contextual understanding.

Hardware Component 4: Compact Integration wherein the hardware components are miniaturized and arranged on a multi-layered PCB with advanced thermal management to maintain a compact form factor while supporting high-performance world modeling.

Software Framework for World Modeling: The software architecture is designed to process, analyze, and utilize data from the hardware components to construct an accurate, real-time digital twin of the environment.

Core Software Component 1: Simultaneous Localization and Mapping (SLAM): Real-Time Mapping: Constructs spatial maps using data from depth sensors and IMUs while simultaneously tracking the module's position within the environment. Multi-Frame Stitching: Combines multiple sensor inputs to create a seamless and detailed model of complex environments.

Core Software Component 2: World State Prediction: contextual understanding employs AI algorithms to predict the behavior of dynamic elements, such as moving objects or changes in temperature, within the mapped environment. Temporal modeling incorporates historical data to refine predictions and adapt the world model to recurring patterns.

Core Software Component 3: Edge-Based AI Processing: Local decision-making enables low-latency responses by processing critical data locally, such as obstacle avoidance or heat detection. Cloud synchronization offloads non-critical computations, such as long-term model refinement or data storage, to cloud-based resources when available.

Core Software Component 4: Environmental Segmentation and Classification identifies and categorizes objects, surfaces, and other features within the world model using deep learning algorithms. It provides context-aware insights, such as material type, temperature variance, or motion trends.

Optimization Techniques: 1. Dynamic Model Compression reduces the size of spatial maps and contextual data for efficient processing and storage. 2. Incremental Updates only change in the environment, minimizing computational and storage overhead. 3. Adaptive Workload Distribution allocates tasks between local processors and cloud resources based on latency and power constraints.

Use Cases for World Model Integration: The integration of compact world modeling hardware and software transforms the AI camera module into a versatile tool with diverse applications across industrial, medical, and consumer domains.

Industrial Applications: 1. Autonomous Inspection and Maintenance generates real-time spatial models of factory floors, pipelines, or machinery, enabling automated inspection of defects, wear, or alignment issues. It integrates thermal imaging for monitoring heat anomalies, such as overheating equipment or energy leaks. 2. Logistics and Robotics facilitates warehouse automation by mapping storage layouts and tracking moving elements, such as forklifts or drones, to optimize navigation and task execution. It enhances robotic systems by providing a shared spatial model, improving collaboration and task efficiency. 3. Construction and Infrastructure Monitoring creates detailed 3D maps of construction sites, supporting progress tracking and safety assessments. It detects structural issues, such as material fatigue or thermal inconsistencies, using multi-spectral sensors.

Medical Applications: 1. Surgical Guidance and Planning produces high-resolution 3D models of the surgical area, assisting surgeons with precise navigation and tool placement. It integrates multi-spectral data to highlight blood vessels, nerves, or other critical structures during procedures. 2. Patient Monitoring maps and tracks patient movements in hospital rooms or care facilities, identifying irregular behavior patterns, such as falls or reduced mobility. It utilizes thermal imaging to monitor body temperature variations, detecting potential signs of infection or inflammation. 3. Rehabilitation and Therapy creates dynamic models of patient movement during physical therapy sessions, providing real-time feedback on posture, range of motion, and recovery progress.

Consumer Applications: 1. Augmented Reality (AR) and Gaming enhances AR experiences by creating accurate spatial models of user environments, enabling seamless integration of digital objects. It provides immersive gaming experiences with realistic obstacle interaction and dynamic object placement. 2. Home Automation and Security maps the layout of homes to optimize the placement and operation of smart devices, such as lighting, HVAC, or cleaning robots. It detects unusual activity or temperature anomalies, alerting users to potential security or safety concerns. 3. Travel and Outdoor Navigation assists in navigation by creating 3D maps of unfamiliar environments, such as hiking trails or urban landmarks. It utilizes multi-spectral imaging to provide insights into environmental conditions, such as plant health or weather hazards.

Compact Design for Scalability and Portability: The compact integration of hardware and software for world modeling ensures that the system is scalable and portable, making it adaptable for a wide range of devices and scenarios. 1. Modular Compatibility enables the system to operate as an attachment for smartphones, drones, or standalone robotic platforms. It provides universal interfaces for integration with existing systems and future upgrades. 2. Energy Efficiency combines low-power processing units with dynamic workload distribution to maximize battery life in portable devices. 3. Enhanced User Accessibility provides intuitive interfaces for viewing and interacting with world models, catering to users across technical skill levels.

Use Cases for an AI Camera Module as Part of a Modular Smartphone Attachment System The AI camera module, integrated with a modular smartphone attachment system, extends the functionality of smartphones by providing advanced imaging, analysis, and computational capabilities. Below is a detailed list of use cases for industrial, medical, and consumer applications, presented in a format suitable for a patent application.

1. Industrial Equipment Monitoring and Diagnostics: The AI camera module enables real-time monitoring and diagnostics of industrial equipment by leveraging its advanced imaging and computational capabilities. Use cases include damage detection using high-resolution imaging and AI-driven pattern recognition, the module identifies wear, cracks, and other structural issues on machinery. Thermal Anomaly Identification wherein integrated thermal sensors detect overheating or inefficiencies in motors, pumps, or conveyor systems. Remote Monitoring wherein the camera module transmits real-time diagnostic data and video feeds to a remote control center via a smartphone interface, reducing the need for physical inspections.

2. Enhanced Augmented Reality (AR) Applications: When paired with a modular smartphone attachment system, the AI camera module transforms the smartphone into an advanced AR platform. Use cases include 3D Environment Mapping: The module captures spatial data to build AR-compatible maps for gaming, design, or architectural visualization. Real-Time Object Interaction: Using depth sensing and object recognition, the module enables seamless interaction with AR objects in consumer and professional settings. Collaborative AR Applications: Facilitates multi-user AR experiences by creating shared digital environments accessible through smartphones.

3. Wildlife Monitoring and Conservation: The AI camera module supports wildlife monitoring and conservation efforts by enabling efficient and portable data collection. Use cases include: Species Identification wherein the AI-powered recognition software identifies animals in real-time using onboard processing. Thermal Tracking captures thermal images of nocturnal animals or wildlife in dense vegetation. Data Streaming for Research wherein live feeds are streamed to centralized research databases for collaborative studies and real-time analysis.

4. Remote Medical Diagnostics: The AI camera module's advanced imaging capabilities make it an effective tool for telemedicine and medical diagnostics. Use cases include: High-Resolution Imaging for Consultations to capture detailed images or videos for remote analysis by healthcare professionals. Thermal Imaging for Early Detection identifies temperature variations indicative of infections, inflammation, or other medical conditions. Mobile Ultrasound Support, when paired with additional medical accessories, the camera module facilitates portable diagnostic imaging.

5. Event Photography and Videography: The AI camera module enhances smartphone-based photography, making it ideal for professional and casual event documentation. Use cases include: Intelligent Group Photography automatically detects and optimizes focus, lighting, and composition for group photos. Dynamic Video Stabilization captures smooth, high-quality video in fast-moving environments such as weddings or concerts. Live Streaming Integration to transmit real-time event footage to social media or cloud storage platforms.

6. Agricultural Monitoring: The camera module supports precision agriculture by providing detailed imaging and analysis of crops and soil conditions. Use cases include: Plant Health Assessment uses multi-spectral imaging to detect diseases, nutrient deficiencies, and water stress in crops. Soil Quality Analysis captures visual and spectral data to evaluate soil conditions for optimal planting. Geo-Tagged Field Monitoring creates detailed, location-based visual records of agricultural fields for planning and reporting.

7. Home Security and Automation: The AI camera module enhances home security and automation when integrated with a smartphone attachment system. Use cases include: Intruder Detection to identify unauthorized movement or unusual behavior using AI-based object recognition. Environmental Monitoring detects smoke, heat, or gas leaks and alerts users in real-time. Smart Home Integration interacts with IoT devices to automate lighting, climate control, and surveillance systems based on activity within the home.

8. Vehicle Inspection and Maintenance: The camera module provides a portable solution for vehicle diagnostics and inspections. Use cases include: Under-Carriage Imaging captures detailed views of hard-to-reach areas for routine maintenance or damage assessment. Thermal Anomaly Detection identifies overheating in engines, brakes, or exhaust systems. Remote Analysis sends captured data to mechanics or experts for remote diagnostics and repair recommendations.

9. Consumer Application: Augmented Reality Entertainment wherein the camera module enhances consumer entertainment experiences, including immersive gaming to capture real-world environments to create augmented gaming scenarios with dynamic obstacle interaction. Interactive Educational Tools to support AR-based learning experiences by overlaying interactive digital objects on physical spaces.

Travel and Exploration: Landscape Photography automatically optimizes settings for capturing natural landscapes in varying light conditions. Interactive Navigation builds 3D maps of unfamiliar environments for improved wayfinding and exploration.

Fitness and Sports: Activity Tracking captures high-speed motion to analyze athletic performance in sports such as running, cycling, or tennis. Sports Highlights tracks and records key moments during games or training sessions for playback and review.

Everyday Use Cases: Smart Parenting Tools monitor and record milestones such as first steps, using AI to recognize significant moments automatically. Pet Monitoring tracks pet movements and behavior, alerting owners to unusual activity or potential hazards.

Educational and Collaborative Learning: The AI camera module serves as a powerful tool for creating interactive educational content. Use cases include: Science Experiment Recording captures high-resolution videos of laboratory experiments with real-time annotations. AR Learning Modules enable hands-on learning through AR overlays that guide students in topics such as anatomy, astronomy, or mechanics. Collaborative Projects facilitate remote group collaboration by streaming live feeds of physical or virtual projects.

The integration of world model hardware and software into the AI camera module enables advanced contextual awareness and decision-making, transforming its capabilities across industrial, medical, and consumer applications. The compact design, efficient processing techniques, and adaptive functionality position the system as a groundbreaking solution for next-generation AI and spatial computing tasks.

The AI camera module, when integrated with a modular smartphone attachment system, provides a compact and versatile solution for a wide range of applications. Its advanced imaging capabilities, coupled with intelligent processing and real-time data transmission, make it invaluable across industrial, medical, and consumer use cases. These use cases illustrate the practical and scalable utility of the invention, enhancing productivity, creativity, and everyday convenience.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the embodiments of the claimed invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure covers modifications and variations of this disclosure provided they come within the scope of the appended claims and their equivalents.

The invention claimed is:

1. A multi-functional module system for a mobile device, comprising:

a housing configured to attach to the mobile device;

the housing comprising a plug head integrally formed with or attached to the housing, the plug head configured to establish a direct electrical or data connection between the housing and a port of the mobile device, and an integrated wireless charging coil positioned to align with and charge a wireless-enabled accessory placed adjacent to the housing; and a module docking station comprising an electrical connection interface configured to transmit at least one of power and data between the housing, the mobile device and a removable electronic module connected to the module docking station;

wherein the housing further comprises at least one port configured to transfer power or data between at least one external device plugged into said at least one port and at least one of the following: the housing, the mobile device or the removable electronic module connected to the module docking station; and wherein the module docking station provides a docking interface between the removable electronic module and housing via a magnetic coupling.

2. The multi-functional module system of claim 1, further comprising a plurality of removable electronic modules, each configured to engage with the docking interface.

3. The multi-functional module system of claim 2, wherein at least one of the removable electronic modules is a power bank module configured to supply additional electrical power to the mobile device or the housing.

4. The multi-functional module system of claim 2, wherein at least one of the removable electronic modules is a wireless charging module configured to wirelessly charge the wireless-enabled accessory.

5. The multi-functional module system of claim 2, wherein at least one removable electronic module comprises a data storage device, the data storage device configured to enable data storage, reading, and writing operations between the mobile device and the data storage device.

6. The multi-functional module system of claim 1, wherein said at least one port is configured to facilitate simultaneous charging of at least one of the mobile device, the removable electronic module, and said at least one external device using a single external power source connected to a USB-C plug.

7. The multi-functional module system of claim 1, wherein the docking interface further comprises a mechanical engagement between the removable electronic module and the housing.

8. The multi-functional module system of claim 1, further comprising an expandable memory slot configured to receive at least one memory card for additional data storage.

9. The multi-functional module system of claim 8, wherein the said at least one memory card is configured to enable data storage, reading, and writing operations between the mobile device and said at least one memory card.

10. The multi-functional module system of claim 1, wherein at least one of the REM module is an AI-powered camera, the AI-powered camera is configured to capture images and videos, and to transmit captured images and videos to either the housing or mobile device for storage.

11. The multi-functional module system of claim 10, wherein the AI-powered camera processes the captured images and videos using artificial intelligence.

12. The multi-functional module system of claim 10, wherein the housing processes the captured images and videos using artificial intelligence.

13. The multi-functional module system of claim 10, wherein the mobile device processes the captured images and videos.

* * * * *